(12) United States Patent
Kinoshita et al.

(10) Patent No.: US 9,209,417 B2
(45) Date of Patent: Dec. 8, 2015

(54) ORGANIC ELECTROLUMINESCENT DEVICE

(75) Inventors: Masaru Kinoshita, Kanagawa (JP); Manabu Tobise, Kanagawa (JP)

(73) Assignee: UDC Ireland Limited, Dublin (IE)

( * ) Notice: Subject to any disclaimer, the term of this patent is extended or adjusted under 35 U.S.C. 154(b) by 868 days.

(21) Appl. No.: 12/668,631

(22) PCT Filed: Jul. 25, 2008

(86) PCT No.: PCT/JP2008/063816
§ 371 (c)(1),
(2), (4) Date: Jan. 11, 2010

(87) PCT Pub. No.: WO2009/017211
PCT Pub. Date: Feb. 5, 2009

(65) Prior Publication Data
US 2010/0187985 A1    Jul. 29, 2010

(30) Foreign Application Priority Data

Jul. 27, 2007   (JP) ................................. 2007-196674

(51) Int. Cl.
*H01L 51/54*    (2006.01)
*C09K 11/06*    (2006.01)
*H01L 51/50*    (2006.01)
*H05B 33/14*    (2006.01)
*H05B 33/18*    (2006.01)
*H01L 51/00*    (2006.01)

(52) U.S. Cl.
CPC ............ *H01L 51/5016* (2013.01); *C09K 11/06* (2013.01); *H01L 51/0087* (2013.01); *H05B 33/14* (2013.01); *H05B 33/18* (2013.01); *C09K 2211/1029* (2013.01); *C09K 2211/1044* (2013.01); *C09K 2211/185* (2013.01); *H01L 51/006* (2013.01); *H01L 51/0071* (2013.01); *H01L 51/0081* (2013.01); *H01L 2251/5346* (2013.01)

(58) Field of Classification Search
CPC .............. H01L 51/006; H01L 51/0071; H01L 51/0081; H01L 51/0087; H01L 51/50; H01L 51/5016; C09K 11/06; C09K 2211/1029; C09K 2211/1044; C09K 2211/185; H05B 33/14; H05B 33/18
See application file for complete search history.

(56) References Cited

U.S. PATENT DOCUMENTS

| | | | |
|---|---|---|---|
| 2003/0075720 A1 | 4/2003 | Liao et al. | |
| 2005/0046337 A1 | 3/2005 | Chin et al. | |
| 2005/0168137 A1* | 8/2005 | Adamovich et al. | 313/504 |
| 2005/0238918 A1 | 10/2005 | Igarashi | |
| 2006/0222887 A1* | 10/2006 | Okada | 428/690 |

FOREIGN PATENT DOCUMENTS

| | | |
|---|---|---|
| JP | 6-310275 A | 11/1994 |
| JP | 2001-189193 A | 7/2001 |
| JP | 2002-313583 A | 10/2002 |
| JP | 2003-123984 A | 4/2003 |
| JP | 2004-6102 A | 1/2004 |
| JP | 2005-38672 A | 2/2005 |
| JP | 2005-108665 A | 4/2005 |
| JP | 2005-310547 A | 11/2005 |
| JP | 2007-103493 A | 4/2007 |
| JP | 2007110102 | 4/2007 |

* cited by examiner

*Primary Examiner* — Michael H Wilson
(74) *Attorney, Agent, or Firm* — Riverside Law LLP

(57) ABSTRACT

An organic EL device includes at least a light-emitting layer provided between a pair of electrodes. The light-emitting layer includes at least a hole transporting host material and an electron transporting phosphorescent material, and the concentration of the electron transporting phosphorescent material in the light-emitting layer decreases from a cathode side toward an anode side.

7 Claims, No Drawings

ORGANIC ELECTROLUMINESCENT DEVICE

TECHNICAL FIELD

The present invention relates to an organic electroluminescent device. In particular, the present invention relates to an organic electroluminescent device with an enhanced efficiency of light emission and a supreme durability.

BACKGROUND ART

Organic electroluminescent devices (organic EL devices) are composed of a light-emitting layer or plural organic functional layers including a light-emitting layer and a pair of opposing electrodes sandwiching those layers. Organic EL devices are light-emitting devices which utilize light emission from excitons generated by recombination of electrons injected from a cathode and holes injected from an anode in a light-emitting layer, and light emission from excitons of other molecules generated by energy transfer from at least one of the excitons.

Organic EL devices have been developed with a significant improvement in brightness and device efficiency that has been achieved by using laminated structures allowing separation of functions. For example, it is common to use two-layer laminated type devices having a hole-transport layer and a light-emitting electron-transport layer; three-layer laminated type devices having a hole-transport layer, a light-emitting layer and an electron-transport layer; and four-layer laminated type devices having a hole-transport layer, a light-emitting layer, a hole blocking layer and an electron-transport layer (see, for example, Science Vol. 267, No. 3, 1995, page 1332).

However, there are still many problems in practical uses of the organic EL devices. Firstly, a higher efficiency of light emission is desired, and secondly, a higher driving durability is desired. In particular, reduction in quality during continuous driving is the greatest problem to be overcome.

For example, an attempt has been proposed (see, for example, Japanese Patent Application Laid-Open (JP-A) No. 2003-123984) in which an external quantum efficiency is raised by providing an interfacial layer of from 0.1 nm to 5 nm as a barrier layer between the light-emitting layer and the hole-transport layer so as to delaying the movement of the holes and so as to adjust a balance of the hole movement and the electron movement. However in the attempt, there is a possibility that reduction of the movement of the carriers as a whole may lead to a reduction in brightness and an increase in the driving voltage, and that prolonged residence time of the carriers in the devices may lead to reduction in the driving durability.

Also, multilayer structures (multiphoton structures) prepared by stacking plural light-emitting units each including a light-emitting layer and a functional layer are known. For example, a constitution has been disclosed (see, for example, JP-A No. 6-310275) in which light-emitting units of plural organic electroluminescent devices (hereinafter also referred to as "organic EL devices") are separated by an insulating layer, and each light-emitting unit is provided with a pair of opposing electrodes. However in the constitution, because the insulating layer and the electrodes between the light-emitting units inhibit extraction of emitted light, it is substantially true that light emission from each light-emitting unit cannot be utilized sufficiently. Further, the technique does not serve as a measure to improve poor external quantum efficiency inherent in each light-emitting unit.

When the luminescent device is of a polymer dispersed type, the light-emitting layer usually has a monolayer structure and thus the light-emitting sites disperse in the light-emitting layer; therefore it is difficult to keep a balance of injection and transport of holes and electrons, which may cause reduction in recombination efficiency. As a countermeasure to address the problem, it has been proposed (see, for example, JP-A No. 2001-189193) to make the concentrations of both of the light-emitting material and the charge transporting material in the light-emitting layer lower at the anode side but higher at the cathode side thereby causing light emission to concentrate at the region of the cathode. Although the countermeasure is effective against the problem peculiar to the polymer dispersed type luminescent device, the light-emitting region is limited to only a region near the cathode side and the entire light-emitting layer is not utilized effectively for the light emission. Therefore the countermeasure does not provide an enhancement of the total efficiency of light emission.

Further, when the organic EL device is configured to have a laminated structure, carrier injection property is lowered by barriers between individual layers, driving voltage is increased and durability is reduced.

With regard to a countermeasure to reduce the barriers between individual layers, it has been proposed (see, for example, JP-A No. 2002-313583) to provide a gradient of the hole-injection material or the electron-injection material contained in each layer, or a gradient in the concentration of the hole-transport material or the electron-transport material in each layer. In this constitution, the light-emitting material in the light-emitting layer is disposed at a specified region in the light-emitting layer that is a bipolar mixed layer. Even in the constitution, light emission occurs only at the specified region where the light-emitting material is disposed.

Compatibility of both enhanced external quantum efficiency and enhanced driving durability is a significantly important problem in designing a practically useful organic EL device, and improvement thereof has been always demanded.

DISCLOSURE OF THE INVENTION

An object of the present invention is to provide an organic EL device with enhanced efficiency of light emission and superior durability.

A first aspect of the present invention provides an organic electroluminescent device comprising at least a light-emitting layer between a pair of electrodes, wherein the light-emitting layer includes at least a hole transporting host material and an electron transporting phosphorescent material, and the concentration of the electron transporting phosphorescent material in the light-emitting layer decreases from a cathode side toward an anode side.

A second aspect of the present invention provides an organic electroluminescent device according to the first aspect, wherein the concentration of the electron transporting phosphorescent material at a region adjacent to an anode side interface of the light-emitting layer is from 0% by mass to 50% by mass with respect to the concentration of the electron transporting phosphorescent material at a region adjacent to a cathode side interface of the light-emitting layer.

A third aspect of the present invention provides an organic electroluminescent device according to the second aspect, wherein the concentration of the electron transporting phosphorescent material in the light-emitting layer is 10% by mass or less at the region adjacent to the anode side interface.

A fourth aspect of the present invention provides an organic electroluminescent device according to the second or third aspect, wherein the concentration of the electron transporting phosphorescent material in the light-emitting layer is 12% by mass or more at the region adjacent to the cathode side interface.

A fifth aspect of the present invention provides an organic electroluminescent device according to any one of the first to the fourth aspects, wherein the electron transporting phosphorescent material is a metal complex having a tridentate or higher-dentate ligand.

A sixth aspect of the present invention provides an organic electroluminescent device according to the fifth aspect, wherein the metal complex is a platinum complex.

A seventh aspect of the present invention provides an organic electroluminescent device according to any one of the first to the sixth aspects, wherein the electron transporting phosphorescent material is a compound represented by the following formula (I):

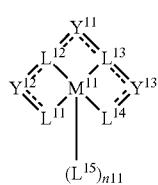

Formula (I)

wherein $M^{11}$ represents a metal ion; $L^{11}$ to $L^{15}$ each represent a moiety which coordinates to $M^{11}$; $L^{11}$ and $L^{14}$ may be connected by an atom group to form a cyclic ligand; $L^{15}$ does not bind to both $L^{11}$ and $L^{14}$ to form a cyclic ligand; $Y^{11}$, $Y^{12}$ and $Y^{13}$ each represent a connecting group, a single bond or a double bond; when $Y^{11}$ represents a connecting group, a bond between $L^{12}$ and $Y^{11}$ and a bond between $Y^{11}$ and $L^{13}$ are each independently a single bond or a double bond; when $Y^{12}$ represents a connecting group, a bond between $L^{11}$ and $Y^{12}$ and a bond between $Y^{12}$ and $L^{12}$ are each independently a single bond or a double bond; when $Y^{13}$ is a connecting group, a bond between $L^{13}$ and $Y^{13}$ and a bond between $Y^{13}$ and $L^{14}$ are each independently a single bond or a double bond; $n^{11}$ represents an integer of 0 to 4; and a bond between $M^{11}$ and each of $L^{11}$ to $L^{15}$ is selected from the group consisting of a coordinate bond, an ionic bond or a covalent bond.

An eighth aspect of the present invention provides an organic electroluminescent device according to any one of the first to the seventh aspects, wherein the hole transporting host material is a carbazole derivative or an indole derivative.

A ninth aspect of the present invention provides an organic electroluminescent device according to the eighth aspect, wherein the hole transporting host material is 1,3-bis(carbazole-9-yl)benzene or a derivative thereof.

A tenth aspect of the present invention provides an organic electroluminescent device according to any one of the first to the ninth aspects, wherein a peak wavelength of a light emission spectrum is 430 nm or more but less than 480 nm.

According to the present invention, an organic EL device is provided which has high light emission efficiency and supreme durability. In particular, an organic EL device is provided in which high efficiency of light emission is realized by using a phosphorescent material, reduction in efficiency of light emission is prevented even at a high-current region, and high efficiency of light emission and supreme durability are achieved over the range of from a low-current region to a high-current region.

BEST EMBODIMENT FOR CARRYING OUT THE INVENTION

An organic electroluminescent device according to the present invention includes at least a light-emitting layer provided between a pair of electrodes, wherein the light-emitting layer includes a hole transporting host material and an electron transporting phosphorescent material, and the concentration of the electron transporting phosphorescent material in the light-emitting layer decreases from the cathode side toward the anode side.

The concentration of the electron transporting host material in the light-emitting layer preferably decreases from the cathode side toward the anode side.

The concentration gradient of the electron transporting host material is preferably such that the concentration of the electron transporting host material at the region adjacent to the anode side interface of the light-emitting layer is from 0% by mass to 50% by mass, and more preferably from 0% by mass to 20% by mass, with respect to the concentration of the electron transporting host material at the region adjacent to the cathode side interface of the light-emitting layer.

In the present disclosure, the phrase "the region adjacent to the cathode side interface of the light-emitting layer" is defined as indicating a region of the light-emitting layer that is within 10% of the entire thickness of the light-emitting layer from the cathode side interface of the light-emitting layer, and the phrase "the region adjacent to the anode side interface of the light-emitting layer" is defined as indicating a region of the light-emitting layer that is within 10% of the entire thickness of light-emitting layer from the anode side interface of the light-emitting layer. The concentration at the region is defined as an average concentration over the region. The concentration of each material in "the region adjacent to the cathode side (anode side) interface of the light-emitting layer" can be measured in accordance with a Time of Flight type Secondary Ion Mass Spectrometry (TOF-SIMS), an etching X-ray Photoelectron Spectroscopy Analysis (XPS/ESCA) and the like.

In the present invention, the term "concentration gradient" means that the concentration decreases or increases as a whole, and the concentration may vary continuously, or vary stepwise or vary in a wavy manner. Alternatively, for example, a decreasing concentration gradient in which the concentration decreases as a whole is within the scope of the present disclosure even if there is a region in the layer at which the concentration locally increases.

As a result, in the present invention, because light emission occurs uniformly in the entire light-emitting layer, the efficiency of the light emission is improved, the light-emitting distribution is close to light emission from the entire layer, and durability is also improved. It is supposed that because the gradient structure of the present invention retards the movement of the electrons injected from the cathode into the light-emitting layer as the electrons move toward the anode side, recombination of the holes and the electrons, which conventionally occurred only at the cathode surface side of the light-emitting layer, occurs also at a central portion of the light-emitting layer. Heretofore, although it has been proposed (see, for example, JP-A No. 2002-313583) to provide a gradient of the hole-injection material or the electron-injection material contained in each layer or a gradient of the concentration of the hole-transport material or the electron-transport material in each layer as a countermeasure to reduce the barriers between the individual layers, it is totally unexpected from conventional knowledge that light emission from the entire light-emitting layer is enabled and light-emitting efficiency and driving durability are improved by providing a gradient of the light-emitting material in the light-emitting layer.

Preferably, the concentration of the electron transporting phosphorescent material at the region adjacent to the anode side interface in the light-emitting layer is preferably 10% by mass or less, more preferably 7% by mass or less and further preferably 5% by mass or less.

The concentration of the electron transporting phosphorescent material at the region adjacent to the cathode side interface in the light-emitting layer is preferably 12% by mass or more, more preferably 15% by mass or more and further preferably 18% by mass or more.

When the concentration of the electron transporting phosphorescent material at the region adjacent to the anode side interface in the light-emitting layer exceeds 10% by mass, the amount of the electrons escaping from the light-emitting layer toward the anode side increases and causes unfavorable reduction in the efficiency of light emission. Further, when the concentration of the electron transporting phosphorescent material at the region adjacent to the cathode side interface in the light-emitting layer is lower than 12% by mass, the amount of the electrons injected into the light-emitting layer decreases and causes unfavorable reduction in the efficiency of light emission.

The electron transporting phosphorescent material is preferably a metal complex having a tridentate or higher-dentate ligand, which is preferably a platinum complex.

The electron transporting phosphorescent material is more preferably a compound represented by the formula (I) shown above.

The hole transporting host material in the present invention is preferably a carbazole derivative or an indole derivative.

The hole transporting material is more preferably mCP or a derivative thereof. The electron transporting phosphorescent material in the present invention is preferably a material that emits blue light.

1. Constitution of Organic EL Device

A preferable embodiment of the lamination of the organic compound layers in the present invention preferably has a hole-transport layer, a light-emitting layer, and an electron-transport layer disposed in this order from the anode side. A hole-injection layer may be provided between the anode and the hole-transport layer. An electron-transporting intermediate layer may be provided between the light-emitting layer and the electron-transport layer. A hole-transporting intermediate layer may be provided between the light-emitting layer and the hole-transport layer. An electron-injection layer may be provided between the cathode and the electron-transport layer.

Preferred embodiments of the organic compound layers in the organic electroluminescent device of the present invention include the following:

(1) An embodiment including at least a hole-injection layer, a hole-transport layer (the hole-injection layer and the hole-transport layer may be the identical layer), a hole transporting intermediate layer, a light-emitting layer, an electron-transport layer and an electron-injection layer (the electron-transport layer and the electron-injection layer may be the identical layer) disposed in this order from the anode side;

(2) An embodiment including at least a hole-injection layer, a hole-transport layer (the hole-injection layer and the hole-transport layer may be the identical layer), a light-emitting layer, an electron transporting intermediate layer, an electron-transport layer and an electron-injection layer (the electron-transport layer and the electron-injection layer may be the identical layer) disposed in this order from the anode side; and (3) An embodiment including at least a hole-injection layer, a hole-transport layer (the hole-injection layer and the hole-transport layer may be the identical layer), a hole transporting intermediate layer, a light-emitting layer, an electron transporting intermediate layer, an electron-transport layer and an electron-injection layer (the electron-transport layer and the electron-injection layer may be the identical layer) disposed in this order from the anode side.

The hole transporting intermediate layer preferably has at least one of a function of accelerating the injection of holes into the light-emitting layer or a function of blocking electrons.

Furthermore, the electron transporting intermediate layer preferably has at least one of a function of accelerating the injection of electrons into the light-emitting layer or a function of blocking holes.

Moreover, at least one of the hole transporting intermediate layer or the electron transporting intermediate layer preferably has a function of blocking excitons generated in the light-emitting layer.

In order to allowing functions to be performed effectively, such as accelerating the injection of holes, accelerating the injection of electrons, blocking holes, blocking electrons, and blocking excitons, it is preferable that the hole transporting intermediate layer and the electron transporting intermediate layer are disposed adjoining the light-emitting layer.

Additionally, each of the layers mentioned above may be separated into plural sub-layers.

The organic EL device of the present invention may have a resonator structure. For example, the organic EL device may have a structure including a multilayer-film mirror having plural films with different refractive indices disposed in layers, a transparent or translucent electrode, a light-emitting layer and a metal-electrode stacked on a transparent substrate. Light generated in the light-emitting layer repeats reflection between the multilayer-film mirror and the metal-electrode, which serve as reflector plates, so that resonance of the light is achieved.

In another preferable embodiment, a transparent or translucent electrode and a metal electrode on a transparent substrate function as reflector plates and the light generated in the light-emitting layer repeat reflection so that resonance of the light is achieved.

In order to form the resonant structure, effective refractive indices of two reflector plates and an optical path length determined by the refractive index and the thickness of the respective layer(s) provided between the resonator plates are adjusted to be values that are optimum for obtaining a desired resonant wavelength. JP-A No. 9-180883 discloses a calculation formula in the former embodiment. JP-A No. 2004-127795 discloses a calculation formula in the latter embodiment.

Each layer in the organic compound layer(s) can be preferably formed by any process such as a dry type film forming process (such as a vapor deposition method or a sputtering method), a transfer method, a printing method, a coating method, an ink-jet method, or a spray method.

Next, the components constituting the organic EL device of the present invention will be described in detail.

2. Light-Emitting Layer

The light-emitting layer is a layer that receives holes from the anode, the hole-injection layer, the hole-transport layer or the hole transporting intermediate layer, and receives electrons from the cathode, the electron-injection layer, electron-transport layer or the electron transporting intermediate layer when an electric field is applied; the light-emitting layer has a function to emit light by providing a field for recombination of the holes and the electrons.

An organic EL device according to the present invention includes at least a light-emitting layer provided between a pair of electrodes. The light-emitting layer includes at least a hole transporting host material and an electron transporting phosphorescent material. The concentration of the electron transporting phosphorescent material in the light-emitting layer decreases from the cathode side toward the anode side.

(Electron Transporting Phosphorescent Material)

Examples of the electron transporting phosphorescent material used in the present invention include an ortho-metallated metal complex and a porphyrin metal complex. The ortho-metallated metal complex is the general term about the compound group described in, for example, Akio Yamamoto "YUHKI KINZOKU KAGAKU-KISO TO OUYOU (Metal Organic Chemistry-Fundamental and Application)" pp. 150 and 232 (Shokabo Publishing Co., Ltd., 1982) and H. Yersin "*Photochemistry and Photophisics of Coodination Compounds*" pp. 71 to 77 and 135 to 146 (Springer-Verlag Company, 1987).

There are various ligands to form the ortho-metallated metal complex, and although they are described in the documents, preferred ligands are 2-phenylpyridine derivatives, 7,8-benzoquinoline derivatives, 2-(2-thienyl)pyridine derivatives, 2-(1-naphthyl)pyridine derivatives, 2-phenylquinoline derivatives and the like. These derivatives may have a substituent as occasion demands. Also, the ortho-metallated metal complex may have other ligand in addition to the above-mentioned ligand.

The ortho-metallated metal complex can be synthesized in accordance with various kinds of known techniques such as those described in *Inorg Chem.*, 1991, No. 30, p. 1685; *Inorg Chem.*, 1988, No. 27, p. 3464; *Inorg Chem.*, 1994, No. 33, p. 545; *Inorg. Chico. Acta,* 1991, No. 181, p. 245; *J. Organomet. Chem.*, 1987, No. 335, p. 293; or *J. Am. Chem. Soc.* 1985, No. 107, p. 14 to 31.

Among the porphyrin metal complexes, a porphyrin platinum complex is preferable.

In the present invention, only a single electron transporting phosphorescent material may be used, or two or more electron transporting phosphorescent materials may be used in combination. It is also possible to use a fluorescent light-emitting material and a phosphorescent material simultaneously.

In the invention, a particularly preferable electron transporting phosphorescent material to be used is a metal complex having a tridentate or higher-dentate ligand.

First, the metal complex having a tridentate or higher-dentate ligand according to the invention will be described in detail.

In the metal complex, the atoms coordinating to the metal ion are not particularly limited. An oxygen atom, a nitrogen atom, a carbon atom, a sulfur atom, or a phosphorus atom is preferable, an oxygen atom, a nitrogen atom, or a carbon atom is more preferable, and a nitrogen atom or a carbon atom is still more preferable.

The metal ion in the metal complex is not particularly limited. From the viewpoint of the improvement in the light emission efficiency, the improvement in durability and the decrease in the driving voltage, transition metal ions and rare-earth metal ions are preferable; an iridium ion, a platinum ion, a gold ion, a rhenium ion, a tungsten ion, a rhodium ion, a ruthenium ion, an osmium ion, a palladium ion, a silver ion, a copper ion, a cobalt ion, a zinc ion, a nickel ion, a lead ion, an aluminum ion, a gallium ion, and rare-earth metal ions (for example, an europium ion, a gadolinium ion, and a terbium ion) are more preferable; an iridium ion, a platinum ion, a gold ion, a rhenium ion, a tungsten ion, a palladium ion, a zinc ion, an aluminum ion, a gallium ion, an europium ion, a gadolinium ion, and a terbium ion are still more preferable. When the metal complex is used as a light-emitting material, an iridium ion, a platinum ion, a rhenium ion, a tungsten ion, an europium ion, a gadolinium ion, and a terbium ion are particularly preferable.

When the metal complex is used as a charge transport material or a host material in a luminescent layer, an iridium ion, a platinum ion, a palladium ion, a zinc ion, an aluminum ion, and a gallium ion are particularly preferable.

As metal complexes having a tridentate or higher-dentate ligand in the invention, complexes having a ligand of tridentate to hexadentate are preferable from the viewpoint of the improvement in the light emission efficiency and the improvement in durability. In the case of metal ions which easily form a hexa-coordinate type complex, such as an iridium ion, metal complexes having a tridentate, a quadridentate, or a hexadentate ligand are preferable. In the case of metal ions which easily form a tetra-coordinate type complex, such as a platinum ion, metal complexes having a tridentate or a quadridentate ligand are more preferable, and metal complexes having a quadridentate ligand are still more preferable.

The ligand of the metal complex in the invention is preferably chained or circular from the viewpoint of the improvement in the light emission efficiency and the improvement in durability, and preferably has at least one nitrogen-containing heterocycle (for example, a pyridine ring, a quinoline ring, a pyrimidine ring, a pyrazine ring, a pyrrole ring, an imidazole ring, a pyrazole ring, an oxazole ring, a thiazole ring, an oxadiazole ring, a thiadiazole ring, and a triazole ring) which coordinates to the center metal (for example, $M^{11}$ in the case of a compound represented by the after-mentioned formula (I)) with nitrogen. The nitrogen-containing heterocycle is preferably a nitrogen-containing six-membered heterocycle or a nitrogen-containing five-membered heterocycle. The heterocycles described above may form one or more condensed rings with other rings.

The expression "the ligand of a metal complex is chained" means that the ligand of the metal complex does not take a cyclic structure (for example, a terpyridyl ligand or a 2,6-diphenylpyridine ligand). Furthermore, the expression "the ligand of a metal complex is circular" means that plural ligands in the metal complex are bonded mutually to form a closed structure (for example, a phthalocyanine ligand or a crown ether ligand).

The metal complex in the invention is preferably a compound represented by the formula (I), (II), or (III), which will be described in detail later.

The compound represented by Formula (I) will be described first.

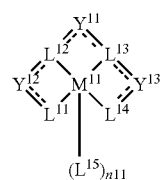

Formula (I)

In Formula (I), $M^{11}$ represents a metal ion; $L^{11}$ to $L^{15}$ each independently represent a ligand coordinated to $M^{11}$; an additional atomic group may connect $L^{11}$ and $L^{14}$ to form a cyclic ligand; $L^{15}$ does not bind to both $L^{11}$ and $L^{14}$ to form a cyclic ligand; $Y^{11}$ to $Y^{13}$ each independently represent a connecting group, a single bond, or a double bond; when $Y^{11}$ represents a connecting group, the bond between $L^{12}$ and $Y^{11}$ and the bond between $Y^{11}$ and $L^{13}$ are each independently a single bond or a double bond; when $Y^{12}$ represents a connecting group, the bond between $L^{11}$ and $Y^{12}$ and the bond between $Y^{12}$ and $L^{12}$ are each independently a single bond or a double bond; when $Y^{13}$ represents a connecting group, the bond between $L^{13}$ and $Y^{13}$ and the bond between $Y^{13}$ and $L^{14}$ are each independently a single bond or a double bond; and $n^{11}$ represents an integer of 0 to 4. The bond connecting $M^{11}$ and each of $L^{11}$ to $L^{15}$ may be selected from the group consisting of a coordinate bond, an ionic bond and a covalent bond.

Hereinafter, details of the compound represented by Formula (I) will be described.

In Formula (I), $M^{11}$ represents a metal ion. The metal ion is not particularly limited, but is preferably a divalent or trivalent metal ion. Preferable examples of the divalent or trivalent metal ion include a platinum ion, an iridium ion, a rhenium ion, a palladium ion, a rhodium ion, a ruthenium ion, a copper ion, a europium ion, a gadolinium ion, and a terbium ion. More preferable examples thereof include a platinum ion, an iridium ion, and a europium ion. Still more preferable examples thereof include a platinum ion and an iridium ion. Particularly preferable examples thereof include a platinum ion.

In Formula (I), $L^{11}$, $L^{12}$, $L^{13}$, and $L^{14}$ each independently represent a moiety coordinating to $M^{11}$. Preferable examples of the atom coordinating to $M^{11}$ and contained in $L^{11}$, $L^{12}$, $L^{13}$, or $L^{14}$ include preferably a nitrogen atom, an oxygen atom, a sulfur atom, a carbon atom, and a phosphorus atom. More preferable examples thereof include a nitrogen atom, an oxygen atom, a sulfur atom, and a carbon atom. Still more preferable examples thereof include a nitrogen atom, an oxygen atom, and a carbon atom.

The bonds between $M^{11}$ and $L^{11}$, between $M^{11}$ and $L^{12}$, between $M^{11}$ and $L^{13}$, between $M^{11}$ and $L^{14}$ each may be independently selected from a covalent bond, an ionic bond, and a coordination bond. In this specification, the term "ligand" is used also when the bond between the central metal and the ligand is a bond (an ionic bond or a covalent bond) other than a coordination bond, as well as when the bond between the central metal and the ligand is a coordination bond, for convenience of the explanation.

The entire ligand comprising $L^{11}$, $Y^{12}$, $L^{12}$, $Y^{11}$, $L^{13}$, $Y^{13}$, and $L^{14}$ is preferably an anionic ligand. The term "anionic ligand" used herein refers to a ligand having at least one anion bonded to the metal. The number of anions in the anionic ligand is preferably from 1 to 3, more preferably 1 or 2, and still more preferably 2.

When the moiety represented by any of $L^{11}$, $L^{12}$, $L^{13}$, and $L^{14}$ coordinates to $M^{11}$ via a carbon atom, the moiety is not particularly limited, and examples thereof include imino ligands, aromatic carbon ring ligands (e.g., a benzene ligand, a naphthalene ligand, an anthracene ligand, and a phenanthrene ligand), and heterocyclic ligands [e.g., a furan ligand, a thiophene ligand, a pyridine ligand, a pyrazine ligand, a pyrimidine ligand, a thiazole ligand, an oxazole ligand, a pyrrole ligand, an imidazole ligand, and a pyrazole ligand, ring-condensation products thereof (e.g., a quinoline ligand and a benzothiazole ligand), and tautomers thereof].

When the moiety represented by any of $L^{11}$, $L^{12}$, $L^{13}$, and $L^{14}$ coordinates to $M^{11}$ via a nitrogen atom, the moiety is not particularly limited, and examples thereof include nitrogen-containing heterocyclic ligands such as a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, and a thiadiazole ligand, and ring-condensation products thereof (e.g., a quinoline ligand, a benzoxazole ligand, and a benzimidazole ligand), and tautomers thereof [in the invention, the following ligands (pyrrole tautomers) are also considered to be within the definition of tautomers, in addition to normal isomers: the five-membered heterocyclic ligand of compound (24), the terminal five-membered heterocyclic ligand of compound (64), and the five-membered heterocycle ligand of compound (145)]; amino ligands such as alkylamino ligands (preferably having 2 to 30 carbon atoms, more preferably 2 to 20 carbon atoms, and particularly preferably 2 to 10 carbon atoms, such as methylamino), arylamino ligands (e.g., phenylamino), acylamino ligands (preferably having 2 to 30 carbon atoms, more preferably 2 to 20 carbon atoms, and particularly preferably 2 to 10 carbon atoms, such as acetylamino and benzoylamino), alkoxycarbonylamino ligands (preferably having 2 to 30 carbon atoms, more preferably 2 to 20 carbon atoms, and particularly preferably 2 to 12 carbon atoms, such as methoxycarbonylamino), aryloxycarbonylamino ligands (preferably having 7 to 30 carbon atoms, more preferably 7 to 20 carbon atoms, and particularly preferably 7 to 12 carbon atoms, such as phenyloxycarbonylamino), sulfonylamino ligands (preferably having 1 to 30 carbon atoms, more preferably 1 to 20 carbon atoms, and particularly preferably 1 to 12 carbon atoms, such as methanesulfonylamino and benzenesulfonylamino), and imino ligands. These ligands may be further substituted.

When the moiety represented by any of $L^{11}$, $L^{12}$, $L^{13}$, and $L^{14}$ coordinates to $M^{11}$ via an oxygen atom, the moiety is not particularly limited, and examples thereof include alkoxy ligands (preferably having 1 to 30 carbon atoms, more preferably 1 to 20 carbon atoms, and particularly preferably 1 to 10 carbon atoms, such as methoxy, ethoxy, butoxy, and 2-ethylhexyloxy), aryloxy ligands (preferably having 6 to 30 carbon atoms, more preferably 6 to 20 carbon atoms, and particularly preferably 6 to 12 carbon atoms, such as phenyloxy, 1-naphthyloxy, and 2-naphthyloxy), heterocyclic oxy ligands (preferably having 1 to 30 carbon atoms, more preferably 1 to 20 carbon atoms, and particularly preferably 1 to 12 carbon atoms, such as pyridyloxy, pyrazyloxy, pyrimidyloxy, and quinolyloxy), acyloxy ligands (preferably having 2 to 30 carbon atoms, more preferably 2 to 20 carbon atoms, and particularly preferably 2 to 10 carbon atoms, such as acetoxy and benzoyloxy), silyloxy ligands (preferably having 3 to 40 carbon atoms, more preferably 3 to 30 carbon atoms, and particularly preferably 3 to 24 carbon atoms, such as trimethylsilyloxy and triphenylsilyloxy), carbonyl ligands (e.g., ketone ligands, ester ligands, and amido ligands), and ether ligands (e.g., dialkylether ligands, diarylether ligands, and furyl ligands). These substituents may be further substituted.

When the moiety represented by any of $L^{11}$, $L^{12}$, $L^{13}$, and $L^{14}$ coordinates to $M^{11}$ via a sulfur atom, the moiety is not particularly limited, and examples thereof include alkylthio ligands (preferably having 1 to 30 carbon atoms, more preferably 1 to 20 carbon atoms, and particularly preferably 1 to 12 carbon atoms, such as methylthio and ethylthio), arylthio ligands (preferably having 6 to 30 carbon atoms, more preferably 6 to 20 carbon atoms, and particularly preferably 6 to 12 carbon atoms, such as phenylthio), heterocyclic thio ligands (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, and 2-benzothiazolylthio), thiocarbonyl ligands (e.g., thioketone ligands and thioester ligands), and thioether ligands (e.g., dialkylthioether ligands, diarylthioether ligands, and thiofuryl ligands). These substitution ligands may be further substituted.

When the moiety represented by any of $L^{11}$, $L^{12}$, $L^{13}$, and $L^{14}$ coordinates to $M^{11}$ via a phosphorus atom, the moiety is not particularly limited, and examples thereof include dialkylphosphino ligands, diarylphosphino ligands, trialkylphosphine ligands, triarylphosphine ligands, and phosphinine ligands. These ligands may be further substituted.

In a preferable embodiment, $L^{11}$ and $L^{14}$ each independently represent a moiety selected from an aromatic carbon ring ligand, an alkyloxy ligand, an aryloxy ligand, an ether ligand, an alkylthio ligand, an arylthio ligand, an alkylamino ligand, an arylamino ligand, an acylamino ligand, or a nitrogen-containing heterocyclic ligand [e.g., a pyridine ligand, a pyrazine ligand, a pyrimidine ligand, a pyridazine ligand, a triazine ligand, a thiazole ligand, an oxazole ligand, a pyrrole ligand, an imidazole ligand, a pyrazole ligand, a triazole ligand, an oxadiazole ligand, a thiadiazole ligand, or a condensed ring ligand containing one or more of the above ligands (e.g., a quinoline ligand, a quinoxaline ligand, a phthalazine ligand, a benzoxazole ligand, or a benzimidazole ligand), or a tautomer of any of the above ligands]; more preferably, an aromatic carbon ring ligand, an aryloxy ligand, an arylthio ligand, an arylamino ligand, a pyridine ligand, a pyrazine ligand, an imidazole ligand, a condensed ring ligand containing one or more of the above ligands (e.g., a quinoline ligand, a quinoxaline ligand, a phthalazine ligand, or a benzimidazole ligand), or a tautomer of any of the above ligands; still more preferably, an aromatic carbon ring ligand, an aryloxy ligand, an arylthio ligand, an arylamino ligand, a pyridine ligand, a pyrazine ligand, a pyrazole ligand, an imidazole ligand, or a condensed ring ligand containing one or more of these ligands; and particularly preferably, an aromatic carbon ring ligand, an aryloxy ligand, a pyridine ligand, a pyrazine ligand, a pyrazole ligand, an imidazole ligand, or a condensed ring ligand containing one or more of these ligands.

In a preferable embodiment, $L^{12}$ and $L^{13}$ each independently represent a moiety forming a coordination bond with $M^{11}$. The moiety forming a coordination bond with $M^{11}$ is preferably a pyridine, pyrazine, pyrimidine, triazine, thiazole, oxazole, pyrrole or triazole ring, a condensed ring containing one or more of the above rings (e.g., a quinoline ring, a quinoxaline ligand, a phthalazine ligand, a benzoxazole ring, a benzimidazole ring, an indolenine ring), or a tautomer of any of the above ligands; more preferably a pyridine, pyrazine, pyrimidine, or pyrrole ring, a condensed ring containing one or more of the above rings (e.g., a quinoline ring, a quinoxaline ring, a phthalazine ring, an indole ring), or a tautomer of any of the these rings; still more preferably a pyridine, pyrazine or pyrimidine ring, or a condensed ring containing one or more of these rings (e.g., quinoline ring); particularly preferably a pyridine ring or a condensed ring containing a pyridine ring (e.g., a quinoline ring).

In Formula (I), $L^{15}$ represents a ligand coordinating to $M^{11}$. $L^{15}$ is preferably a monodentate to tetradentate ligand and more preferably a monodentate to tetradentate anionic ligand. The monodentate to tetradentate anionic ligand is not particularly limited, but is preferably a halogen ligand, a 1,3-diketone ligand (e.g., an acetylacetone ligand), a monoanionic bidentate ligand containing a pyridine ligand [e.g., a picolinic acid ligand or a 2-(2-hydroxyphenyl)-pyridine ligand], or a tetradentate ligand that $L^{11}$, $Y^{12}$, $L^{12}$, $Y^{11}$, $L^{13}$, $Y^{13}$, and $L^{14}$ can form; more preferably, a 1,3-diketone ligand (e.g., an acetylacetone ligand), a monoanionic bidentate ligand containing a pyridine ligand [e.g., a picolinic acid ligand or a 2-(2-hydroxyphenyl)-pyridine ligand], or a tetradentate ligand that $L^{11}$, $Y^{12}$, $L^{12}$, $Y^{11}$, $L^{13}$, $Y^{13}$, and $L^{14}$ can form; still more preferably, a 1,3-diketone ligand (e.g., an acetylacetone ligand) or a monoanionic bidentate ligand containing a pyridine ligand [e.g., a picolinic acid ligand or a 2-(2-hydroxyphenyl)-pyridine ligand); and particularly preferably, a 1,3-diketone ligand (e.g., an acetylacetone ligand). The number of coordination sites and the number of ligands do not exceed the valency of the metal. $L^{15}$ does not bind to both $L^{11}$ and $L^{14}$ to form a cyclic ligand.

In Formula (I), $Y^{11}$, $Y^{12}$ and $Y^{13}$ each independently represent a connecting group or a single or double bond. The connecting group is not particularly limited, and preferable examples thereof include connecting groups containing atoms selected from carbon atoms, nitrogen atoms, oxygen atoms, sulfur atoms, silicon atoms, and phosphorus atoms. Specific examples of such connecting groups include the following groups:

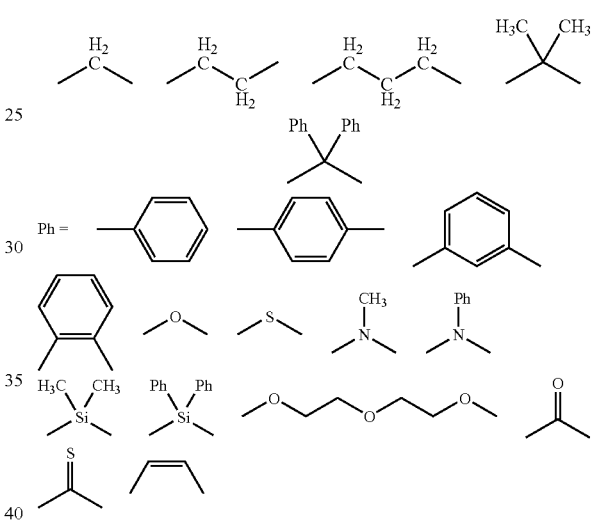

When $Y^{11}$ is a connecting group, the bond between $L^{12}$ and $Y^{11}$ and the bond between $Y^{11}$ and $L^{13}$ are each independently a single or double bond. When $Y^{12}$ is a connecting group, the bond between $L^{11}$ and $Y^{12}$ and the bond between $Y^{12}$ and $L^{12}$ are each independently a single or double bond. When $Y^{13}$ is a connecting group, the bond between $L^{13}$ and $Y^{13}$ and the bond between $Y^{13}$ and $L^{14}$ are each independently a single or double bond.

$Y^{11}$, $Y^{12}$, and $Y^{13}$ each independently represent preferably a single bond, a double bond, a carbonyl connecting group, an alkylene connecting group, an alkenylene group, or an amino connecting group. $Y^{11}$ is more preferably a single bond, an alkylene group, or an amino connecting group, and still more preferably an alkylene group. Each of $Y^{12}$ and $Y^{13}$ is more preferably a single bond or an alkenylene group and still more preferably a single bond.

The ring formed by $Y^{12}$, $L^{11}$, $L^{12}$, and $M^{11}$, the ring formed by $Y^{11}$, $L^{12}$, $L^{13}$, and $M^{11}$, and the ring formed by $Y^{13}$, $L^{13}$, $L^{14}$, and $M^{11}$ are each preferably a four- to ten-membered ring, more preferably a five- to seven-membered ring, and still more preferably a five- to six-membered ring.

In Formula (I), $n^{11}$ represents an integer of 0 to 4. When $M^{11}$ is a tetravalent metal, $n^{11}$ is 0. When $M^{11}$ is a hexavalent metal, $n^{11}$ is preferably 1 or 2 and more preferably 1. When $M^{11}$ is a hexavalent metal and $n^{11}$ is 1, $L^{15}$ represents a bidentate ligand. When $M^{11}$ is a hexavalent metal and $n^{11}$ is 2, $L^{15}$ represents a monodentate ligand. When $M^{11}$ is an octavalent metal, $n^{11}$ is preferably from 1 to 4, more preferably, 1 or 2, and still more preferably 1. When $M^{11}$ is an octavalent metal and $n^{11}$ is 1, $L^{15}$ represents a tetradentate ligand. When $M^{11}$ is an octavalent metal and $n^{11}$ is 2, $L^{15}$ represents a bidentate ligand. When $n^{11}$ is two or greater, there are plural $L^{15}$'s, and the $L^{15}$'s may be the same as or different from each other.

Preferable embodiments of the compound represented by Formula (I) include compounds represented by the following Formulae (1), (2), (3), (4), and (5).

Firstly, explanation of the compound represented by Formula (1) is provided.

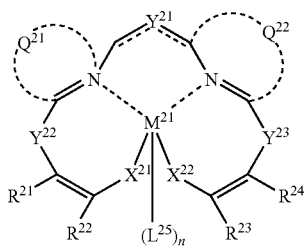

Formula (1)

In Formula (1), $M^{21}$ represents a metal ion; and $Y^{21}$ represents a connecting group or a single or double bond. $Y^{23}$ and $Y^{23}$ each represent a single bond or a connecting group. $Q^{21}$ and $Q^{22}$ each represent an atomic group forming a nitrogen-containing heterocycle, and the bond between $Y^{21}$ and the ring containing $Q^{21}$ and the bond between $Y^{21}$ and the ring containing $Q^{22}$ are each a single or double bond. $X^{21}$ and $X^{22}$ each independently represent an oxygen atom, a sulfur atom, or a substituted or unsubstituted nitrogen atom. $R^{21}$, $R^{22}$, $R^{23}$, and $R^{24}$ each independently represent a hydrogen atom or a substituent. $R^{21}$ and $R^{22}$ may bind to each other to form a ring, and $R^{23}$ and $R^{24}$ may bind to each other to form a ring. $L^{25}$ represents a ligand coordinating to $M^{21}$, and $n^{21}$ represents an integer of 0 to 4.

The compound represented by formula (1) will be described in detail.

In Formula (1), the definition of $M^{21}$ is the same as the definition of $M^{11}$ in Formula (I), and their preferable ranges are also the same.

$Q^{21}$ and $Q^{22}$ each independently represent an atomic group forming a nitrogen-containing heterocycle (ring containing a nitrogen atom coordinating to $M^{21}$). The nitrogen-containing heterocycles formed by $Q^{21}$ and $Q^{22}$ are not particularly limited, and may be selected, for example, from a pyridine ring, a pyrazine ring, a pyrimidine ring, a pyridazine ring, a triazine ring, a pyrazole ring, an imidazole ring, a thiazole ring, an oxazole ring, a pyrrole ring, and a triazole ring, and condensed rings containing one or more of the above rings (e.g., a quinoline ring, a quinoxaline ring, a phthalazine ring, and an indole ring, a benzoxazole ring, a benzimidazole ring, and an indolenine ring), and tautomers thereof.

The nitrogen-containing heterocycle formed by $Q^{21}$ or $Q^{22}$ is preferably selected from a pyridine ring, a pyrazine ring, a pyrimidine ring, a pyridazine ring, a triazine ring, a pyrazol ring, an imidazol ring, an oxazol ring, a pyrrol ring, and condensed rings containing one or more of the above rings (e.g., a quinoline ring, a quinoxaline ring, a phthalazine ring, an indole ring, a benzoxazole ring, and a benzimidazole ring), and tautomers thereof, more preferably selected from a pyridine ring, a pyrazine ring, a pyrimidine ring, an imidazol ring, a pyrrol ring, and condensed rings containing one or more of the above rings (e.g., a quinoline ring), and tautomers thereof, still more preferably a pyridine ring, or a condensed ring containing the pyridine ring (e.g., a quinoline ring), and particularly preferably a pyridine ring.

$X^{21}$ and $X^{22}$ each independently represent an oxygen atom, a sulfur atom, or a substituted or unsubstituted nitrogen atom. $X^{21}$ and $X^{22}$ are each preferably an oxygen atom, a sulfur atom, or a substituted nitrogen atom, more preferably an oxygen atom or a sulfur atom, and particularly preferably an oxygen atom.

The definition of $Y^{21}$ is the same as that of $Y^{11}$ in Formula (I), and their preferable ranges are also the same.

$Y^{22}$ and $Y^{23}$ each independently represent a single bond or a connecting group, preferably a single bond. The connecting group is not particularly limited, and examples thereof include a carbonyl connecting group, a thiocarbonyl connecting group, an alkylene group, an alkenylene group, an arylene group, a heteroarylene group, an oxygen atom connecting group, a nitrogen atom connecting group, a sulfur atom connecting group, and connecting groups comprising combinations of connecting groups selected from the above.

The connecting group represented by $Y^{22}$ or $Y^{23}$ is preferably a carbonyl connecting group, an alkylene connecting group, or an alkenylene connecting group, more preferably a carbonyl connecting group or an alkenylene connecting group, and still more preferably a carbonyl connecting group.

$R^{21}$, $R^{22}$, $R^{23}$, and $R^{24}$ each independently represent a hydrogen atom or a substituent. The substituent is not particularly limited, and examples thereof include alkyl groups (preferably having 1 to 30 carbon atoms, more preferably 1 to 20 carbon atoms, and particularly preferably 1 to 10 carbon atoms, and examples thereof include a methyl group, an ethyl group, an iso-propyl group, a tert-butyl group, a n-octyl group, a n-decyl group, a n-hexadecyl group, a cyclopropyl group, a cyclopentyl group, and a cyclohexyl group), alkenyl groups (preferably having 2 to 30 carbon atoms, more preferably 2 to 20 carbon atoms, and particularly preferably 2 to 10 carbon atoms, and examples thereof include a vinyl group, an allyl group, a 2-butenyl group, and a 3-pentenyl group), alkynyl groups (preferably having 2 to 30 carbon atoms, more preferably 2 to 20 carbon atoms, and particularly preferably 2 to 10 carbon atoms, and examples thereof include a propargyl group and a 3-pentynyl group), aryl groups (preferably having 6 to 30 carbon atoms, more preferably 6 to 20 carbon atoms, and particularly preferably 6 to 12 carbon atoms, and examples thereof include a phenyl group, a p-methylphenyl group, a naphthyl group, and an anthranyl group), amino groups (preferably having 0 to 30 carbon atoms, more preferably 0 to 20 carbon atoms, and particularly preferably 0 to 10 carbon atoms, and examples thereof include an amino group, a, methylamino group, a dimethylamino group, a diethylamino group, a dibenzylamino group, a diphenylamino group, and a ditolylamino group), alkoxy groups (preferably having 1 to 30 carbon atoms, more preferably 1 to 20 carbon atoms, and particularly preferably 1 to 10 carbon atoms, and examples thereof include a methoxy group, an ethoxy group, a butoxy group, and a 2-ethylhexyloxy group), aryloxy groups (preferably having 6 to 30 carbon atoms, more preferably 6 to 20 carbon atoms, and particularly preferably 6 to 12 carbon atoms, and examples thereof include a phenyloxy group, a 1-naphthyloxy group, and a 2-naphthyloxy group), heterocyclic oxy groups (preferably having 1 to 30 carbon atoms, more preferably 1 to 20 carbon atoms, and particularly preferably 1 to 12 carbon atoms, and examples thereof include a pyridyloxy group, a pyrazyloxy group, a pyrimidyloxy group, and a quinolyloxy group), acyl groups (preferably having 1 to 30 carbon atoms, more preferably 1 to 20 carbon atoms, and particularly preferably 1 to 12 carbon atoms, and examples thereof include an acetyl group, a benzoyl group, a formyl group, and a pivaloyl group), alkoxycarbonyl groups (preferably having 2 to 30 carbon atoms, more preferably 2 to 20 carbon atoms, and particularly preferably 2 to 12 carbon atoms, and examples thereof include a methoxycarbonyl group and an ethoxycarbonyl group), aryloxycarbonyl groups (preferably having 7 to 30 carbon atoms, more preferably 7 to 20 carbon atoms, and particularly preferably 7 to 12 carbon atoms, and examples thereof include a phenyloxycarbonyl group), acyloxy groups (preferably having 2 to 30 carbon atoms, more preferably 2 to 20 carbon atoms, and particularly preferably 2 to 10 carbon atoms, and examples thereof include an acetoxy group and a benzoyloxy group), acylamino groups (preferably having 2 to 30 carbon atoms, more preferably 2 to 20 carbon atoms, and particularly preferably 2 to 10 carbon atoms, and examples thereof include an acetylamino group and a benzoylamino group), alkoxycarbonylamino groups (preferably having 2 to 30 carbon atoms, more preferably 2 to 20 carbon atoms, and particularly preferably 2 to 12 carbon atoms, and examples thereof include a methoxycarbonylamino group), aryloxycarbonylamino groups (preferably having 7 to 30 carbon atoms, more preferably 7 to 20 carbon atoms, and particularly preferably 7 to 12 carbon atoms, and examples thereof include a phenyloxycarbonylamino group), sulfonylamino groups (preferably having 1 to 30 carbon atoms, more preferably 1 to 20 carbon atoms, and particularly preferably 1 to 12 carbon atoms, and examples thereof include a methanesulfonylamino group and a benzenesulfonylamino group), sulfamoyl groups (preferably having 0 to 30 carbon atoms, more preferably 0 to 20 carbon atoms, and particularly preferably 0 to 12 carbon atoms, and examples thereof include a sulfamoyl group, a methylsulfamoyl group, a dimethylsulfamoyl group, and a phenylsulfamoyl group), carbamoyl groups (preferably having 1 to 30 carbon atoms, more preferably 1 to 20 carbon atoms, and particularly preferably 1 to 12 carbon atoms, and examples thereof include a carbamoyl group, a methylcarbamoyl group, a diethylcarbamoyl group, and a phenylcarbamoyl group), alkylthio groups (preferably having 1 to 30 carbon atoms, more preferably 1 to 20 carbon atoms, and particularly preferably 1 to 12 carbon atoms, and examples thereof include a methylthio group and an ethylthio group), arylthio groups (preferably having 6 to 30 carbon atoms, more preferably 6 to 20 carbon atoms, and particularly preferably 6 to 12 carbon atoms, and examples thereof include a phenylthio group), heterocyclic thio groups (preferably having 1 to 30 carbon atoms, more preferably 1 to 20 carbon atoms, and particularly preferably 1 to 12 carbon atoms, and examples thereof include a pyridylthio group, a 2-benzimidazolylthio group, a 2-benzoxazolylthio group, and a 2-benzothiazolylthio group), sulfonyl groups (preferably having 1 to 30 carbon atoms, more preferably 1 to 20 carbon atoms, and particularly preferably 1 to 12 carbon atoms, and examples thereof include a mesyl group and a tosyl group), sulfinyl groups (preferably having 1 to 30 carbon atoms, more preferably 1 to 20 carbon atoms, and particularly preferably 1 to 12 carbon atoms, and examples thereof include a methanesulfinyl group and a benzenesulfinyl group), ureido groups (preferably having 1 to 30 carbon atoms, more preferably 1 to 20 carbon atoms, and particularly preferably 1 to 12 carbon atoms, and examples thereof include a ureido group, a methylureido group, and a phenylureido group), phosphoric amide groups (preferably having 1 to 30 carbon atoms, more preferably 1 to 20 carbon atoms, and particularly preferably 1 to 12 carbon atoms, and examples thereof include a diethylphosphoric amide group and a phenylphosphoric amide group), a hydroxy group, a mercapto group, halogen atoms (such as fluorine, chlorine, bromine, or iodine), a cyano group, a sulfo group, a carboxyl group, a nitro group, a hydroxamic acid group, a sulfino group, a hydrazino group, an imino group, a heterocyclic group (preferably having 1 to 30 carbon atoms and more preferably 1 to 12 carbon atoms; the heteroatom(s) may be selected, for example, from nitrogen, oxygen, and sulfur atoms), and examples thereof include an imidazolyl group, a pyridyl group, a quinolyl group, a furyl group, a thienyl group, a piperidyl group, a morpholino group, a benzoxazolyl group, a benzimidazolyl group, a benzothiazolyl group, a carbazolyl group, and an azepinyl group), silyl groups (preferably having 3 to 40 carbon atoms, more preferably 3 to 30 carbon atoms, and particularly preferably 3 to 24 carbon atoms, and examples thereof include a trimethylsilyl group and a triphenylsilyl group), and silyloxy groups (preferably having 3 to 40 carbon atoms, more preferably 3 to 30 carbon atoms, and particularly preferably 3 to 24 carbon atoms, and examples thereof include a trimethylsilyloxy group and a triphenylsilyloxy group). These substituents may have a substitutent(s).

In a preferable embodiment, $R^{21}$, $R^{22}$, $R^{23}$, and $R^{24}$ are each independently selected from alkyl groups or aryl groups. In another preferable embodiment, $R^{21}$ and $R^{22}$ are groups that bind to each other to form a ring structure (e.g., a benzo-condensed ring or a pyridine-condensed ring), and/or $R^{23}$ and $R^{24}$ are groups that bind to each other to form a ring structure (e.g., a benzo-condensed ring or a pyridine-condensed ring). In a more preferable embodiment, $R^{21}$ and $R^{22}$ are groups that bind to each other to form a ring structure (e.g., a benzo-condensed ring or a pyridine-condensed ring), and/or $R^{23}$ and $R^{24}$ are groups that bind to each other to form a ring structure or ring structures (e.g., a benzo-condensed ring or a pyridine-condensed ring).

The definition of $L^{25}$ is the same as that of $L^{15}$ in Formula (I), and their preferable ranges are also the same.

The definition of $n^{21}$ is the same as that of $n^{11}$ in Formula (I), and their preferable ranges are also the same.

In Formula (1), examples of preferable embodiments are described below:

(1) the rings formed by $Q^{21}$ and $Q^{22}$ are pyridine rings, and $Y^{21}$ is a connecting group;

(2) the rings formed by $Q^{21}$ and $Q^{22}$ are pyridine rings, $Y^{21}$ is a single or double bond, and $X^{21}$ and $X^{22}$ are each selected from sulfur atoms, substituted nitrogen atoms, and unsubstituted nitrogen atom;

(3) the rings formed by $Q^{21}$ and $Q^{22}$ are each a five-membered nitrogen-containing heterocycle, or a nitrogen-containing six-membered ring containing two or more nitrogen atoms.

Preferable examples of compounds represented by Formula (1) are compounds represented by the following Formula (1-A).

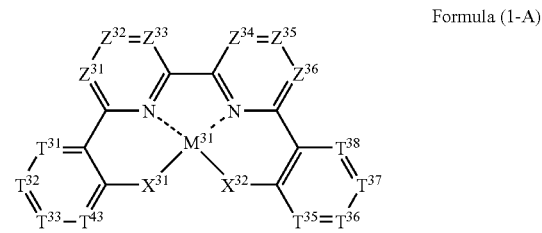

Formula (1-A)

The compound represented by Formula (1-A) will be described below.

In Formula (1-A), the definition of $M^{31}$ is the same as that of $M^{11}$ in Formula (I), and their preferable ranges are also the same.

$Z^{31}$, $Z^{32}$, $Z^{33}$, $Z^{34}$, $Z^{35}$, and $Z^{36}$ each independently represent a substituted or unsubstituted carbon or nitrogen atom, and preferably a substituted or unsubstituted carbon atom. The substituent on the carbon may be selected from the substituents described as examples of $R^{21}$ in Formula (1). $Z^{31}$ and $Z^{32}$ may be bonded to each other via a connecting group to form a condensed ring (e.g., a benzo-condensed ring or a pyridine-condensed ring). $Z^{32}$ and $Z^{33}$ may be bonded to each other via a connecting group to form a condensed ring (e.g., a benzo-condensed ring or a pyridine-condensed ring). $Z^{33}$ and $Z^{34}$ may be bonded to each other via a connecting group to form a condensed ring (e.g., a benzo-condensed ring or a pyridine-condensed ring). $Z^{34}$ and $Z^{35}$ may be bonded to each other via a connecting group to form a condensed ring (e.g., a benzo-condensed ring or a pyridine-condensed ring). $Z^{35}$ and $Z^{36}$ may be bonded to each other via a connecting group to form a condensed ring (e.g., a benzo-condensed ring or a pyridine-condensed ring). $Z^{31}$ and $T^{31}$ may be bonded to each other via a connecting group to form a condensed ring (e.g., a benzo-condensed ring or a pyridine-condensed ring). $Z^{36}$ and $T^{38}$ may be bonded to each other via a connecting group to form a condensed ring (e.g., a benzo-condensed ring or a pyridine-condensed ring).

The substituent on the carbon is preferably an alkyl group, an alkoxy group, an alkylamino group, an aryl group, a group capable of forming a condensed ring (e.g., a benzo-condensed ring or a pyridine-condensed ring), or a halogen atom, more preferably an alkylamino group, an aryl group, or a group capable of forming a condensed ring (e.g., a benzo-condensed ring or a pyridine-condensed ring), still more preferably an aryl group or a group capable of forming a condensed ring (e.g., a benzo-condensed ring or a pyridine-condensed ring), and particularly preferably a group capable of forming a condensed ring (e.g., a benzo-condensed ring or a pyridine-condensed ring).

$T^{31}$, $T^{32}$, $T^{33}$, $T^{34}$, $T^{35}$, $T^{36}$, $T^{37}$, and $T^{38}$ each independently represent a substituted or unsubstituted carbon or nitrogen atom, and more preferably a substituted or unsubstituted carbon atom. Examples of a substituent on the carbon atom include the groups described as examples of $R^{21}$ in formula (1); $T^{31}$ and $T^{32}$ may be bonded to each other via a connecting group to form a condensed ring (e.g., a benzo-condensed ring). $T^{32}$ and $T^{33}$ may be bonded to each other via a connecting group to form a condensed ring (e.g., a benzo-condensed ring). $T^{33}$ and $T^{34}$ may be bonded to each other via a connecting group to form a condensed ring (e.g., a benzo-condensed ring). $T^{35}$ and $T^{36}$ may be bonded to each other via a connecting group to form a condensed ring (e.g., a benzo-condensed ring). $T^{36}$ and $T^{37}$ may be bonded to each other via a connecting group to form a condensed ring (e.g., a benzo-condensed ring). $T^{37}$ and $T^{38}$ may be bonded to each other via a connecting group to form a condensed ring (e.g., a benzo-condensed ring).

The substituent on the carbon is preferably an alkyl group, an alkoxy group, an alkylamino group, an aryl group, a group capable of forming a condensed ring (e.g., a benzo-condensed ring or a pyridine-condensed ring), or a halogen atom; more preferably an aryl group, a group capable of forming a condensed ring (e.g., a benzo-condensed ring or pyridine-condensed ring), or a halogen atom; still more preferably an aryl group or a halogen atom, and particularly preferably an aryl group.

$X^{31}$ and $X^{32}$ are independently selected, and the definitions and preferable ranges of $X^{31}$ and $X^{32}$ are the same as the definitions and preferable ranges of $X^{21}$ and $X^{22}$, respectively, in Formula (1).

The compound represented by Formula (2) will be described below.

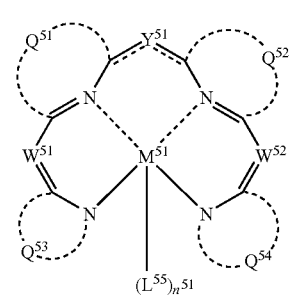

Formula (2)

In Formula (2), the definition of $M^{51}$ is the same as that of $M^{11}$ in Formula (I), and their preferable ranges are also the same.

$Q^{51}$ and $Q^{52}$ are independently selected, and the definitions of $Q^{51}$ and $Q^{52}$ are the same as the definitions of $Q^{21}$ and $Q^{22}$, respectively, in Formula (1), and their preferable ranges are also respectively the same.

$Q^{53}$ and $Q^{54}$ each independently represent a group forming a nitrogen-containing heterocycle (ring containing a nitrogen atom coordinating to $M^{51}$). The nitrogen-containing heterocycles formed by $Q^{53}$ and $Q^{54}$ are not particularly limited, and are preferably selected from tautomers of pyrrole derivatives (e.g., the five-membered heterocyclic ligand contained in the compound (24), the terminal five-membered heterocyclic ligand contained in the compound (64), and the five-membered heterocyclic ligand contained in the compound (145), all shown in JP-A No. 2007-103493), tautomers of imidazole derivatives (e.g., the five-membered heterocyclic ligand contained in the compound (29) shown in JP-A No. 2007-103493), tautomers of thiazole derivatives (e.g., the five-membered heterocyclic ligand contained in the compound (30) shown in JP-A No. 2007-103493), and tautomers of oxazole derivatives (e.g., the five-membered heterocyclic ligand contained in the compound (31) shown in JP-A No. 2007-103493), more preferably selected from tautomers of pyrrole, imidazole, and thiazole derivatives; still more preferably selected from tautomers of pyrrole and imidazole derivatives; and particularly preferably selected from tautomers of pyrrole derivatives.

The definition of $Y^{51}$ is the same as that of $Y^{11}$ in Formula (I), and their preferable range are also the same.

The definition of $L^{55}$ is the same as that of $L^{15}$ in Formula (I), and their preferable ranges are also the same.

The definition of $n^{51}$ is the same as that of $n^{11}$ mentioned above, and their preferable ranges are also the same.

$W^{51}$ and $W^{52}$ each independently represent a substituted or unsubstituted carbon or nitrogen atom, more preferably an unsubstituted carbon or nitrogen atom, and still more preferably an unsubstituted carbon atom.

The compound represented by Formula (3) will be described below.

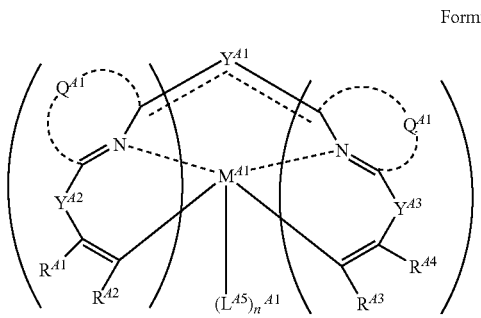

Formula (3)

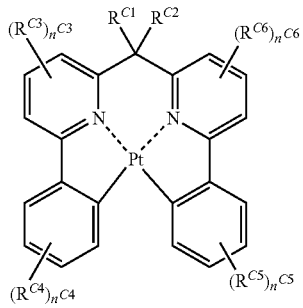

Formula (3-C)

In Formula (3), the definitions and preferable ranges of $M^{41}$, $Q^{41}$, $Q^{42}$, $Y^{41}$, $Y^{42}$, $Y^{43}$, $R^{41}$, $R^{42}$, $R^{43}$, $R^{44}$, $L^{45}$, and $n^{41}$ are the same as the definitions and preferable ranges of $M^{21}$, $Q^{21}$, $Q^{22}$, $Y^{21}$, $Y^{22}$, $Y^{23}$, $R^{21}$, $R^{22}$, $R^{23}$, $R^{24}$, $L^{25}$, and $n^{21}$, respectively, in Formula (1).

Preferable examples of compounds represented by Formula (3) are compounds represented by the following Formula (3-B).

The compound represented by Formula (3-B) will be described below.

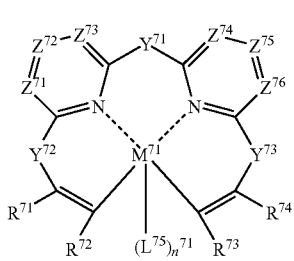

Formula (3-B)

In Formula (3-B), the definition of $M^{71}$ is the same as that of $M^{11}$ in Formula (I), and their preferable ranges are also the same.

The definitions and preferable ranges of $Y^{71}$, $Y^{72}$, and $Y^{73}$ are the same as the definitions and preferable ranges of $Y^{21}$, $Y^{22}$, and $Y^{23}$, respectively, in Formula (1).

The definition of $L^{75}$ is the same as that of $L^{15}$ in Formula (I), and their preferable ranges are also the same.

The definition of $n^{71}$ is the same as that of $n^{11}$ in Formula (I), and their preferable ranges are also the same.

$Z^{71}$, $Z^{72}$, $Z^{73}$, $Z^{74}$, $Z^{75}$, and $Z^{76}$ each independently represent a substituted or unsubstituted carbon or nitrogen atom, and more preferably a substituted or unsubstituted carbon atom. Examples of the substituent on the carbon include the groups described as examples of $R^{21}$ in Formula (1). In addition, $R^{71}$ and $R^{72}$ may be bonded to each other via a connecting group to form a ring (e.g., a benzene ring or a pyridine ring). $R^{73}$ and $R^{74}$ may be bonded to each other via a connecting group to form a ring (e.g., a benzene ring or a pyridine ring). The definitions and preferable ranges of $R^{71}$ to $R^{74}$ are the same as the definitions of $R^{21}$ to $R^{24}$, respectively, in Formula (1).

Preferable examples of compounds represented by Formula (3-B) include compounds represented by the following formula (3-C).

The compound represented by Formula (3-C) will be described below.

In Formula (3-C), $R^{C1}$ and $R^{C2}$ each independently represent a hydrogen atom or a substituent, and the substituents may be selected from the alkyl groups, aryl groups, and heterocyclic groups (these groups may be further substituted wherein the further substituent may be selected from those described above as examples of the substituent represented by $R^{21}$ in Formula (1), and halogen atoms. $R^{C3}$, $R^{C4}$, $R^{C5}$, and $R^{C6}$ each independently represent a hydrogen atom or a substituent, and the substituent may be selected from the substituents described as examples of $R^{21}$ to $R^{24}$ in Formula (1). Each of $n^{C3}$ and $n^{C6}$ represents an integer of 0 to 3; each of $n^{C4}$ and $n^{C5}$ represents an integer of 0 to 4; when there are plural $R^{C3}$s, $R^{C4}$s, $R^{C5}$s, or $R^{C6}$s, the plural $R^{C3}$s, $R^{C4}$s, $R^{C5}$s, or $R^{C6}$s may be the same as each other or different from each other, and may be bonded to each other via a connecting group to form a ring. $R^{C3}$, $R^{C4}$, $R^{C5}$, and $R^{C6}$ each preferably represent an alkyl group, an aryl group, a heteroaryl group, a cyano group, or a halogen atom.

The compound represented by Formula (4) will be described below.

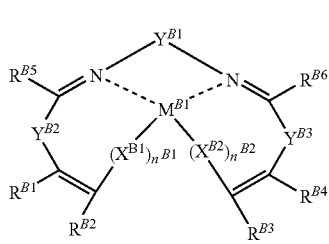

Formula (4)

In Formula (4), the definitions and preferable ranges of $M^{B1}$, $Y^{B2}$, $Y^{B3}$, $R^{B1}$, $R^{B2}$, $R^{B3}$, $R^{B4}$, $L^{B5}$, $n^{B3}$, $X^{B1}$, and $X^{B2}$ are the same as the definitions and preferable ranges of $M^{21}$, $Y^{22}$, $Y^{23}$, $R^{21}$, $R^{22}$, $R^{23}$, $R^{24}$, $L^{25}$, $n^{21}$, $X^{21}$ and $X^{22}$, respectively, in Formula (1).

$Y^{B1}$ represents a connecting group whose definition is the same as that of $Y^{21}$ in Formula (1). $Y^{B1}$ is preferably a vinyl group substituted at 1- and/or 2-position, a phenylene ring, a pyridine ring, a pyrazine ring, a pyrimidine ring, or an alkylene group having 2 to 8 carbons.

$R^{B5}$ and $R^{B6}$ each independently represent a hydrogen atom or a substituent, and the substituent may be selected from the alkyl groups, aryl groups, and heterocyclic groups described as examples of $R^{21}$ to $R^{24}$ in Formula (1). However, $Y^{B1}$ is not bonded to $R^{B5}$ or $R^{B6}$ $n^{B1}$ and $n^{B2}$ each independently represent an integer of 0 or 1.

Preferable examples of the compound represented by Formula (4) include compounds represented by the following Formula (4-A).

The compound represented by Formula (4-A) will be described below.

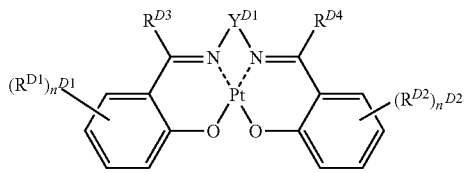

Formula (4-A)

In Formula (4-A), $R^{D3}$ and $R^{D4}$ each independently represent a hydrogen atom or a substituent, and $R^{D1}$ and $R^{D2}$ each represent a substituent. The substituents represented by $R^{D1}$, $R^{D2}$, $R^{D3}$, and $R^{D4}$ may be selected from the substituents described as examples of $R^{B5}$ and $R^{B6}$ in Formula (4), and have the same preferable range as $R^{B5}$ and $R^{B6}$ in Formula (4). $n^{D1}$ and $n^{D2}$ each represent an integer of 0 to 4. When there are plural $R^{D1}$s, the plural $R^{D1}$s may be the same as or different from each other or may be bonded to each other to form a ring. When there are plural $R^{D2}$s, the plural $R^{D2}$s may be the same as or different from each other or may be bonded to each other to form a ring. $Y^{D1}$ represents a vinyl group substituted at 1- and/or 2-position, a phenylene ring, a pyridine ring, a pyrazine ring, a pyrimidine ring, or an alkylene group having 1 to 8 carbon atoms.

The compound represented by Formula (5) will be described below.

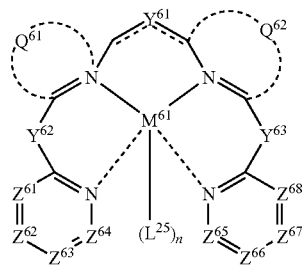

Formula (5)

In Formula (5), the definitions of $M^{61}$ is the same as that of $M^{11}$ in Formula (I), and their preferable ranges are also the same.

$Q^{61}$ and $Q^{62}$ each independently represent a ring-forming group. The rings formed by $Q^{61}$ and $Q^{62}$ are not particularly limited, and examples thereof include a benzene ring, a pyridine ring, a pyridazine ring, a pyrimidine ring, a thiophene ring, an isothiazole ring, a furan ring, an isoxazole ring, and condensed rings thereof.

Each of the rings formed by $Q^{61}$ and $Q^{62}$ is preferably a benzene ring, a pyridine ring, a thiophene ring, a thiazole ring, or a condensed ring containing one or more of the above rings; more preferably a benzene ring, a pyridine ring, or a condensed ring containing one or more of the above rings; and still more preferably a benzene ring or a condensed ring containing a benzene ring.

The definition of $Y^{61}$ is the same as that of $Y^{11}$ in Formula (I), and their preferable ranges are also the same.

$Y^{62}$ and $Y^{63}$ each independently represent a connecting group or a single bond. The connecting group is not particularly limited, and examples thereof include a carbonyl connecting group, a thiocarbonyl connecting group, alkylene groups, alkenylene groups, arylene groups, heteroarylene groups, an oxygen atom connecting group, a nitrogen atom connecting groups, and connecting groups comprising combinations of connecting groups selected from the above.

$Y^{62}$ and $Y^{63}$ are each independently selected, preferably from a single bond, a carbonyl connecting group, an alkylene connecting group, and an alkenylene group, more preferably from a single bond and an alkenylene group, and still more preferably from a single bond.

The definition of $L^{65}$ is the same as that of $L^{15}$ in Formula (I), and their preferable ranges are also the same.

The definition of $n^{61}$ is the same as the definition of $n^{11}$ in Formula (I), and their preferable ranges are also the same.

$Z^{61}$, $Z^{62}$, $Z^{63}$, $Z^{64}$, $Z^{65}$, $Z^{66}$, $Z^{67}$, and $Z^{68}$ each independently represent a substituted or unsubstituted carbon or nitrogen atom, and preferably a substituted or unsubstituted carbon atom. Examples of the substituent on the carbon include the groups described as examples of $R^{21}$ in Formula (1). $Z^{61}$ and $Z^{62}$ may be bonded to each other via a connecting group to form a condensed ring (e.g., a benzo-condensed ring or a pyridine-condensed ring) $Z^{62}$ and $Z^{63}$ may be bonded to each other via a connecting group to form a condensed ring (e.g., a benzo-condensed ring or a pyridine-condensed ring). $Z^{63}$ and $Z^{64}$ may be bonded to each other via a connecting group to form a condensed ring (e.g., a benzo-condensed ring or a pyridine-condensed ring). $Z^{65}$ and $Z^{66}$ may be bonded to each other via a connecting group to form a condensed ring (e.g., a benzo-condensed ring or a pyridine-condensed ring). $Z^{66}$ and $Z^{67}$ may be bonded to each other via a connecting group to form a condensed ring (e.g., a benzo-condensed ring or a pyridine-condensed ring). $Z^{67}$ and $Z^{68}$ may be bonded to each other via a connecting group to form a condensed ring (e.g., a benzo-condensed ring or a pyridine-condensed ring). The ring formed by $Q^{61}$ may be bonded to $Z^{61}$ via a connecting group to form a ring. The ring formed by $Q^{62}$ may be bonded to $Z^{68}$ via a connecting group to form a ring.

The substituent on the carbon is preferably an alkyl group, an alkoxy group, an alkylamino group, an aryl group, a group capable of forming a condensed ring (e.g., benzo-condensed ring or pyridine-condensed ring), or a halogen atom, more preferably an alkylamino group, an aryl group, or a group capable of forming a condensed ring (e.g., benzo-condensed ring or pyridine-condensed ring), still more preferably an aryl group or a group capable of forming a condensed ring (e.g., benzo-condensed ring or pyridine-condensed ring), and particularly preferably a group capable of forming a condensed ring (e.g., benzo-condensed ring or pyridine-condensed ring).

Preferable examples of the metal complex having a tridentate ligand according to the invention include compounds represented by the following Formula (II).

The compound represented by Formula (II) will be described below.

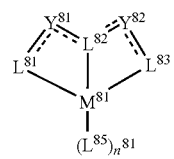

Formula (II)

In Formula (II), the definition of $M^{81}$ is the same as that of $M^{11}$ in Formula (I), and their preferable ranges are also the same.

$L^{81}$, $L^{82}$, and $L^{83}$ are independently selected, and the definitions and preferable ranges of $L^{81}$, $L^{82}$, and $L^{83}$ are the same as the definitions and preferable ranges of $L^{11}$, $L^{22}$, and $L^{13}$, respectively, in Formula (I).

$Y^{81}$ and $Y^{82}$ are independently selected, and the definitions and preferable ranges of $Y^{81}$ and $Y^{82}$ are the same as the definitions and preferable ranges of $Y^{12}$ and $Y^{13}$, respectively, in Formula (I).

$L^{85}$ represents a ligand coordinating to $M^{81}$. $L^{85}$ is preferably a mono- to tri-dentate ligand and more preferably a monodentate to tridentate anionic ligand. The mono- to tridentate anionic ligand is not particularly limited, but is preferably a halogen ligand or a tridentate ligand that $L^{81}$, $Y^{81}$, $L^{82}$, $Y^{82}$, and $L^{83}$ can form, and more preferably a tridentate ligand that $L^{81}$, $Y^{81}$, $L^{82}$, $Y^{82}$, and $L^{83}$ can form. $L^{85}$ is not directly bonded to $L^{81}$ or $L^{83}$. The numbers of coordination sites and ligands do not exceed the valency of the metal.

$n^{81}$ represents an integer of 0 to 5. When $M^{81}$ is a tetravalent metal, $n^{81}$ is 1, and $L^{85}$ represents a monodentate ligand. When $M^{81}$ is a hexavalent metal, $n^{81}$ is preferably from 1 to 3, more preferably 1 or 3, and still more preferably 1. When $M^{81}$ is hexavalent and $n^{81}$ is 1, $L^{85}$ represents a tridentate ligand. When $M^{81}$ is hexavalent and $n^{81}$ is 2, $L^{85}$ represents a monodentate ligand and a bidentate ligand. When $M^{81}$ is hexavalent and $n^{81}$ is 3, $L^{85}$ represents a monodentate ligand. When $M^{81}$ is an octavalent metal, $n^{81}$ is preferably from 1 to 5, more preferably 1 or 2, and still more preferably 1. When $M^{81}$ is octavalent and $n^{81}$ is 1, $L^{85}$ represents a pentadentate ligand. When $M^{81}$ is octavalent and $n^{81}$ is 2, $L^{85}$ represents a tridentate ligand and a bidentate ligand. When $M^{81}$ is octavalent and $n^{81}$ is 3, $L^{85}$ represents a tridentate ligand and two monodentate ligands, or represents two bidentate ligands and one monodentate ligand. When $M^{81}$ is octavalent and $n^{81}$ is 4, $L^{85}$ represents one bidentate ligand and three monodentate ligands. When $M^{81}$ is octavalent and $n^{81}$ is 5, $L^{85}$ represents five monodentate ligands. When $n^{81}$ is two or greater, there are plural $L^{85}$s, and the plural $L^{85}$s may be the same as or different from each other.

In a preferable example of the compound represented by Formula (II), $L^{81}$, $L^{82}$, or $L^{83}$ each represent an aromatic carbon ring containing a carbon atom coordinating to $M^{81}$, a heterocycle containing a carbon atom coordinating to $M^{81}$, or a nitrogen-containing heterocycle containing a nitrogen atom coordinating to $M^{81}$, wherein at least one of $L^{81}$, $L^{82}$, and $L^{83}$ is a nitrogen-containing heterocycle. Examples of the aromatic carbon ring containing a carbon atom coordinating to $M^{81}$, heterocycle containing a carbon atom coordinating to $M^{81}$, or nitrogen-containing heterocycle containing a nitrogen atom coordinating to $M^{81}$ include the examples of ligands (moieties) each containing a nitrogen or carbon atom coordinating to $M^{11}$ in Formula (I) described in the explanation of Formula (I). Preferable examples thereof are the same as in the description of ligands (moieties) each containing a nitrogen or carbon atom coordinating to $M^{11}$ in Formula (I). $Y^{81}$ and $Y^{82}$ each preferably represent a single bond or a methylene group.

Other preferable examples of compounds represented by Formula (II) include compounds represented by the following Formula (II-A) and compounds represented by the following Formula (II-B).

The compound represented by Formula (II-A) will be described below.

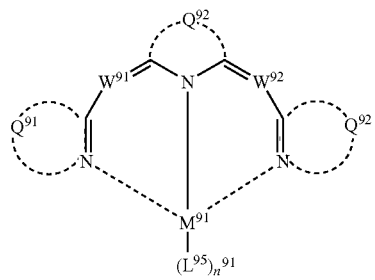

Formula (II-A)

In Formula (II-A), the definition of $M^{91}$ is the same as that of $M^{81}$ in Formula (II), and their preferable ranges are also the same.

$Q^{91}$ and $Q^{92}$ each represent a group forming a nitrogen-containing heterocycle (ring containing a nitrogen atom coordinating to $M^{91}$). The nitrogen-containing heterocycles formed by $Q^{91}$ and $Q^{92}$ are not particularly limited, and examples thereof include a pyridine ring, a pyrazine ring, a pyrimidine ring, a pyridazine ring, a triazine ring, a thiazole ring, an oxazole ring, a pyrrole ring, a pyrazole ring, a imidazole, a triazole ring, and condensed rings containing one or more of the above rings (e.g., a quinoline ring, a benzoxazole ring, a benzimidazole ring, and an indolenine ring), and tautomers thereof.

Each of the nitrogen-containing heterocycles formed by $Q^{91}$ and $Q^{92}$ is preferably a pyridine ring, a pyrazole ring, a thiazole ring, an imidazole ring, a pyrrole ring, a condensed ring containing one or more of the above ring (e.g., a quinoline ring, a benzothiazole ring, a benzimidazole ring, or an indolenine ring), or a tautomer of any of the above rings; more preferably a pyridine ring, a pyrrole ring, a condensed ring containing one or more of these rings (e.g., a quinoline ring), or a tautomer of any of the above rings; still more preferably a pyridine ring or a condensed ring containing a pyridine ring (e.g., a quinoline ring); and particularly preferably a pyridine ring.

$Q^{93}$ represents a group forming a nitrogen-containing heterocycle (ring containing a nitrogen atom coordinating to $M^{91}$). The nitrogen-containing heterocycle formed by $Q^{93}$ is not particularly limited, but is preferably a pyrrole ring, an imidazole ring, a tautomer of a triazole ring, or a condensed ring containing one or more of the above rings (e.g., benzopyrrole), and more preferably a tautomer of a pyrrole ring or a tautomer of a condensed ring containing a pyrrole ring (e.g., benzopyrrole).

$W^{91}$ and $W^{92}$ are independently selected, and the definitions and preferable ranges of $W^{91}$ and $W^{92}$ are the same as the definitions and preferable ranges of $W^{51}$ and $W^{52}$, respectively, in Formula (2).

The definition of $L^{95}$ is the same as that of $L^{85}$ in Formula (II), and their preferable ranges are also the same.

The definition of $n^{91}$ is the same as that of $n^{81}$ in Formula (II), and their preferable ranges are also the same.

The compound represented by Formula (II-B) will be described next.

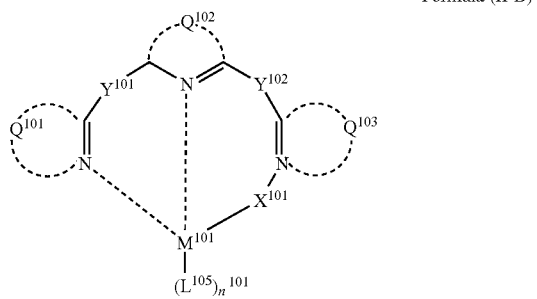

Formula (II-B)

In Formula (II-B), the definition of $M^{101}$ is the same as that of $M^{81}$ in Formula (II), and their preferable ranges are also the same.

The definition of $Q^{102}$ is the same as that of $Q^{21}$ in Formula (1), and their preferable ranges are also the same.

The definition of $Q^{101}$ is the same as that of $Q^{91}$ in Formula (II-A), and their preferable ranges are also the same.

$Q^{103}$ represents a group forming an aromatic ring. The aromatic ring formed by $Q^{103}$ is not particularly limited, but is preferably a benzene ring, a furan ring, a thiophene ring, a pyrrole ring, or a condensed ring containing one or more of the above rings (e.g., a naphthalene ring, a benzofuran ring, a benzothiophen ring, or an indole ring), more preferably a benzene ring or a condensed ring containing a benzene ring (e.g., naphthalene ring), and particularly preferably a benzene ring.

$Y^{101}$ and $Y^{102}$ are independently selected, and the definitions and preferable ranges of $Y^{101}$ and $Y^{102}$ are the same as the definition and preferable range of $Y^{22}$ in Formula (1).

The definition of $L^{105}$ is the same as that of $L^{85}$ in Formula (II), and their preferable ranges are also the same.

The definition of $n^{101}$ is the same as that of $n^{81}$ in Formula (II), and their preferable ranges are also the same.

The definition of $X^{101}$ is the same as that of $X^{21}$ in Formula (1), and their preferable ranges are also the same.

Another preferable embodiment of the metal complex containing a tridentate ligand according to the invention is a compound represented by Formula (II-C) shown below.

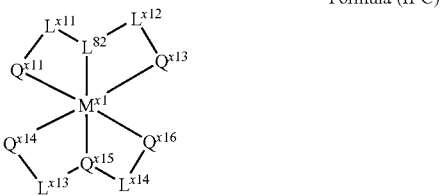

Formula (II-C)

In Formula (II-C), $M^{X1}$ represents a metal ion. $Q^{X11}$ to $Q^{X16}$ each independently represent an atom coordinating to $M^{X1}$ or an atomic group containing an atom coordinating to $M^{X1}$. $L^{X11}$ to $L^{X14}$ each independently represent a single bond, a double bond or a connecting group.

Namely, in Formula (II-C), the atomic group comprising $Q^{X11}$-$L^{X11}$-$Q^{X12}$-$L^{X12}$-$Q^{X13}$ and the atomic group comprising $Q^{X14}$-$L^{X13}$-$Q^{X15}$-$L^{X14}$-$Q^{X16}$ each form a trident ligand.

In addition, the bond between $M^{X1}$ and each of $Q^{X11}$ to $Q^{X16}$ may be any of a coordination bond, an ionic bond, or a covalent bond.

The compound represented by Formula (II-C) will be described in detail below.

In Formula (II-C), $M^{X1}$ represents a metal ion. The metal ion is not particularly limited, but is preferably a monovalent to trivalent metal ion, more preferably a divalent or trivalent metal ion, and still more preferably a trivalent metal ion. Specifically, a platinum ion, an iridium ion, a rhenium ion, a palladium ion, a rhodium ion, a ruthenium ion, a copper ion, a europium ion, a gadolinium ion, and a terbium ion are preferable. Among these, an iridium ion and a europium ion are more preferable, and an iridium ion is still more preferable.

$Q^{X11}$ to $Q^{X16}$ each represent an atom coordinating to $M^{X1}$ or an atomic group containing an atom coordinating to $M^{X1}$.

When any of $Q^{X11}$ to $Q^{X16}$ is an atom coordinating to $M^{X1}$, specific examples of the atom include a carbon atom, a nitrogen atom, an oxygen atom, a silicon atom, a phosphorus atom, and a sulfur atom. Preferable specific examples of the atom include a nitrogen atom, an oxygen atom, a sulfur atom, and a phosphorus atom. More preferable specific examples of the atom include a nitrogen atom and an oxygen atom.

When any of $Q^{X11}$ to $Q^{X16}$ is an atomic group containing a carbon atom coordinating to $M^{X1}$, examples of the atomic group coordinating to $M^{X1}$ via a carbon atom include imino groups, aromatic hydrocarbon ring groups (such as a benzene ring group or a naphthalene ring group), heterocyclic groups (such as a thiophene group, a pyridine group, a pyrazine group, a pyrimidine group, a pyridazine group, a triazine group, a thiazole group, an oxazole group, a pyrrole group, an imidazole group, a pyrazole group, or a triazole group), condensed rings containing one or more of the above rings, and tautomers thereof.

When any of $Q^{X11}$ to $Q^{X16}$ is an atomic group containing a nitrogen atom coordinating to $M^{X1}$, examples of the atomic group coordinating to $M^{X1}$ via a nitrogen atom include nitrogen-containing heterocyclic groups, amino groups, and imino groups. Examples of the nitrogen-containing heterocyclic groups include a pyridine, pyrazine, pyrimidine, pyridazine, triazine, thiazole, oxazole, pyrrole, imidazole, pyrazole, or triazole group. Examples of the amino groups include alkylamino groups [preferably having 2 to 30 carbon atoms, more preferably 2 to 20 carbon atoms, and particularly preferably 2 to 10 carbon atoms, and examples thereof include a methylamino group), arylamino groups (e.g., a phenylamino group)], acylamino groups (preferably having 2 to 30 carbon atoms, more preferably 2 to 20 carbon atoms, and particularly preferably 2 to 10 carbon atoms, and examples thereof include an acetylamino group and a benzoylamino group), alkoxycarbonylamino groups (preferably having 2 to 30 carbon atoms, more preferably 2 to 20 carbon atoms, and particularly preferably 2 to 12 carbon atoms, and examples thereof include a methoxycarbonylamino group), aryloxycarbonylamino groups (preferably having 7 to 30 carbon atoms, more preferably 7 to 20 carbon atoms, and particularly preferably 7 to 12 carbon atoms, and examples thereof include a phenyloxycarbonylamino group), and sulfonylamino groups (preferably having 1 to 30 carbon atoms, more preferably 1 to 20 carbon atoms, and particularly preferably 1 to 12 carbon atoms, and examples thereof include a methanesulfonylamino group and a benzenesulfonylamino group). These groups may have substitutents.

When any of $Q^{X11}$ to $Q^{X16}$ is an atomic group containing an oxygen atom coordinating to $M^{X1}$, examples of the atomic groups coordinating to $M^{X1}$ via an oxygen atom include alkoxy groups (preferably having 1 to 30 carbon atoms, more preferably 1 to 20 carbon atoms, and particularly preferably 1 to 10 carbon atoms, and examples thereof include a methoxy group, an ethoxy group, a butoxy group, and a 2-ethylhexyloxy group), aryloxy groups (preferably having 6 to 30 carbon atoms, more preferably 6 to 20 carbon atoms, and particularly preferably 6 to 12 carbon atoms, and examples thereof include a phenyloxy group, a 1-naphthyloxygroup, and a 2-naphthyloxy group), heterocyclic oxy groups (preferably having 1 to 30 carbon atoms, more preferably 1 to 20 carbon atoms, and particularly preferably 1 to 12 carbon atoms, and examples thereof include a pyridyloxy group, a pyrazyloxy group, a pyrimidyloxy group, and a quinolyloxy group), acyloxy groups (preferably having 2 to 30 carbon atoms, more preferably 2 to 20 carbon atoms, and particularly preferably 2 to 10 carbon atoms, and examples thereof include an acetoxy group and a benzoyloxy group), silyloxy groups (preferably having 3 to 40 carbon atoms, more preferably 3 to 30 carbon atoms, and particularly preferably 3 to 24 carbon atoms, and examples thereof include a trimethylsilyloxy group and a triphenylsilyloxy group), carbonyl groups (e.g., ketone groups, ester groups, and amido groups), and ether groups (e.g., dialkylether groups, diarylether groups, and furyl groups).

When any of $Q^{X11}$ to $Q^{X16}$ is an atomic group containing a silicon atom coordinating to $M^{X1}$, examples of the atomic group coordinating to $M^{X1}$ via a silicon atom include alkylsilyl groups (preferably having 3 to 30 carbon atoms, and examples thereof include a trimethylsilyl group), and arylsilyl groups (preferably, having 18 to 30 carbon atoms, and examples thereof include a triphenylsilyl group). These groups may have substituents.

When any of $Q^{X11}$ to $Q^{X16}$ is an atomic group containing a sulfur atom coordinating to $M^{X1}$, examples of the atomic group coordinating to $M^{X1}$ via a sulfur atom include alkylthio groups (preferably having 1 to 30 carbon atoms, more preferably 1 to 20 carbon atoms, and particularly preferably 1 to 12 carbon atoms, and examples thereof include a methylthio group and an ethylthio group), arylthio groups (preferably having 6 to 30 carbon atoms, more preferably 6 to 20 carbon atoms, and particularly preferably 6 to 12 carbon atoms, and examples thereof include a phenylthio group), heterocyclic thio groups (preferably having 1 to 30 carbon atoms, more preferably 1 to 20 carbon atoms, and particularly preferably 1 to 12 carbon atoms, and examples thereof include a pyridylthio group, a 2-benzimidazolylthio group, a 2-benzoxazolylthio group, and a 2-benzothiazolylthio group), thiocarbonyl groups (e.g., a thioketone group and a thioester group), and thioether groups (e.g., a dialkylthioether group, a diarylthioether group, and a thiofuryl group).

When any of $Q^{X11}$ to $Q^{X16}$ is an atomic group containing a phosphorus atom coordinating to $M^{X1}$, examples of the atomic group coordinating to $M^{X1}$ via a phosphorus atom include dialkylphosphino groups, diarylphosphino groups, trialkyl phosphine groups, triaryl phosphine groups, and phosphinine groups. These groups may have substituents.

The atomic groups represented by $Q^{X11}$ to $Q^{X16}$ are each preferably an aromatic hydrocarbon ring group containing a carbon atom coordinating to $M^{X1}$, an aromatic heterocyclic group containing a carbon atom coordinating to $M^{X1}$, a nitrogen-containing aromatic heterocyclic group containing a nitrogen atom coordinating to $M^{X1}$, an alkyloxy group, an aryloxy group, an alkylthio group, an arylthio group, or an dialkylphosphino group, and more preferably an aromatic hydrocarbon ring group containing a carbon atom coordinating to $M^{X1}$, an aromatic heterocyclic group containing a carbon atom coordinating to $M^{X1}$, or a nitrogen-containing aromatic heterocyclic group containing a nitrogen atom coordinating to $M^{X1}$.

The bond between $M^{X1}$ and each of $Q^{X11}$ to $Q^{X16}$ may be any of a coordination bond, an ionic bond, or a covalent bond.

In Formula (II-C), $L^{X11}$ to $L^{X14}$ each represent a single or double bond or a connecting group. The connecting group is not particularly limited, but preferably a connecting group containing one or more atoms selected from carbon, nitrogen, oxygen, sulfur, and silicon. Examples of the connecting group include, but are not limited to, those shown below.

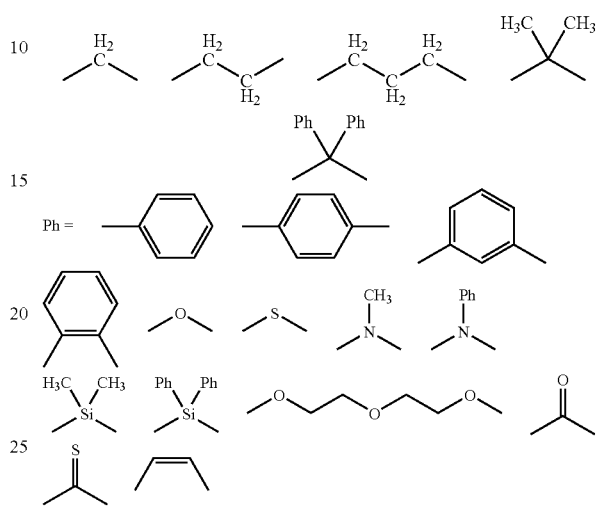

These connecting groups may have substituents, and the substituents may be selected from the examples of the substituents represented by $R^{21}$ to $R^{24}$ in Formula (2), and preferable range thereof may be also the same as that of the substituents represented by $R^{21}$ to $R^{24}$ in Formula (2). $L^{X11}$ to $L^{X14}$ are each preferably a single bond, a dimethylmethylene group, or a dimethylsilylene group.

Among compounds represented by Formula (II-C), compounds represented by the following Formula (X2) are more preferable, and compounds represented by the following Formula (X3) are still more preferable.

The compound represented by Formula (X2) is described first.

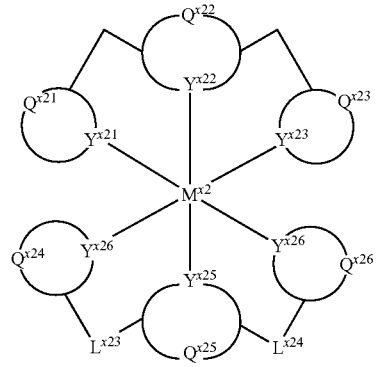

Formula (X-2)

In Formula (X2), $M^{X2}$ represents a metal ion. $Y^{X21}$ to $Y^{X26}$ each represent an atom coordinating to $M^{X2}$; and $Q^{X21}$ to $Q^{X26}$ each represent an atomic group forming an aromatic ring or aromatic heterocycle respectively with $Y^{X21}$ to $Y^{X26}$. $L^{X21}$ to $L^{X24}$ each represent a single or double bond or a connecting group. The bond between $M^{X2}$ and each of $Y^{X21}$ to $Y^{X26}$ may be a coordination bond or a covalent bond.

The compound represented by Formula (X2) will be described below in detail.

In Formula (X2), the definition of $M^{X2}$ is the same as that of $M^{X1}$ in Formula (II-C), and their preferable ranges are also the same. $Y^{X21}$ to $Y^{X26}$ each represent an atom coordinating to $M^{X2}$. The bond between $M^{X2}$ each of $Y^{X21}$ to $Y^{X26}$ may be any of a coordination bond, an ionic bond, or a covalent bond. Each of $Y^{X21}$ to $Y^{X26}$ is a carbon atom, a nitrogen atom, an oxygen atom, a sulfur atom, a phosphorus atom, or a silicon atom, and preferably a carbon atom or a nitrogen atom. $Q^{X21}$ to $Q^{X26}$ represent atomic groups forming rings containing $Y^{X21}$ to $Y^{X26}$, respectively, and the rings are each independently selected from aromatic hydrocarbon rings and aromatic heterocycles. The aromatic hydrocarbon rings and aromatic heterocycles may be selected from a benzene ring, a pyridine ring, a pyrazine ring, a pyrimidine ring, a pyridazine ring, a triazine ring, a pyrrole ring, a pyrazole ring, an imidazole ring, a triazole ring, an oxazole ring, a thiazole ring, an oxadiazole ring, a thiadiazole ring, a thiophene ring, and a furan ring; preferably selected from a benzene ring, a pyridine ring, a pyrazine ring, a pyrimidine ring, a pyrazole ring, an imidazole ring, and a triazole ring; more preferably selected from a benzene ring, a pyridine ring, a pyrazine ring, a pyrazole ring, and a triazole ring; and particularly preferably selected from a benzene ring and a pyridine ring. The aromatic rings may have a condensed ring and/or a substituent.

The definitions and preferable ranges of $L^{X21}$ to $L^{X24}$ are the same as the definitions and preferable ranges of $L^{X11}$ to $L^{X14}$, respectively, in Formula (II-C).

Compounds represented by the following Formula (X3) are more preferable examples of the compounds represented by Formula (II-C).

The compound represented by Formula (X3) will be described below.

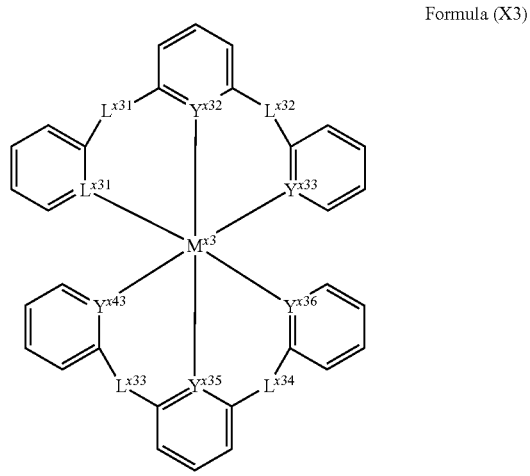

Formula (X3)

In Formula (X3), $M^{X3}$ represents a metal ion. $Y^{X31}$ to $Y^{X36}$ each represent a carbon atom, a nitrogen atom, or a phosphorus atom. $L^{X31}$ to $L^{X34}$ each represent a single bond, a double bond or a connecting group. The bond between $M^{X3}$ and each of $Y^{X31}$ to $Y^{X36}$ may be any of a coordination bond, an ionic bond, or a covalent bond.

The definition of $M^{X3}$ is the same as that of $M^{X1}$ in Formula (II-C) above, and their preferable ranges are also the same. $Y^{X31}$ to $Y^{X36}$ each represent an atom coordinating to $M^{X3}$. $Y^{X31}$ to $Y^{X36}$ each represent a carbon atom, a nitrogen atom, or a phosphorus atom, and preferably a carbon atom or a nitrogen atom. The definitions and preferable ranges of $L^{X31}$ to $L^{X34}$ are the same as the definitions and preferable ranges of $L^{X11}$ to $L^{X14}$ in Formula (II-C), respectively.

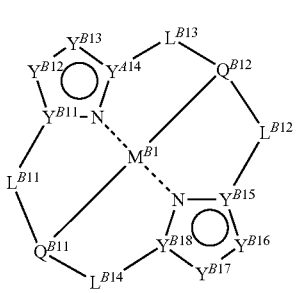

Formula (B-1)

Specific examples of compounds represented by the Formula (I) and compounds represented by Formula (II) include, but are not limited to, the compounds (1) to (247) described in JP-A No. 2007-103493.

Among compounds typified by the above-mentioned compound examples, other compounds than compounds having a ligand selected from quadridentate ligands containing bipyridyl or phenanthroline as a partial structure thereof, Schiff base type quadridentate ligands, phenylbipyridyl tridentate ligands, diphenylpyridine tridentate ligands, and terpyridine tridentate ligands, are preferable.

(Method for Synthesizing Metal Complex in the Invention)

Metal complexes in the invention [compounds represented by Formulae (I), (1), (1-A), (2), (3), (3-B), (3-C), (4), (4-A), (5), (II), (II-A), (II-B), (II-C), (X2), and (X3)] can be synthesized by various techniques.

For example, a metal complex can be obtained by a reaction of a ligand (or its dissociated body) and a metal compound in the presence or absence of a solvent (for example, a halogenated solvent, an alcohol solvent, an ether solvent, an ester solvent, a ketone solvent, a nitrile solvent, an amide solvent, a sulfonic solvents, a sulfoxide solvent, or water) in the presence or absence of a base (which may be selected from various inorganic or organic bases, e.g., sodium methoxide, t-butoxy potassium, triethylamine, or potassium carbonate) at room temperature or lower, or under heating (beside the usual heating technique, the technique of heating with a microwave is also effective).

When a metal complex according to the invention is synthesized, the reaction time varies depending on the activity of the reaction starting materials, and thus is not particularly limited. The reaction time is preferably from one minute to five days, more preferably from five minutes to three days, and still more preferably from ten minutes to one day.

The reaction temperature at synthesis of a metal complex in the invention varies depending on the activity of the reaction, and thus is not particularly limited. The reaction temperature is preferably from 0° C. to 300° C., more preferably from 5° C. to 250° C., and more preferably from 10° C. to 200° C.

Compounds represented by above Formulae (I), (1), (1-A), (2), (3), (3-B), (3-C), (4), (4-A), (5), (II), (II-A), (II-B), (II-C), (X2), and (X3) can be synthesized by appropriately selecting the ligands as partial structures of the desired complex.

For example, the compound represented by the formula (1-A) can be synthesized by adding 6,6'-bis(2-hydroxyphenyl)-2,2'-bipyridyl ligand, its derivative (for example, a 2,9-bis(2-hydroxyphenyl)-1,10-phenanthroline ligand, a 2,9-bis(2-hydroxyphenyl)-4,7-diphenyl-1,10-phenanthroline ligand, or a 6,6'-bis(2-hydroxy-5-tert-butylphenyl)-2,2'-bipyridyl ligand), or the like in an amount of preferably 0.1 to 10 equivalent, more preferably 0.3 to 6 equivalent, and still more preferably 0.5 to 4 equivalent relative to the metal compound. In the method for synthesizing the compound represented by the formula (1-A), the reaction solvent, the reaction time, and the reaction temperature are each the same as described above in the method for synthesizing the metal complex according to the invention.

Derivatives of 6,6'-bis(2-hydroxyphenyl)-2,2'-bipyridyl ligand can be synthesized by using various known methods.

For example, such a derivative can be synthesized by reacting a 2,2'-bipyridyl derivative (for example, 1,10-phenanthroline) and an anisole derivative (for example, 4-fluoroanisole) by the method described in Journal of Organic Chemistry, 741, 11, (1946). Synthesis can be conducted also by deprotecting a methyl group (by the method described in Journal of Organic Chemistry, 741, 11, (1946), or, for example, by the method of heating in pyridine hydrochloride) after Suzuki coupling reaction using a halogenated 2,2'-bipyridyl derivative (for example, 2,9-dibromo-1,10-phenanthroline) and a 2-methoxy phenylboronate derivative (for example, 2-methoxy-5-fluorophenylboronic acid) or the like as starting materials is carried out. As another alternative, synthesis can be carried out by deprotecting a methyl group (by the method described in Journal of Organic Chemistry, 741, 11, (1946), or, for example, by the method of heating in pyridine hydrochloride) after Suzuki coupling reaction using a 2,2'-bipyridyl boronic acid derivative (for example, 6,6'-bis(4,4,5,5-tetramethyl-1,3,2-dioxabororyl)-2,2'-bipyridyl) and a halogenated anisole derivative (for example, 2-bromo anisole) as starting materials.

In the following, the compounds represented by the following formula (III) will be described.

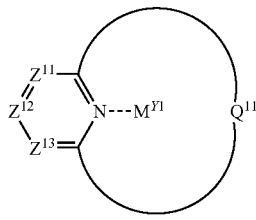

Formula (III)

In Formula (III), $Q^{11}$ represents an atomic group forming a nitrogen-containing heterocycle; $Z^{11}$, $Z^{12}$, and $Z^{13}$ each represent a substituted or unsubstituted carbon or nitrogen atom; and $M^{Y1}$ represents a metal ion that may further have a ligand.

In Formula (III), $Q^{11}$ represents an atomic group forming a nitrogen-containing heterocycle that contains the two carbon atoms bonded to $Q^{11}$ and the nitrogen atom directly bonded to the two carbon atoms. The number of atoms constituting the nitrogen-containing heterocycle formed by $Q^{11}$ is not particularly limited. The cycle of the nitrogen-containing heterocycle contains preferably from 12 to 20 atoms, more preferably from 14 to 16 atoms, and more preferably 16 atoms.

$Z^{11}$, $Z^{12}$, and $Z^{13}$ each independently represent a substituted or unsubstituted carbon or nitrogen atom. As for the combination of $Z^{11}$, $Z^{12}$, and $Z^{13}$, at least one of $Z^{11}$, $Z^{12}$, and $Z^{13}$ is preferably nitrogen.

Examples of the substituent on the carbon atom include alkyl groups (preferably having 1 to 30 carbon atoms, more preferably 1 to 20 carbon atoms, and particularly preferably 1 to 10 carbon atoms, such as methyl, ethyl, iso-propyl, tert-butyl, n-octyl, n-decyl, n-hexadecyl, cyclopropyl, cyclopentyl, and cyclohexyl), alkenyl groups (preferably having 2 to 30 carbon atoms, more preferably 2 to 20 carbon atoms, and particularly preferably 2 to 10 carbon atoms, such as vinyl, allyl, 2-butenyl, and 3-pentenyl), alkynyl groups (preferably having 2 to 30 carbon atoms, more preferably 2 to 20 carbon atoms, and particularly preferably 2 to 10 carbon atoms, such as propargyl and 3-pentynyl), aryl groups (preferably having 6 to 30 carbon atoms, more preferably 6 to 20 carbon atoms, and particularly preferably 6 to 12 carbon atoms, such as phenyl, p-methylphenyl, naphthyl, and anthranyl), amino groups (preferably having 0 to 30 carbon atoms, more preferably 0 to 20 carbon atoms, and particularly preferably 0 to 10 carbon atoms, such as amino, methylamino, dimethylamino, diethylamino, dibenzylamino, diphenylamino, and ditolylamino), alkoxy groups (preferably having 1 to 30 carbon atoms, more preferably 1 to 20 carbon atoms, and particularly preferably 1 to 10 carbon atoms, such as methoxy, ethoxy, butoxy, and 2-ethylhexyloxy), aryloxy groups (preferably having 6 to 30 carbon atoms, more preferably 6 to 20 carbon atoms, and particularly preferably 6 to 12 carbon atoms, such as phenyloxy, 1-naphthyloxy, and 2-naphthyloxy), heterocyclic oxy groups (preferably having 1 to 30 carbon atoms, more preferably 1 to 20 carbon atoms, and particularly preferably 1 to 12 carbon atoms, such as pyridyloxy, pyrazyloxy, pyrimidyloxy, and quinolyloxy), acyl groups (preferably having 1 to 30 carbon atoms, more preferably 1 to 20 carbon atoms, and particularly preferably 1 to 12 carbon atoms, such as acetyl, benzoyl, formyl, and pivaloyl), alkoxycarbonyl groups (preferably having 2 to 30 carbon atoms, more preferably 2 to 20 carbon atoms, and particularly preferably 2 to 12 carbon atoms, such as methoxycarbonyl and ethoxycarbonyl), aryloxycarbonyl groups (preferably having 7 to 30 carbon atoms, more preferably 7 to 20 carbon atoms, and particularly preferably 7 to 12 carbon atoms, such as phenyloxycarbonyl), acyloxy groups (preferably having 2 to 30 carbon atoms, more preferably 2 to 20 carbon atoms, and particularly preferably 2 to 10 carbon atoms, such as acetoxy and benzoyloxy), acylamino groups (preferably having 2 to 30 carbon atoms, more preferably 2 to 20 carbon atoms, and particularly preferably 2 to 10 carbon atoms, such as acetylamino and benzoylamino)

alkoxycarbonylamino groups (preferably having 2 to 30 carbon atoms, more preferably 2 to 20 carbon atoms, and particularly preferably 2 to 12 carbon atoms, such as methoxycarbonylamino), aryloxycarbonylamino groups (preferably having 7 to 30 carbon atoms, more preferably 7 to 20 carbon atoms, and particularly preferably 7 to 12 carbon atoms, such as phenyloxycarbonylamino), sulfonylamino groups (preferably having 1 to 30 carbon atoms, more preferably 1 to 20 carbon atoms, and particularly preferably 1 to 12 carbon atoms, such as methanesulfonylamino and benzene sulfonylamino), sulfamoyl groups (preferably having 0 to 30 carbon atoms, more preferably 0 to 20 carbon atoms, and particularly preferably 0 to 12 carbon atoms, such as sulfamoyl, methylsulfamoyl, dimethylsulfamoyl, and phenylsulfamoyl), carbamoyl groups (preferably having 1 to 30 carbon atoms, more preferably 1 to 20 carbon atoms, and particularly preferably 1 to 12 carbon atoms, such as carbamoyl, methylcarbamoyl, diethylcarbamoyl, and phenylcarbamoyl), alkylthio groups (preferably having 1 to 30 carbon atoms, more preferably 1 to 20 carbon atoms, and particularly preferably 1 to 12 carbon atoms, such as methylthio and ethylthio), arylthio groups (preferably having 6 to 30 carbon atoms, more preferably 6 to 20 carbon atoms, and particularly preferably 6 to 12 carbon atoms, such as phenylthio), heterocyclic thio groups (preferably having 1 to 30 carbon atoms, more preferably 1 to 20 carbon atoms, and particularly preferably 1 to 12 carbon atoms, such as pyridylthio, 2-benzimidazolylthio, 2-benzoxazolylthio, and 2-benzothiazolylthio), sulfonyl groups (preferably having 1 to 30 carbon atoms, more preferably 1 to 20 carbon atoms, and particularly preferably 1 to 12 carbon atoms, and examples thereof include a mesyl group and a tosyl group), sulfinyl groups (preferably having 1 to 30 carbon atoms, more preferably 1 to 20 carbon atoms, and particularly preferably 1 to 12 carbon atoms, and examples thereof include a methanesulfinyl group and a benzenesulfinyl group), ureido groups (preferably having 1 to 30 carbon atoms, more preferably 1 to 20 carbon atoms, and particularly preferably 1 to 12 carbon atoms, and examples thereof include a ureido group, a methylureido group, and a phenylureido group), phosphoric amide groups (preferably having 1 to 30 carbon atoms, more preferably 1 to 20 carbon atoms, and particularly preferably 1 to 12 carbon atoms, and examples thereof include a diethylphosphoric amide group and a phenylphosphoric amide group), a hydroxy group, a mercapto group, halogen atoms (e.g., fluorine, chlorine, bromine, and iodine), a cyano group, a sulfo group, a carboxyl group, a nitro group, a hydroxamic acid group, sulfino groups, hydrazino groups, imino groups, heterocyclic groups (preferably having 1 to 30 carbon atoms, and particularly preferably 1 to 12 carbon atoms; the heteroatom(s) may be selected from nitrogen, oxygen and sulfur atoms; examples of the heterocyclic groups include imidazolyl, pyridyl, quinolyl, furyl, thienyl, piperidyl, morpholino, benzoxazolyl, benzimidazolyl, benzothiazolyl, carbazolyl, and azepinyl), silyl groups (preferably having 3 to 40 carbon atoms, more preferably 3 to 30 carbon atoms, and particularly preferably 3 to 24 carbon atoms, and examples thereof include a trimethylsilyl group and a triphenylsilyl group), silyloxy groups (preferably having 3 to 40 carbon atoms, more preferably 3 to 30 carbon atoms, and particularly preferably 3 to 24 carbon atoms, and examples thereof include a trimethylsilyloxy group and a triphenylsilyloxy group), and the like. These substituents may themselves have substituents.

Among these substituents, the substituent on the carbon atom is preferably an alkyl group, an aryl, a heterocyclic group or a halogen atom, more preferably an aryl group or a halogen atom, and still more preferably a phenyl group or a fluorine atom.

The substituent on the nitrogen atom may be selected from the substituents described as examples of the substituent on the carbon atom, and have the same preferable range as in the case of the substituent on the carbon atom.

In Formula (III), $M^{Y1}$ represents a metal ion that may have an additional ligand. $M^{Y1}$ preferably represents a metal ion having no additional ligand.

The metal ion represented by $M^{Y1}$ is not particularly limited. It is preferably a divalent or trivalent metal ion. The divalent or trivalent metal ion is preferably a cobalt ion, a magnesium ion, a zinc ion, a palladium ion, a nickel ion, a copper ion, a platinum ion, a lead ion, an aluminum ion, an iridium ion, or a europium ion, more preferably a cobalt ion, a magnesium ion, a zinc ion, a palladium ion, a nickel ion, a copper ion, a platinum ion, or a lead ion, still more preferably a copper ion or a platinum ion, and particularly preferably a platinum ion. $M^{Y1}$ may or may not be bound to an atom contained in $Q^{11}$, and is preferably bound to an atom contained in $Q^{11}$.

The additional ligand that $M^{Y1}$ may have is not particularly limited, but is preferably a monodentate or bidentate ligand, and more preferably a bidentate ligand. The coordinating atom is not particularly limited, but preferably an oxygen atom, a sulfur atom, a nitrogen atom, a carbon atom, or a phosphorus atom, more preferably an oxygen atom, a nitrogen atom, or a carbon atom, and still more preferably an oxygen atom or a nitrogen atom.

Preferable examples of compounds represented by Formula (III) include compounds represented by the following Formulae (a) to (j) and tautomers thereof.

Compounds represented by Formula (III) are more preferably selected from compounds represented by Formula (a) or (b) and tautomers thereof, and still more preferably selected from compounds represented by Formula (b) and tautomers thereof.

Compounds represented by Formula (c) or (g) are also preferable as the compounds represented by Formula (III).

The compound represented by Formula (c) is preferably a compound represented by Formula (d), a tautomer of a compound represented by Formula (d), a compound represented by Formula (e), a tautomer of a compound represented by Formula (e), a compound represented by Formula (f) or a tautomer of a compound represented by Formula (f); more preferably a compound represented by Formula (d), a tautomer of a compound represented by Formula (d), a compound represented by Formula (e), or a tautomer of a compound represented by Formula (e); and still more preferably a compound represented by Formula (d) or a tautomer of a compound represented by Formula (d).

The compound represented by Formula (g) is preferably a compound represented by Formula (h), a tautomer of a compound represented by Formula (h), a compound represented by Formula (i), a tautomer of a compound represented by Formula (i), a compounds represented by Formula (j) or a tautomer of a compound represented by Formula (j); more preferably a compound represented by Formula (h), a tautomers of a compound represented by Formula (h), a compound represented by Formula (i), or a tautomer of a compound represented by Formula (i); and still more preferably a compound represented by Formula (h) or a tautomer of a compound represented by Formula (h).

Hereinafter, the compounds represented by Formulae (a) to (j) will be described in detail.

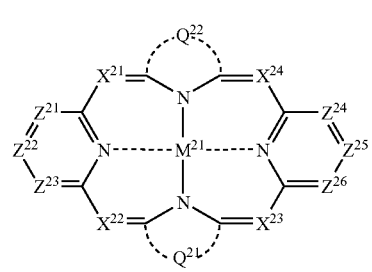

Formula (a)

The compound represented by Formula (a) will be described below.

In Formula (a), the definitions and preferable ranges of $Z^{21}$, $Z^{22}$, $Z^{23}$, $Z^{24}$, $Z^{25}$, $Z^{26}$, and $M^{21}$ are the same as the definitions and preferable ranges of corresponding $Z^{11}$, $Z^{12}$, $Z^{13}$, $Z^{11}$, $Z^{12}$, $Z^{13}$, and $M^{Y1}$ respectively, in Formula (III).

$Q^{21}$ and $Q^{22}$ each represent a group forming a nitrogen-containing heterocycle. Each of the nitrogen-containing heterocycles formed by $Q^{21}$ and $Q^{22}$ is not particularly limited, but is preferably a pyrrole ring, an imidazole ring, a triazole ring, a condensed ring containing one or more of the above rings (e.g., benzopyrrole), or a tautomer of any of the above rings (e.g., in Formula (b) below, the nitrogen-containing five-membered ring substituted by $R^{43}$ and $R^{44}$, or by $R^{45}$ and $R^{46}$ is defined as a tautomer of pyrrole), and more preferably a pyrrole ring or a condensed ring containing a pyrrole ring (e.g., benzopyrrole).

$X^{21}$, $X^{22}$, $X^{23}$, and $X^{24}$ each independently represent a substituted or unsubstituted carbon or nitrogen atom, preferably an unsubstituted carbon or nitrogen atom, and more preferably a nitrogen atom.

The compound represented by Formula (b) will be described below.

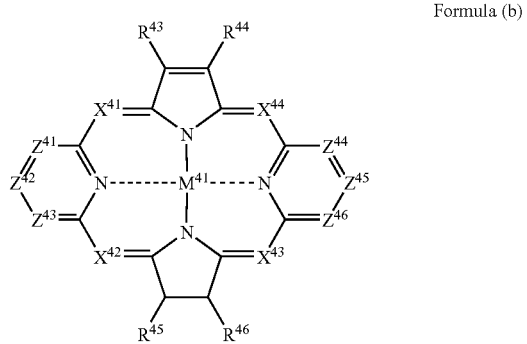

Formula (b)

In Formula (b), the definitions and preferable ranges of $Z^{41}$, $Z^{42}$, $Z^{43}$, $Z^{44}$, $Z^{45}$, $Z^{46}$, $X^{41}$, $X^{42}$, $X^{43}$, $X^{44}$, and $M^{41}$ are the same as the definitions and preferable ranges of $Z^{21}$, $Z^{22}$, $Z^{23}$, $Z^{24}$, $Z^{25}$, $Z^{26}$, $X^{21}$, $X^{22}$, $X^{23}$, $X^{24}$, and $M^{21}$, respectively, in Formula (a).

$R^{43}$, $R^{44}$, $R^{45}$, and $R^{46}$ are each preferably selected from a hydrogen atom, the alkyl groups and aryl groups described above as examples of the substituent on $Z^{11}$ or $Z^{12}$ in Formula (III), and such groups as to form at least one ring structure (such as a benzo-condensed ring or a pyridine condensed ring) by bonding between $R^{43}$ and $R^{44}$ and/or bonding between $R^{45}$ and $R^{46}$; more preferably selected from the alkyl groups and aryl groups and such groups as to form at least one ring structure (such as a benzo-condensed ring or a pyridine condensed ring) by bonding between $R^{43}$ and $R^{44}$ and/or bonding between $R^{45}$ and $R^4$; still more preferably selected from such groups as to form at least one ring structure (such as a benzo-condensed ring or a pyridine condensed ring) by bonding between $R^{43}$ and $R^{44}$ and/or bonding between $R^{45}$ and $R^4$.

$R^{43}$, $R^{44}$, $R^{45}$, and $R^{46}$ each independently represent a hydrogen atom or a substituent. Examples of the substituent include the groups described above as examples of the substituent on the carbon atom represented by $Z^{11}$ or $Z^{12}$ in Formula (III).

The compound represented by Formula (c) will be described below.

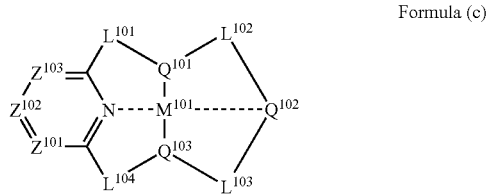

Formula (c)

In Formula (c), $Z^{101}$, $Z^{102}$, and $Z^{103}$ each independently represent a substituted or unsubstituted carbon or nitrogen atom. At least one of $Z^{101}$, $Z^{102}$, and $Z^{103}$ is preferably a nitrogen atom.

$L^{101}$, $L^{102}$, $L^{103}$, and $L^{104}$ each independently represent a single bond or a connecting group. The connecting group is not particularly limited, and examples thereof include a carbonyl connecting group, an alkylene group, an alkenylene group, an arylene group, a heteroarylene group, a nitrogen-containing heterocycle connecting group, an oxygen connecting group, an amino connecting group, an imino connecting group, a carbonyl connecting group, and connecting groups comprising combinations thereof.

$L^{101}$, $L^{102}$, $L^{103}$, and $L^{104}$ are each preferably a single bond, an alkylene group, an alkenylene group, an amino connecting group, or an imino connecting group, more preferably a single bond, an alkylene connecting group, an alkenylene connecting group, or an imino connecting group, and still more preferably a single bond or an alkylene connecting group.

$Q^{101}$ and $Q^{103}$ each independently represent a group containing a carbon atom coordinating to $M^{101}$, a group containing a nitrogen atom coordinating to $M^{101}$, a group containing a phosphorus atom coordinating to $M^{101}$, a group containing an oxygen atom coordinating to $M^{101}$, or a group containing a sulfur atom coordinating to $M^{101}$.

The group containing a carbon atom coordinating to $M^{101}$ is preferably an aryl group containing a coordinating carbon atom, a five-membered ring heteroaryl group containing a coordinating carbon atom, or a six-membered ring heteroaryl group containing a coordinating carbon atom; more preferably, an aryl group containing a coordinating carbon atom, a nitrogen-containing five-membered ring heteroaryl group containing a coordinating carbon atom, or a nitrogen-containing six-membered ring heteroaryl group containing a coordinating carbon atom; and still more preferably, an aryl group containing a coordinating carbon atom.

The group containing a nitrogen atom coordinating to $M^{101}$ is preferably a nitrogen-containing five-membered ring heteroaryl group containing a coordinating nitrogen atom or a nitrogen-containing six-membered ring heteroaryl group containing a coordinating nitrogen atom, and more preferably a nitrogen-containing six-membered ring heteroaryl group containing a coordinating nitrogen atom.

The group containing a phosphorus atom coordinating to $M^{101}$ is preferably an alkyl phosphine group containing a coordinating phosphorus atom, an aryl phosphine group containing a coordinating phosphorus atom, an alkoxyphosphine group containing a coordinating phosphorus atom, an aryloxyphosphine group containing a coordinating phosphorus atom, a heteroaryloxyphosphine group containing a coordinating phosphorus atom, a phosphinine group containing a coordinating phosphorus atom, or a phosphor group containing a coordinating phosphorus atom; more preferably, an alkyl phosphine group containing a coordinating phosphorus atom or an aryl phosphine group containing a coordinating phosphorus atom.

The group containing an oxygen atom coordinating to $M^{101}$ is preferably an oxy group or a carbonyl group containing a coordinating oxygen atom, and more preferably an oxy group.

The group containing a sulfur atom coordinating to $M^{101}$ is preferably a sulfide group, a thiophene group, or a thiazole group, and more preferably a thiophene group.

Each of $Q^{101}$ and $Q^{103}$ is preferably a group containing a carbon atom coordinating to $M^{101}$, a group containing a nitrogen atom coordinating to $M^{101}$, or a group containing a an oxygen atom coordinating to $M^{101}$; more preferably a group containing a carbon atom coordinating to $M^{101}$ or a group containing a nitrogen atom coordinating to $M^{101}$; and still more preferably a group containing a carbon atom coordinating to $M^{101}$.

$Q^{102}$ represents a group containing a nitrogen atom coordinating to $M^{101}$, a group containing a phosphorus atom coordinating to $M^{101}$, a group containing an oxygen atom coordinating to $M^{101}$ or a group containing a sulfur atom coordinating to $M^{101}$, and preferably a group containing a nitrogen atom coordinating to $M^{101}$.

The definition of $M^{101}$ is the same as that of $M^{11}$ in Formula (I), and their preferable ranges are also the same.

The compound represented by Formula (d) will be described below.

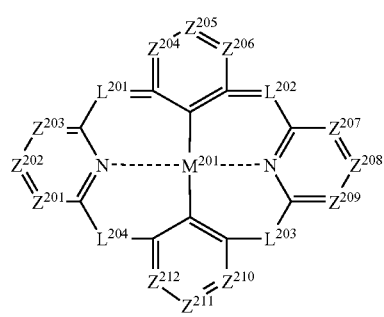

Formula (d)

In Formula (d), the definitions and preferable ranges of $Z^{201}, Z^{202}, Z^{203}, Z^{207}, Z^{208}, Z^{209}, L^{201}, L^{202}, L^{203}, L^{204}$, and $M^{201}$ are the same as the definitions and preferable ranges of corresponding $Z^{101}, Z^{102}, Z^{103}, Z^{101}, Z^{102}, Z^{103}, L^{101}, L^{102}, L^{103}, L^{104}$, and $M^{101}$, respectively, in Formula (c). $Z^{204}, Z^{205}, Z^{206}, Z^{210}, Z^{211}$, and $Z^{212}$ each represent a substituted or unsubstituted carbon or a substituted or unsubstituted nitrogen atom, and preferably a substituted or unsubstituted carbon atom.

The compound represented by Formula (e) will be described below.

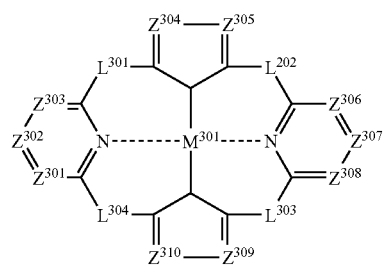

Formula (e)

In Formula (e), the definitions and preferable ranges of $Z^{301}, Z^{302}, Z^{303}, Z^{304}, Z^{305}$, $Z^{306}, Z^{307}, Z^{308}, Z^{309}, Z^{310}, L^{301}, L^{302}, L^{303}, L^{304}$, and $M^{301}$ are the same as the definitions and preferable ranges of corresponding $Z^{201}, Z^{202}, Z^{203}, Z^{204}, Z^{206}, Z^{207}, Z^{208}, Z^{209}, Z^{210}, Z^{212}, L^{101}, L^{102}, L^{103}, L^{104}$, and $M^{101}$, respectively, in formulae (d) and (c).

The compound represented by Formula (f) will be described below.

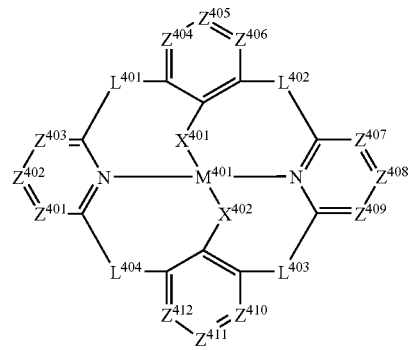

Formula (f)

In Formula (f), the definitions and preferable ranges of $Z^{401}, Z^{402}, Z^{403}, Z^{404}, Z^{405}, Z^{406}, Z^{407}, Z^{408}, Z^{409}, Z^{410}, Z^{411}, Z^{412}, L^{401}, L^{402}, L^{403}, L^{404}$, and $M^{401}$ are the same as the definitions and preferable ranges of corresponding $Z^{201}, Z^{202}, Z^{203}, Z^{204}, Z^{205}, Z^{206}, Z^{207}, Z^{208}, Z^{209}, Z^{210}, Z^{211}, Z^{212}, L^{101}, L^{102}, L^{103}, L^{104}$, and $M^{101}$, respectively, in formulae (d) and (c). $X^{401}$ and $X^{402}$ each represent an oxygen atom or a substituted or unsubstituted nitrogen or a sulfur atom, preferably an oxygen atom or a substituted nitrogen atom, and more preferably an oxygen atom.

The compound represented by Formula (g) will be described below.

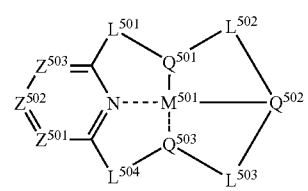

Formula (g)

In Formula (g), the definitions and preferable ranges of $Z^{501}, Z^{502}, Z^{503}, L^{501}, L^{502}, L^{503}, L^{504}, Q^{501}, Q^{502}, Q^{503}$, and $M^{501}$ are the same as the definitions and preferable ranges of corresponding $Z^{101}, Z^{102}, Z^{103}, L^{101}, L^{102}, L^{103}, L^{104}, Q^{101}, Q^{103}, Q^{102}$, and $M^{101}$, respectively, in Formula (c).

The compound represented by Formula (h) will be described below.

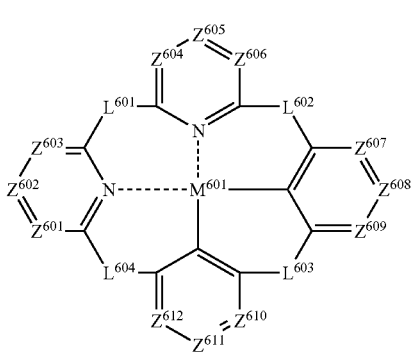

Formula (h)

In Formula (h), the definitions and preferable ranges of $Z^{601}, Z^{602}, Z^{603}, Z^{604}, Z^{605}, Z^{606}, Z^{607}, Z^{608}, Z^{609}, Z^{610}, Z^{611}, Z^{612}, L^{601}, L^{602}, L^{603}, L^{604}$, and $M^{601}$ are the same as the definitions and preferable ranges of corresponding $Z^{201}, Z^{202}$, $Z^{203}, Z^{207}, Z^{208}, Z^{209}, Z^{204}, Z^{205}, Z^{206}, Z^{210}, Z^{211}, Z^{212}, L^{101}, L^{102}, L^{103}, L^{104},$ and $M^{101}$, respectively, in Formulae (d) and (c).

The compound represented by Formula (i) will be described below.

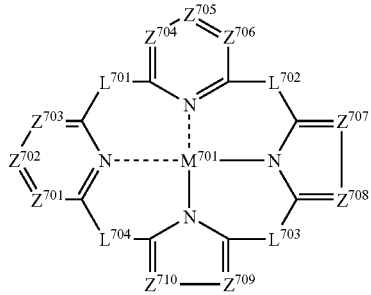

Formula (i)

In Formula (i), the definitions and preferable ranges of $Z^{701}, Z^{702}, Z^{703}, Z^{704}, Z^{705}, Z^{706}, Z^{707}, Z^{708}, Z^{709}, Z^{710}, L^{701}, L^{702}, L^{703}, L^{704},$ and $M^{701}$ are the same as the definitions and preferable ranges of corresponding $Z^{201}, Z^{202}, Z^{203}, Z^{207}, Z^{208}, Z^{209}, Z^{204}, Z^{206}, Z^{210}, Z^{212}, L^{101}, L^{102}, L^{103}, L^{104},$ and $M^{101}$, respectively, in Formulae (d) and (c).

The compound represented by Formula (j) will be described below.

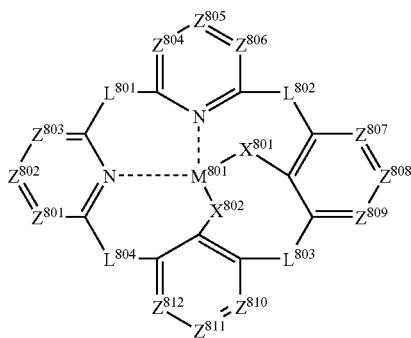

Formula (j)

In Formula (j), the definitions and preferable ranges of $Z^{801}, Z^{802}, Z^{803}, Z^{804}, Z^{805}, Z^{806}, Z^{807}, Z^{808}, Z^{809}, Z^{810}, Z^{811}, Z^{812}, L^{801}, L^{802}, L^{803}, L^{804}, M^{801}, X^{801},$ and $X^{802}$ are the same as the definitions and preferable ranges of corresponding $Z^{201}, Z^{202}, Z^{203}, Z^{207}, Z^{208}, Z^{209}, Z^{204}, Z^{205}, Z^{206}, Z^{210}, Z^{211}, Z^{212}, L^{101}, L^{102}, L^{103}, L^{104}, M^{101}, X^{401},$ and $X^{402}$, respectively, in Formulae (d), (c), and (f).

Specific examples of compounds represented by Formula (III) include compounds (2) to (8), compounds (15) to (20), compound (27) to (32), compounds (36) to (38), compounds (42) to (44), compounds (50) to (52), and compounds (57) to (154) described in Japanese Patent Application National Publication No. 2006-526278, the disclosure of which is incorporated herein by reference. However, the scope of the invention is not limited thereto.

Preferable examples of the metal complex usable in the invention further include compounds represented by Formula (A-1), (B-1), (C-1), (D-1), (E-1), or (F-1) described below.

Formula (A-1) is described below.

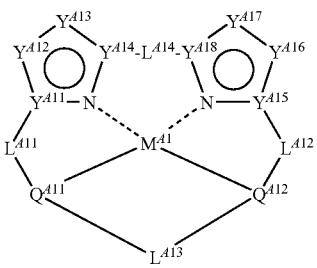

Formula (A-1)

In Formula (A-1), $M^{41}$ represents a metal ion. $Y^{411}, Y^{414}, Y^{415}$ and $Y^{418}$ each independently represent a carbon atom or a nitrogen atom. $Y^{412}, Y^{413}, Y^{416}$ and $Y^{417}$ each independently represent a substituted or unsubstituted carbon atom, a substituted or unsubstituted nitrogen atom, an oxygen atom or a sulfur atom. $L^{411}, L^{412}, L^{413}$ and $L^{414}$ each represent a connecting group, and may have the same structure as each other or different structures from each other. $Q^{411}$ and $Q^{412}$ each independently represent a partial structure containing an atom bonded to $M^{41}$ by a coordination bond, an ionic bond, or a covalent bond.

The compound represented by Formula (A-1) will be described in detail.

$M^{41}$ represents a metal ion. The metal ion is not particularly limited. It is preferably a divalent metal ion, more preferably $Pt^{2+}, Pd^{2+}, Cu^{2+}, Ni^{2+}, Co^{2+}, Zn^{2+}, Mg^{2+}$ or $Pb^{2+}$, still more preferably $Pt^{2+}$ or $Cu^{2+}$, and further more preferably $Pt^{2+}$.

$Y^{411}, Y^{414}, Y^{415}$ and $Y^{418}$ each independently represent a carbon atom or a nitrogen atom. Each of $Y^{411}, Y^{414}, Y^{415}$ and $Y^{418}$ is preferably a carbon atom.

$Y^{412}, Y^{413}, Y^{416}$ and $Y^{417}$ each independently represent a substituted or unsubstituted carbon atom, a substituted or unsubstituted nitrogen atom, an oxygen atom or a sulfur atom. Each of $Y^{412}, Y^{413}, Y^{416}$ and $Y^{417}$ is preferably a substituted or unsubstituted carbon atom or a substituted or unsubstituted nitrogen atom.

$L^{411}, L^{412}, L^{413}$ and $L^{414}$ each independently represent a divalent connecting group. The divalent connecting group represented by $L^{411}, L^{412}, L^{413}$ or $L^{414}$ may be, for example, a single bond or a connecting group formed of atoms selected from carbon, nitrogen, silicon, sulfur, oxygen, germanium, phosphorus and the like, more preferably a single bond, a substituted or unsubstituted carbon atom, a substituted or unsubstituted nitrogen atom, a substituted silicon atom, an oxygen atom, a sulfur atom, a divalent aromatic hydrocarbon cyclic group or a divalent aromatic heterocyclic group, still more preferably a single bond, a substituted or unsubstituted carbon atom, a substituted or unsubstituted nitrogen atom, a substituted silicon atom, a divalent aromatic hydrocarbon cyclic group or a divalent aromatic heterocyclic group, and further more preferably a single bond or a substituted or unsubstituted methylene group. Examples of the divalent connecting group represented by $L^{411}, L^{412}, L^{413}$ or $L^{414}$ include the following groups:

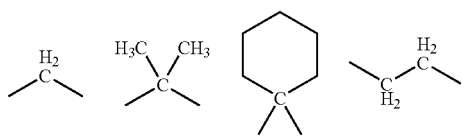

-continued

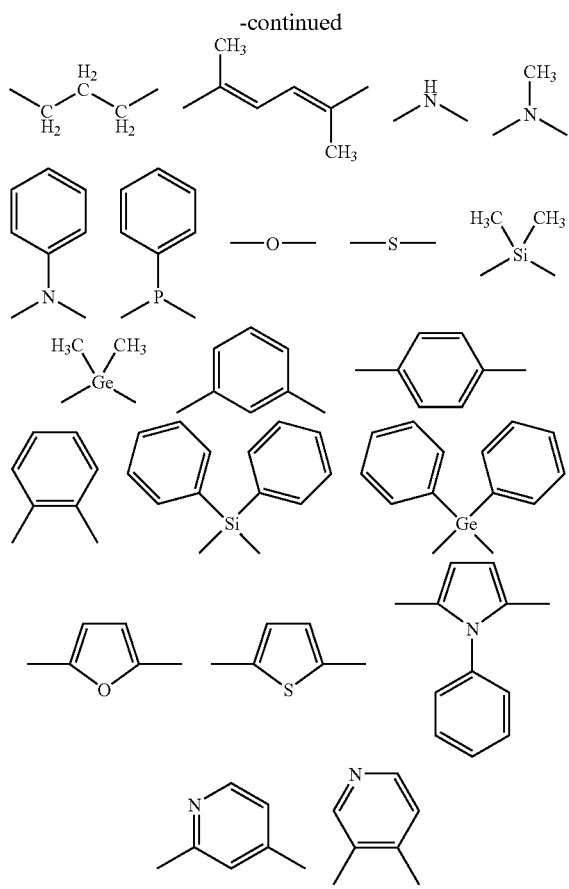

The divalent connecting group represented by $L^{A11}$, $L^{A12}$, $L^{A13}$ or $L^{A14}$ may further have a substituent. The substituent which can be introduced into the divalent connecting group may be, for example, an alkyl group (preferably having 1 to 30 carbon atoms, more preferably having 1 to 20 carbon atoms, particularly preferably having 1 to 10 carbon atoms, and examples thereof include a methyl group, an ethyl group, an iso-propyl group, a tert-butyl group, a n-octyl group, a n-decyl group, a n-hexadecyl group, a cyclopropyl group, a cyclopentyl group, and a cyclohexyl group), an alkenyl group (preferably having 2 to 30 carbon atoms, more preferably having 2 to 20 carbon atoms, particularly preferably having 2 to 10 carbon atoms, and examples thereof include a vinyl group, an allyl group, a 2-butenyl group, and a 3-pentenyl group), an alkynyl group (preferably having 2 to 30 carbon atoms, more preferably having 2 to 20 carbon atoms, particularly preferably having 2 to 10 carbon atoms, and examples thereof include a propargyl group and a 3-pentynyl group), an aryl group (preferably having 6 to 30 carbon atoms, more preferably having 6 to 20 carbon atoms, particularly preferably having 6 to 12 carbon atoms, and examples thereof include a phenyl group, a p-methylphenyl group, a naphthyl group, and an anthranyl group), an amino group preferably having 0 to 30 carbon atoms, more preferably having 0 to 20 carbon atoms, particularly preferably having 0 to 10 carbon atoms, and examples thereof include an amino group, a methylamino group, a dimethylamino group, a diethylamino group, a dibenzylamino group, a diphenylamino group, and a ditolylamino group), an alkoxy group (preferably having 1 to 30 carbon atoms, more preferably having 1 to 20 carbon atoms, particularly preferably having 1 to 10 carbon atoms, and examples thereof include a methoxy group, an ethoxy group, a butoxy group, and a 2-ethylhexyloxy group), an aryloxy group (preferably having 6 to 30 carbon atoms, more preferably having 6 to 20 carbon atoms, particularly preferably having 6 to 12 carbon atoms, and examples thereof include a phenyloxy group, a 1-naphthyloxy group, and a 2-naphthyloxy group), a heterocyclic oxy group (preferably having 1 to 30 carbon atoms, more preferably having 1 to 20 carbon atoms, particularly preferably having 1 to 12 carbon atoms, and examples thereof include a pyridyloxy group, a pyrazyloxy group, a pyrimidyloxy group, and a quinolyloxy group), an acyl group (preferably having 1 to 30 carbon atoms, more preferably having 1 to 20 carbon atoms, particularly preferably having 1 to 12 carbon atoms, and examples thereof include an acetyl group, a benzoyl group, a formyl group, and a pivaloyl group), an alkoxycarbonyl group (preferably having 2 to 30 carbon atoms, more preferably having 2 to 20 carbon atoms, particularly preferably having 2 to 12 carbon atoms, and examples thereof include a methoxycarbonyl group, and an ethoxycarbonyl group), an aryloxycarbonyl group (preferably having 7 to 30 carbon atoms, more preferably having 7 to 20 carbon atoms, particularly preferably having 7 to 12 carbon atoms, and examples thereof include a phenyloxycarbonyl group), an acyloxy group (preferably having 2 to 30 carbon atoms, more preferably having 2 to 20 carbon atoms, particularly preferably having 2 to 10 carbon atoms, and examples thereof include an acetoxy group, and a benzoyloxy group), an acylamino group (preferably having 2 to 30 carbon atoms, more preferably having 2 to 20 carbon atoms, particularly preferably having 2 to 10 carbon atoms, and examples thereof include an acetylamino group, and a benzoylamino group), an alkoxycarbonylamino group (preferably having 2 to 30 carbon atoms, more preferably having 2 to 20 carbon atoms, particularly preferably having 2 to 12 carbon atoms, and examples thereof include a methoxycarbonylamino group), an aryloxycarbonylamino group (preferably having 7 to 30 carbon atoms, more preferably having 7 to 20 carbon atoms, particularly preferably having 7 to 12 carbon atoms, and examples thereof include a phenyloxycarbonylamino group), a sulfonylamino group (preferably having 1 to 30 carbon atoms, more preferably having 1 to 20 carbon atoms, particularly preferably having 1 to 12 carbon atoms, and examples thereof include a methanesulfonylamino group and a benzenesulfonylamino group), a sulfamoyl group (preferably having 0 to 30 carbon atoms, more preferably having 0 to 20 carbon atoms, particularly preferably having 0 to 12 carbon atoms, and examples thereof include a sulfamoyl group, a methylsulfamoyl group, a dimethylsulfamoyl group, and a phenylsulfamoyl group), a carbamoyl group (preferably having 1 to 30 carbon atoms, more preferably having 1 to 20 carbon atoms, particularly preferably having 1 to 12 carbon atoms, and examples thereof include a carbamoyl group, a methylcarbamoyl group, a diethylcarbamoyl group, and a phenylcarbamoyl group), an alkylthio group (preferably having 1 to 30 carbon atoms, more preferably having 1 to 20 carbon atoms, particularly preferably having 1 to 12 carbon atoms, and examples thereof include a methylthio group and an ethylthio group), an arylthio group (preferably having 6 to 30 carbon atoms, more preferably having 6 to 20 carbon atoms, particularly preferably having 6 to 12 carbon atoms, and examples thereof include a phenylthio group), a heterocyclic thio group (preferably having 1 to 30 carbon atoms, more preferably having 1 to 20 carbon atoms, particularly preferably having 1 to 12 carbon atoms, and examples thereof include a pyridylthio group, a 2-benzimidazolylthio group, a 2-benzoxazolylthio group, and a 2-benzthiazolylthio group), a sulfonyl group (preferably having 1 to 30 carbon atoms, more preferably having 1 to 20 carbon atoms, particularly preferably having 1 to 12 carbon atoms, and examples thereof include a mesyl group and a tosyl group), a sulfinyl group (preferably having 1 to 30 carbon atoms, more preferably having 1 to 20 carbon atoms, particularly preferably having 1 to 12 carbon atoms, and examples thereof include a methanesulfinyl group and a benzenesulfinyl group), a ureido group (preferably having 1 to 30 carbon atoms, more preferably having 1 to 20 carbon atoms, particularly preferably having 1 to 12 carbon atoms, and examples thereof include a ureido group, a methylureido group, and a phenylureido group), a phosphoric amide group (preferably having 1 to 30 carbon atoms, more preferably having 1 to 20 carbon atoms, particularly preferably having 1 to 12 carbon atoms, and examples thereof include a diethyiphosphoric amide group and a phenylphosphoric amide group), a hydroxy group, a mercapto group, a halogen atom (and examples thereof include a fluorine atom, chlorine atom, bromine atom, iodine atom), a cyano group, a sulfo group, a carboxyl group, a nitro group, a hydroxamic acid group, a sulfino group, a hydrazino group, an imino group, a heterocyclic group (preferably having 1 to 30 carbon atoms, more preferably having 1 to 12 carbon atoms, containing a heteroatom such as a nitrogen atom, an oxygen atom or a sulfur atom; specific examples thereof include an imidazolyl group, a pyridyl group, a quinolyl group, a furyl group, a thienyl group, a piperidyl group, a morpholino group, a benzoxazolyl group, a benzimidazolyl group, a benzthiazolyl group, a carbazolyl group, and an azepinyl group), a silyl group (preferably having 3 to 40 carbon atoms, more preferably having 3 to 30 carbon atoms, particularly preferably having 3 to 24 carbon atoms, and examples thereof include a trimethylsilyl group and a triphenylsilyl group) or a silyloxy group (preferably having 3 to 40 carbon atoms, more preferably having 3 to 30 carbon atoms, particularly preferably having 3 to 24 carbon atoms, and examples thereof include a trimethylsilyloxy group and a triphenylsilyloxy group).

These substituents may themselves have substituents. Substituents which can be introduced to these substituents are preferably selected from alkyl groups, aryl groups, heterocyclic groups, halogen atoms and silyl groups, more preferably selected from alkyl groups, aryl groups, heterocyclic groups and halogen atoms, and still more preferably selected from alkyl groups, aryl groups, aromatic heterocyclic groups and fluorine atoms.

$Q^{411}$ and $Q^{412}$ each independently represent a partial structure containing an atom bonded to $M^{41}$ by a coordination bond, an ionic bond, or a covalent bond. $Q^{411}$ and $Q^{412}$ each independently preferably represent a group having a carbon atom bonded to $M^{41}$, a group having a nitrogen atom bonded to $M^{41}$, a group having a silicon atom bonded to $M^{41}$, a group having a phosphorus atom bonded to $M^{41}$, a group having an oxygen atom bonded to $M^{41}$ or a group having a sulfur atom bonded to $M^{41}$, more preferably a group having a carbon, nitrogen, oxygen, or sulfur atom bonded to $M^{41}$, still more preferably a group having a carbon or nitrogen atom bonded to $M^{41}$, and further more preferably a group having a carbon atom bonded to $M^{41}$.

The group bonded to $M^{41}$ via a carbon atom is preferably an aryl group having a carbon atom bonded to $M^{41}$, a 5-membered ring heteroaryl group having a carbon atom bonded to $M^{41}$ or a 6-membered ring heteroaryl group having a carbon atom bonded to $M^{41}$, more preferably an aryl group having a carbon atom bonded to $M^{41}$, a nitrogen-containing 5-membered ring heteroaryl group having a carbon atom bonded to $M^{41}$ or a nitrogen-containing 6-membered ring heteroaryl group having a carbon atom bonded to $M^{41}$, and still more preferably an aryl group having a carbon atom bonded to $M^{41}$.

The group bonded to $M^{41}$ via a nitrogen atom is preferably a substituted amino group or a nitrogen-containing 5-membered heterocycle heteroaryl group having a nitrogen atom bonded to $M^{41}$, more preferably a nitrogen-containing 5-membered heterocycle heteroaryl group having a nitrogen atom bonded to $M^{41}$.

The group bonded to $M^{41}$ via a phosphorus atom is preferably a substituted phosphino group. The group having a silicon atom bonded to $M^{41}$ is preferably a substituted silyl group. The group having an oxygen atom bonded to $M^{41}$ is preferably an oxy group, and the group having a sulfur atom bonded to $M^{41}$ is preferably a sulfide group.

The compound represented by Formula (A-1) is more preferably a compound represented by the following Formula (A-2), (A-3) or (A-4).

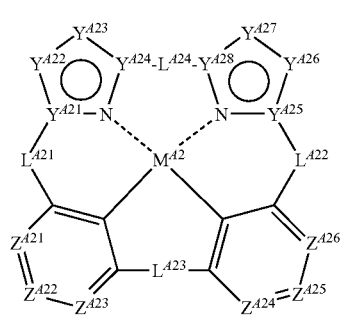

Formula (A-2)

In Formula (A-2), $M^{42}$ represents a metal ion. $Y^{421}$, $Y^{424}$, $Y^{425}$ and $Y^{428}$ each independently represent a carbon atom or a nitrogen atom. $Y^{422}$, $Y^{423}$, $Y^{426}$ and $Y^{427}$ each independently represent a substituted or unsubstituted carbon atom, a substituted or unsubstituted nitrogen atom, an oxygen atom or a sulfur atom. $L^{421}$, $L^{422}$, $L^{423}$ and $L^{424}$ each independently represent a connecting group. $Z^{421}$, $A^{422}$, $Z^{423}$, $Z^{424}$, $Z^{425}$ and $Z^{426}$ each independently represent a nitrogen atom or a substituted or unsubstituted carbon atom.

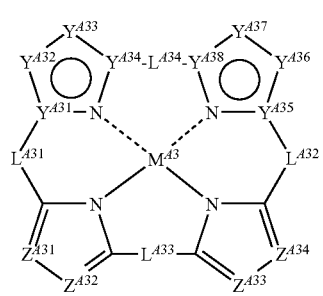

Formula (A-3)

In Formula (A-3), $M^{43}$ represents a metal ion. $Y^{431}$, $Y^{434}$, $Y^{435}$ and $Y^{438}$ each independently represent a carbon atom or a nitrogen atom. $Y^{432}$, $Y^{433}$, $Y^{436}$ and $Y^{437}$ each independently represent a substituted or unsubstituted carbon atom, a substituted or unsubstituted nitrogen atom, an oxygen atom or a sulfur atom. $L^{431}$, $L^{432}$, and $L^{434}$ each independently represent a connecting group. $Z^{431}$, $Z^{432}$, $Z^{433}$ and $Z^{434}$ each independently represent a nitrogen atom or a substituted or unsubstituted carbon atom.

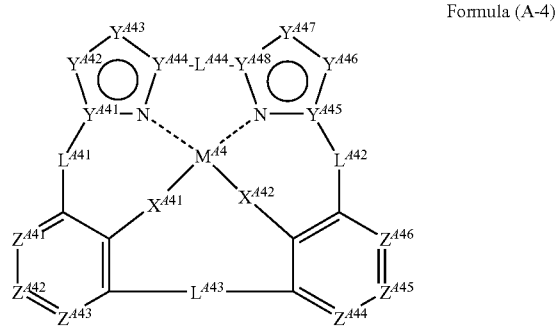

Formula (A-4)

In Formula (A-4), $M^{A4}$ represents a metal ion. $Y^{A41}$, $Y^{A44}$, $Y^{A45}$ and $Y^{A48}$ each independently represent a carbon atom or a nitrogen atom. $Y^{A42}$, $Y^{A43}$, $Y^{A46}$ and $Y^{A47}$ each independently represent a substituted or unsubstituted carbon atom, a substituted or unsubstituted nitrogen atom, an oxygen atom or a sulfur atom. $L^{A41}$, $L^{A42}$, $L^{A43}$ and $L^{A44}$ each independently represent a connecting group. $Z^{A41}$, $Z^{A42}$, $Z^{A43}$, $Z^{A44}$, $Z^{A45}$ and $Z^{A46}$ each independently represent a nitrogen atom or a substituted or unsubstituted carbon atom. $X^{A41}$ and $X^{A42}$ each independently represent an oxygen atom, a sulfur atom or a substituted or unsubstituted nitrogen atom.

The compound represented by Formula (A-2) will be described in detail.

$M^{A2}$, $Y^{A21}$, $Y^{A24}$, $Y^{A25}$, $Y^{A28}$, $Y^{A22}$, $Y^{A23}$, $Y^{A26}$, $Y^{A27}$, $L^{A21}$, $L^{A22}$, $L^{A23}$ and $L^{A24}$ have the same definitions and preferable ranges as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$, respectively, in Formula (A-1).

$Z^{A21}$, $Z^{A22}$, $Z^{A23}$, $Z^{A24}$, $Z^{A25}$ and $Z^{A26}$ each independently represent a nitrogen atom or a substituted or unsubstituted carbon atom. $Z^{A21}$, $Z^{A22}$, $Z^{A23}$, $Z^{A24}$, $Z^{A25}$ and $Z^{A26}$ each independently represent preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

The compound represented by Formula (A-3) will be described in detail.

$M^{A3}$, $Y^{A31}$, $Y^{A34}$, $Y^{A35}$, $Y^{A38}$, $Y^{A32}$, $Y^{A33}$, $Y^{A36}$, $Y^{A37}$, $L^{A31}$, $L^{A32}$, $L^{A33}$ and $L^{A34}$ have the same definitions and preferable ranges as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$, respectively, in Formula (A-1).

$Z^{A31}$, $Z^{A32}$, $Z^{A33}$ and $Z^{A34}$ each independently represent a nitrogen atom or a substituted or unsubstituted carbon atom. Each of $Z^{A31}$, $Z^{A32}$, $Z^{A33}$ and $Z^{A34}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

The compound represented by Formula (A-4) will be described in detail.

$M^{A4}$, $Y^{A41}$, $Y^{A44}$, $Y^{A45}$, $Y^{A48}$, $Y^{A42}$, $Y^{A43}$, $Y^{A46}$, $Y^{A47}$, $L^{A41}$, $L^{A42}$, $L^{A43}$ and $L^{A44}$ have the same definitions and preferable ranges as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$ and $L^{A14}$, respectively, in Formula (A-1).

$Z^{A41}$, $Z^{A42}$, $Z^{A43}$, $Z^{A44}$, $Z^{A45}$ and $Z^{A46}$ each independently represent a nitrogen atom or a substituted or unsubstituted carbon atom. Each of $Z^{A41}$, $Z^{A42}$, $Z^{A43}$, $Z^{A44}$, $Z^{A45}$ and $Z^{A46}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

$X^{A41}$ and $X^{A42}$ each independently represent an oxygen atom, a sulfur atom or a substituted or unsubstituted nitrogen atom. Each of $X^{A41}$ and $X^{A42}$ is preferably an oxygen atom or a sulfur atom, and more preferably an oxygen atom.

Specific examples of the compound represented by Formula (A-1) include, but are not limited to, Compounds (A-1) to (A-80) described in JP-A No. 2007-103493.

Compounds represented by Formula (B-1) shown below are also preferable as metal complexes usable in the invention.

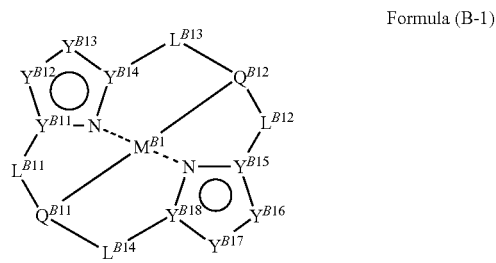

Formula (B-1)

In Formula (B-1), $M^{B1}$ represents a metal ion. $Y^{B11}$, $Y^{B14}$, $Y^{B15}$ and $Y^{B18}$ each independently represent a carbon atom or a nitrogen atom. $Y^{B12}$, $Y^{B13}$, $Y^{B16}$ and $Y^{B17}$ each independently represent a substituted or unsubstituted carbon atom, a substituted or unsubstituted nitrogen atom, an oxygen atom or a sulfur atom. $L^{B11}$, $L^{B12}$, $L^{B13}$ and $L^{B14}$ each independently represent a connecting group. $Q^{B11}$ and $Q^{B12}$ each independently represent a partial structure containing an atom covalently bonded to $M^{B1}$.

The compound represented by Formula (B-1) will be described in detail.

In Formula (B-1) $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$, $L^{B14}$, $Q^{B11}$ and $Q^{B12}$ have the same definitions and preferable ranges as corresponding $M^{A1}$, $Y^{A11}$, $Y^{A14}$, $Y^{A15}$, $Y^{A18}$, $Y^{A12}$, $Y^{A13}$, $Y^{A16}$, $Y^{A17}$, $L^{A11}$, $L^{A12}$, $L^{A13}$, $L^{A14}$, $Q^{A11}$ and $Q^{A12}$, respectively, in Formula (A-1).

More preferable examples of the compound represented by Formula (B-1) include compounds represented by the following Formula (B-2), (B-3) or (B-4).

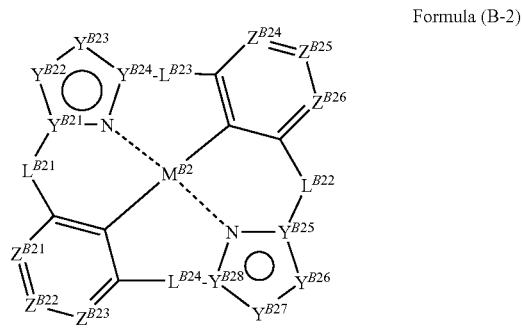

Formula (B-2)

In Formula (B-2), $M^{B2}$ represents a metal ion. $Y^{B21}$, $Y^{B24}$, $Y^{B25}$ and $Y^{B28}$ each independently represent a carbon atom or a nitrogen atom. $Y^{B22}$, $Y^{B23}$, $Y^{B26}$ and $Y^{B27}$ each independently represent a substituted or unsubstituted carbon atom, a substituted or unsubstituted nitrogen atom, an oxygen atom or a sulfur atom. $L^{B21}$, $L^{B22}$, $L^{B23}$ and $L^{B24}$ each independently represent a connecting group. $Z^{B21}$, $Z^{B22}$, $Z^{B23}$, $Z^{B24}$, $Z^{B25}$ and $Z^{B26}$ each independently represent a nitrogen atom or a substituted or unsubstituted carbon atom.

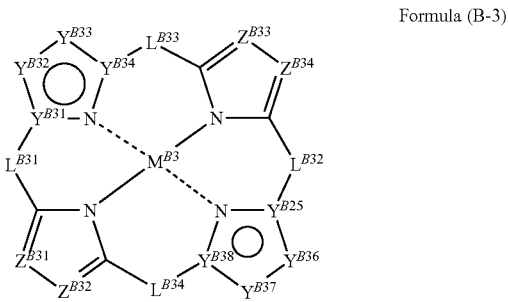

Formula (B-3)

In Formula (B-3), $M^{B3}$ represents a metal ion. $Y^{B31}$, $Y^{B34}$, $Y^{B35}$ and $Y^{B38}$ each independently represent a carbon atom or a nitrogen atom. $Y^{B32}$, $Y^{B33}$, $Y^{B36}$ and $Y^{B37}$ each independently represent a substituted or unsubstituted carbon atom, a substituted or unsubstituted nitrogen atom, an oxygen atom or a sulfur atom. $L^{B31}$, $L^{B32}$, $L^{B33}$ and $L^{B34}$ each independently represent a connecting group. $Z^{B31}$, $Z^{B32}$, $Z^{B33}$ and $Z^{B34}$ each independently represent a nitrogen atom or a substituted or unsubstituted carbon atom.

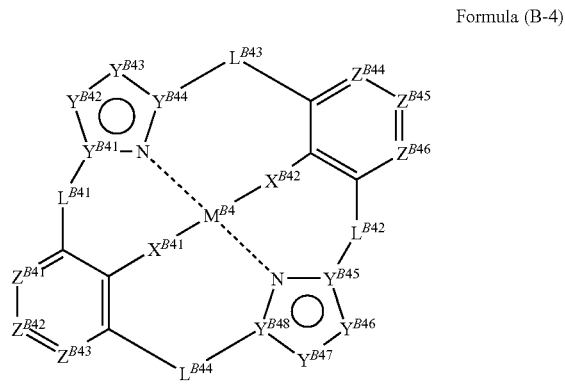

Formula (B-4)

In Formula (B-4), $M^{B4}$ represents a metal ion. $Y^{B41}$, $Y^{B44}$, $Y^{B45}$ and $Y^{B48}$ each independently represent a carbon atom or a nitrogen atom. $Y^{B42}$, $Y^{B43}$, $Y^{B46}$ and $Y^{B47}$ each independently represent a substituted or unsubstituted carbon atom, a substituted or unsubstituted nitrogen atom, an oxygen atom or a sulfur atom. $L^{B41}$, $L^{B42}$, $L^{B43}$ and $L^{B44}$ each independently represent a connecting group. $Z^{B41}$, $Z^{B42}$, $Z^{B43}$, $Z^{B44}$, $Z^{B45}$ and $Z^{B46}$ each independently represent a nitrogen atom or a substituted or unsubstituted carbon atom. $X^{B41}$ and $X^{B42}$ each independently represent an oxygen atom, a sulfur atom or a substituted or unsubstituted nitrogen atom.

The compound represented by Formula (B-2) will be described in detail.

In Formula (B-2), $M^{B2}$, $Y^{B21}$, $Y^{B24}$, $Y^{B25}$, $Y^{B28}$, $Y^{B22}$, $Y^{B23}$, $Y^{B26}$, $Y^{B27}$, $L^{B21}$, $L^{B22}$, $L^{B23}$ and $L^{B24}$ have the same definitions and preferable ranges as corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$, respectively, in Formula (B-1).

$Z^{B21}$, $Z^{B22}$, $Z^{B23}$, $Z^{B24}$, $Z^{B25}$ and $Z^{B26}$ each represent a nitrogen atom or a substituted or unsubstituted carbon atom. Each of $Z^{B21}$, $Z^{B22}$, $Z^{B23}$, $Z^{B24}$, $Z^{B25}$ and $Z^{B26}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

The compound represented by Formula (B-3) will be described in detail.

In Formula (B-3), $M^{B3}$, $Y^{B31}$, $Y^{B34}$, $Y^{B35}$, $Y^{B38}$, $Y^{B32}$, $Y^{B33}$, $Y^{B36}$, $Y^{B37}$, $L^{B31}$, $L^{B32}$, $L^{B33}$ and $L^{B34}$ have the same definitions and preferable ranges as corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$, respectively, in Formula (B-1).

$Z^{B31}$, $Z^{B32}$, $Z^{B33}$ and $Z^{B34}$ each independently represent a nitrogen atom or a substituted or unsubstituted carbon atom. Each of $Z^{B31}$, $Z^{B32}$, $Z^{B33}$ and $Z^{B34}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

The compound represented by Formula (B-4) will be described in detail.

In Formula (B-4), $M^{B4}$, $Y^{B41}$, $Y^{B44}$, $Y^{B45}$, $Y^{B48}$, $Y^{B42}$, $Y^{B43}$, $Y^{B46}$, $Y^{B47}$, $L^{B41}$, $L^{B42}$, $L^{B43}$ and $L^{B44}$ have the same definitions and preferable ranges as corresponding $M^{B1}$, $Y^{B11}$, $Y^{B14}$, $Y^{B15}$, $Y^{B18}$, $Y^{B12}$, $Y^{B13}$, $Y^{B16}$, $Y^{B17}$, $L^{B11}$, $L^{B12}$, $L^{B13}$ and $L^{B14}$, respectively, in Formula (B-1).

$Z^{B41}$, $Z^{B42}$, $Z^{B43}$, $Z^{B44}$, $Z^{B45}$ and $Z^{B46}$ each independently represent a nitrogen atom or a substituted or unsubstituted carbon atom. Each of $Z^{B41}$, $Z^{B42}$, $Z^{B43}$, $Z^{B44}$, $Z^{B45}$ and $Z^{B46}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

$X^{B41}$ and $X^{B42}$ each independently represent an oxygen atom, a sulfur atom or a substituted or unsubstituted nitrogen atom. Each of $X^{B41}$ and $X^{B42}$ is preferably an oxygen atom or a sulfur atom, and more preferably an oxygen atom.

Specific examples of the compounds represented by Formula (B-1) include, but are not limited to, Compounds (B-1) to (B-55) described in JP-A No. 2007-103493.

An example of preferable metal complexes usable in the invention is a compound represented by the following Formula (C-1).

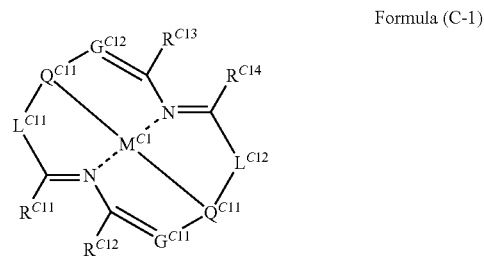

Formula (C-1)

In Formula (C-1), $M^{C1}$ represents a metal ion. $R^{C11}$ and $R^{C12}$ each independently represent a hydrogen atom or a substituent. When $R^{C11}$ and $R^{C12}$ represent substituents, the substituents may be bonded to each other to form a 5-membered ring. $R^{C13}$ and $R^{C14}$ each independently represent a hydrogen atom or a substituent. When $R^{C11}$ and $R^{C12}$ represent substituents, the substituents may alternatively be not bonded. When $R^{C13}$ and $R^{C14}$ represent substituents, the substituents may be bonded to each other to form a 5-membered ring. When $R^{C13}$ and $R^{C14}$ represent substituents, the substituents may alternatively be not bonded. $G^{C11}$ and $G^{C12}$ each independently represent a nitrogen atom or a substituted or unsubstituted carbon atom. $L^{C11}$ and $L^{C12}$ each independently represent a connecting group. $Q^{C11}$ and $Q^{C12}$ each independently represent a partial structure containing an atom bonded to $M^{C1}$ by a coordination bond, an ionic bond, or a covalent bond.

Formula (C-1) will be described in detail.

In Formula (C-1), $M^{C1}$, $L^{C11}$, $L^{C12}$, $Q^{C11}$ and $Q^{C12}$ have the same definitions and preferable ranges as corresponding $M^{A1}$, $L^{A11}$, $L^{A12}$, $Q^{A11}$ and $Q^{A12}$, respectively, in Formula (A-1).

$G^{C11}$ and $G^{C12}$ each independently represent a nitrogen atom or a substituted or unsubstituted carbon atom, preferably a nitrogen atom or an unsubstituted carbon atom, and more preferably a nitrogen atom.

$R^{C11}$ and $R^{C12}$ each independently represent a hydrogen atom or a substituent. $R^{C11}$ and $R^{C12}$ may be bonded to each other to form a 5-membered ring. $R^{C13}$ and $R^{C14}$ each independently represent a hydrogen atom or a substituent. $R^{C13}$ and $R^{C14}$ may be bonded to each other to form a 5-membered ring.

The substituent represented by $R^{C11}$, $R^{C12}$, $R^{C13}$ or $R^{C14}$ may be, for example, an alkyl group (preferably having 1 to 30 carbon atoms, more preferably having 1 to 20 carbon atoms, particularly preferably having 1 to 10 carbon atoms; and examples thereof include a methyl group, an ethyl group, an iso-propyl group, a tert-butyl group, a n-octyl group, a n-decyl group, a n-hexadecyl group, a cyclopropyl group, a cyclopentyl group, a cyclohexyl group, etc.), an alkenyl group (preferably having 2 to 30 carbon atoms, more preferably having 2 to 20 carbon atoms, particularly preferably having 2 to 10 carbon atoms; and examples thereof include a vinyl group, an allyl group, a 2-butenyl group, and a 3-pentenyl group), an alkynyl group (preferably having 2 to 30 carbon atoms, more preferably having 2 to 20 carbon atoms, particularly preferably having 2 to 10 carbon atoms; and examples thereof include a propargyl group and a 3-pentynyl group), an aryl group (preferably having 6 to 30 carbon atoms, more preferably having 6 to 20 carbon atoms, particularly preferably having 6 to 12 carbon atoms; and examples thereof include a phenyl group, a p-methylphenyl group, a naphthyl group, and an anthranyl group), an amino group (preferably having 0 to 30 carbon atoms, more preferably having 0 to 20 carbon atoms, particularly preferably having 0 to 10 carbon atoms; and examples thereof include an amino group, a methylamino group, a dimethylamino group, a diethylamino group, a dibenzylamino group, a diphenylamino group, and a ditolylamino group), an alkoxy group (preferably having 1 to 30 carbon atoms, more preferably having 1 to 20 carbon atoms, particularly preferably having 1 to 10 carbon atoms; and examples thereof include a methoxy group, an ethoxy group, a butoxy group, and a 2-ethylhexyloxy group), an aryloxy group (preferably a having 6 to 30 carbon atoms, more preferably having 6 to 20 carbon atoms, particularly preferably having 6 to 12 carbon atoms; and examples thereof include a phenyloxy group, a 1-naphthyloxy group, and a 2-naphthyloxy group), a heterocyclic oxy group (preferably having 1 to 30 carbon atoms, more preferably having 1 to 20 carbon atoms, particularly preferably having 1 to 12 carbon atoms; and examples thereof include a pyridyloxy group, a pyrazyloxy group, a pyrimidyloxy group, and a quinolyloxy group), an acyl group (preferably having 1 to 30 carbon atoms, more preferably having 1 to 20 carbon atoms, particularly preferably having 1 to 12 carbon atoms; and examples thereof include an acetyl group, a benzoyl group, a formyl group, and a pivaloyl group), an alkoxycarbonyl group (preferably having 2 to 30 carbon atoms, more preferably having 2 to 20 carbon atoms, particularly preferably having 2 to 12 carbon atoms; and examples thereof include a methoxycarbonyl group and an ethoxycarbonyl group), an aryloxycarbonyl group (preferably having 7 to 30 carbon atoms, more preferably having 7 to 20 carbon atoms, particularly preferably having 7 to 12 carbon atoms; and examples thereof include a phenyloxycarbonyl group), an acyloxy group (preferably having 2 to 30 carbon atoms, more preferably having 2 to 20 carbon atoms, particularly preferably having 2 to 10 carbon atoms; and examples thereof include an acetoxy group and a benzoyloxy group), an acylamino group (preferably having 2 to 30 carbon atoms, more preferably having 2 to 20 carbon atoms, particularly preferably having 2 to 10 carbon atoms; and examples thereof include an acetylamino group and a benzoylamino group), an alkoxycarbonylamino group (preferably having 2 to 30 carbon atoms, more preferably having 2 to 20 carbon atoms, particularly preferably having 2 to 12 carbon atoms; and examples thereof include a methoxycarbonylamino group), an aryloxycarbonylamino group (preferably having 7 to 30 carbon atoms, more preferably having 7 to 20 carbon atoms, particularly preferably having 7 to 12 carbon atoms; and examples thereof include a phenyloxycarbonylamino group), an alkylthio group (preferably having 1 to 30 carbon atoms, more preferably having 1 to 20 carbon atoms, particularly preferably having 1 to 12 carbon atoms; and examples thereof include a methylthio group and an ethylthio group), an arylthio group (preferably having 6 to 30 carbon atoms, more preferably having 6 to 20 carbon atoms, particularly preferably having 6 to 12 carbon atoms; and examples thereof include a phenylthio group), a heterocyclic thio group (preferably having 1 to 30 carbon atoms, more preferably having 1 to 20 carbon atoms, particularly preferably having 1 to 12 carbon atoms; and examples thereof include a pyridylthio group, a 2-benzimidazolylthio group, a 2-benzoxazolylthio group, and a 2-benzthiazolylthio group), a halogen atom (such as a fluorine atom, chlorine atom, bromine atom, iodine atom), a cyano group, a heterocyclic group (preferably having 1 to 30 carbon atoms, more preferably having 1 to 12 carbon atoms, and containing a heteroatom such as a nitrogen atom, an oxygen atom or a sulfur atom; examples include an imidazolyl group, a pyridyl group, a quinolyl group, a furyl group, a thienyl group, a, piperidyl group, a morpholino group, a benzoxazolyl group, a benzimidazolyl group, a benzthiazolyl group, a carbazolyl group, and an azepinyl group), a silyl group (preferably having 3 to 40 carbon atoms, more preferably having 3 to 30 carbon atoms, particularly preferably having 3 to 24 carbon atoms; and examples thereof include a trimethylsilyl group, and a triphenylsilyl group) or a silyloxy group (preferably having 3 to 40 carbon atoms, more preferably having 3 to 30 carbon atoms, particularly preferably having 3 to 24 carbon atoms; and examples thereof include a trimethylsilyloxy group and a triphenylsilyloxy group).

The substituent represented by $R^{C11}$, $R^{C12}$, $R^{C13}$ or $R^{C14}$ is preferably an alkyl group, an aryl group, or such a group that at least one 5-membered ring is formed by bonding between $R^{C11}$ and $R^{C12}$ and/or bonding between $R^{C13}$ and $R^{C14}$. In a particularly preferable embodiment, $R^{C11}$ and $R^{C12}$ are bonded to each other to form a 5-membered ring and/or $R^{C13}$ and $R^{C14}$ are bonded to each other to form a 5-membered ring.

The compound represented by Formula (C-1) is more preferably a compound represented by Formula (C-2).

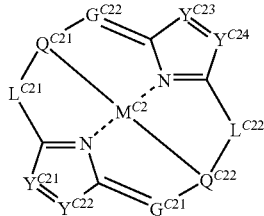

Formula (C-2)

In Formula (C-2), $M^{C2}$ represents a metal ion.

$Y^{C21}, Y^{C22}, Y^{C23}$ and $Y^{C24}$ each independently represent a nitrogen atom or a substituted or unsubstituted carbon atom. $G^{C21}$ and $G^{C22}$ each independently represent a nitrogen atom or a substituted or unsubstituted carbon atom. $L^{C21}$ and $L^{C22}$ each independently represent a connecting group. $Q^{C21}$ and $Q^{C22}$ each independently represent a partial structure containing an atom bonded to $M^{C2}$ by a coordination bond, an ionic bond, or a covalent bond.

Formula (C-2) will be described in detail.

In Formula (C-2), $M^{C2}$, $L^{C21}$, $L^{C21}$, $L^{C22}$, $Q^{C21}$, $Q^{C22}$, $G^{C21}$ and $G^{C22}$ have the same definitions and preferable ranges as corresponding $M^{C1}$, $L^{C11}$, $L^{C12}$, $Q^{C11}$, $Q^{C12}$, $G^{C11}$ and $G^{C12}$, respectively, in Formula (C-1).

$Y^{C21}, Y^{C22}, Y^{C23}$ and $Y^{C24}$ each independently represent a nitrogen atom or a substituted or unsubstituted carbon atom, preferably a substituted or unsubstituted carbon atom, and more preferably an unsubstituted carbon atom.

The compound represented by Formula (C-2) is more preferably a compound represented by the following Formula (C-3), (C-4) or (C-5).

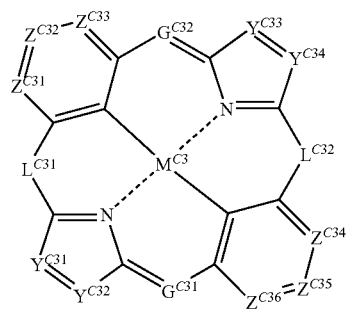

Formula (C-3)

In Formula (C-3), $M^{C3}$ represents a metal ion.

$Y^{C31}, Y^{C32}, Y^{C33}$ and $Y^{C34}$ each independently represent a nitrogen atom or a substituted or unsubstituted carbon atom. $G^{C31}$ and $G^{C32}$ each independently represent a nitrogen atom or a substituted or unsubstituted carbon atom. $L^{C31}$ and $L^{C32}$ each independently represent a connecting group. $Z^{C31}, Z^{C32}, Z^{C33}, Z^{C34}, Z^{C35}$ and $Z^{C36}$ each independently represent a nitrogen atom or a substituted or unsubstituted carbon atom.

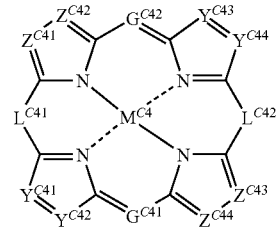

Formula (C-4)

In Formula (C-4), $M^{C4}$ represents a metal ion.

$Y^{C41}, Y^{C42}, Y^{C43}$ and $Y^{C44}$ each independently represent a nitrogen atom or a substituted or unsubstituted carbon atom. $G^{C41}$ and $G^{C42}$ each independently represent a nitrogen atom or a substituted or unsubstituted carbon atom. $L^{C41}$ and $L^{C42}$ each independently represent a connecting group. $Z^{C41}, Z^{C42}, Z^{C43}$ and $Z^{C44}$ each independently represent a nitrogen atom or a substituted or unsubstituted carbon atom.

Formula (C-5)

In Formula (C-5), $M^{C5}$ represents a metal ion.

$Y^{C51}, Y^{C52}, Y^{C53}$ and $Y^{C54}$ each independently represent a nitrogen atom or a substituted or unsubstituted carbon atom. $G^{C51}$ and $G^{C52}$ each independently represent a nitrogen atom or a substituted or unsubstituted carbon atom. $L^{C51}$ and $L^{C52}$ each independently represent a connecting group. $Z^{C51}, Z^{C52}, Z^{C53}, Z^{C54}, Z^{C55}$ and $Z^{C56}$ each independently represent a nitrogen atom or a substituted or unsubstituted carbon atom. $X^{C51}$ and $X^{C52}$ each independently represent an oxygen atom, a sulfur atom or a substituted or unsubstituted nitrogen atom.

The compound represented by Formula (C-3) will be described in detail.

In Formula (C-3), $M^{C3}$, $L^{C31}$, $L^{C32}$, $G^{C31}$ and $G^{C32}$ have the same definitions and preferable ranges as corresponding $M^{C1}$, $L^{C11}$, $L^{C12}$, $G^{C11}$ and $G^{C12}$, respectively, in Formula (C-1).

$Z^{C31}, Z^{C32}, Z^{C33}, Z^{C34}, Z^{C35}$ and $Z^{C36}$ each independently represent a nitrogen atom or a substituted or unsubstituted carbon atom. Each of $Z^{C31}, Z^{C32}, Z^{C33}, Z^{C34}, Z^{C35}$ and $Z^{C36}$ is preferably a substituted or unsubstituted carbon atom, and more preferably an unsubstituted carbon atom.

The compound represented by Formula (C-4) is described in more detail.

In Formula (C-4), $M^{C4}$, $L^{C41}$, $L^{C42}$, $G^{C41}$ and $G^{C42}$ have the same definitions and preferable ranges as corresponding $M^{C1}$, $L^{C11}$, $L^{C12}$, $G^{C11}$ and $G^{C12}$, respectively, in Formula (C-1).

$Z^{C41}, Z^{C42}, Z^{C43}$, and $Z^{C44}$ each independently represent a nitrogen atom or a substituted or unsubstituted carbon atom. Each of $Z^{C41}, Z^{C42}, Z^{C43}$ and $Z^{C44}$ is preferably a substituted or unsubstituted carbon atom, and more preferably an unsubstituted carbon atom.

The compound represented by Formula (C-5) is described in more detail.

$M^{C5}$, $L^{C51}$, $L^{C52}$, $G^{C51}$ and $G^{C52}$ have the same definitions and preferable ranges as corresponding $M^{C1}$, $L^{C11}$, $L^{C12}$, $G^{C11}$ and $G^{C12}$, respectively, in Formula (C-1).

$Z^{C51}$, $Z^{C52}$, $Z^{C53}$, $Z^{C54}$, $Z^{C55}$ and $Z^{C56}$ each independently represent a nitrogen atom or a substituted or unsubstituted carbon atom. Each of $Z^{C51}$, $Z^{C52}$, $Z^{C53}$, $Z^{C54}$, $Z^{C55}$ and $Z^{C56}$ is preferably a substituted or unsubstituted carbon atom, and more preferably an unsubstituted carbon atom.

$X^{C51}$ and $X^{C52}$ each independently represent an oxygen atom, a sulfur atom or a substituted or unsubstituted nitrogen atom. Each of $X^{C51}$ and $X^{C52}$ is preferably an oxygen atom or a sulfur atom, and more preferably an oxygen atom.

Specific examples of the compounds represented by Formula (C-1) include, but are not limited to, Compounds (C-1) to (C-63) described in JP-A No. 2007-103493.

An example of preferable metal complexes usable in the invention is a compound represented by the following Formula (D-1).

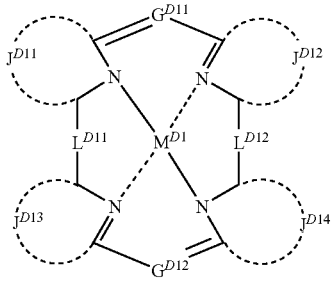

Formula (D-1)

In Formula (D-1), $M^{D1}$ represents a metal ion.

$G^{D11}$ and $G^{D12}$ each independently represent a nitrogen atom or a substituted or unsubstituted carbon atom. $J^{D11}$, $J^{D12}$, $J^{D13}$ and $J^{D14}$ each independently represent an atomic group necessary for forming a 5-membered ring. $L^{D11}$ and $L^{D12}$ each independently represent a connecting group.

Formula (D-1) will be described in detail.

In Formula (D-1), $M^{D1}$, $L^{D11}$ and $L^{D12}$ have the same definitions and preferable ranges as corresponding $M^{A1}$, $L^{A11}$ and $L^{A12}$, respectively, in Formula (A-1).

$G^{D11}$ and $G^{D12}$ have the same definitions and preferable ranges as corresponding $G^{C11}$ and $G^{C12}$, respectively, in Formula (C-1).

$J^{D11}$, $J^{D12}$, $J^{D13}$ and $J^{D14}$ each independently represent an atomic group necessary for forming a nitrogen-containing 5-membered heterocycle containing the atomic group.

The compound represented by Formula (D-1) is more preferably a compound represented by the following Formula (D-2), (D-3) or (D-4).

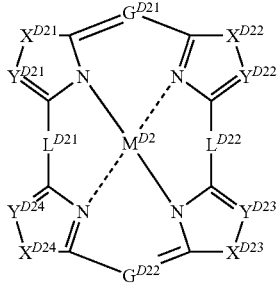

Formula (D-2)

In Formula (D-2), $M^{D2}$ represents a metal ion.

$G^{D21}$ and $G^{D22}$ each independently represent a nitrogen atom or a substituted or unsubstituted carbon atom.

$Y^{D21}$, $Y^{D22}$, $Y^{D23}$ and $Y^{D24}$ each independently represent a nitrogen atom or a substituted or unsubstituted carbon atom.

$X^{D21}$, $X^{D22}$, $X^{D23}$ and $X^{D24}$ each independently represent an oxygen atom, a sulfur atom, —$NR^{D21}$— or —$C(R^{D22})R^{D23}$—.

$R^{D21}$, $R^{D22}$ and $R^{D23}$ each independently represent a hydrogen atom or a substituent. $L^{D21}$ and $L^{D22}$ each independently represent a connecting group.

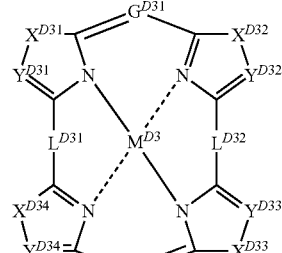

Formula (D-3)

In Formula (D-3), $M^{D3}$ represents a metal ion.

$G^{D31}$ and $G^{D32}$ each independently represent a nitrogen atom or a substituted or unsubstituted carbon atom.

$Y^{D31}$, $Y^{D32}$, $Y^{D33}$ and $Y^{D34}$ each independently represent a nitrogen atom or a substituted or unsubstituted carbon atom.

$X^{D31}$, $X^{D32}$, $X^{D33}$ and $X^{D34}$ each independently represent an oxygen atom, a sulfur atom, —$NR^{D31}$— or —$C(R^{D32})R^{D33}$—.

$R^{D31}$, $R^{D32}$ and $R^{D33}$ each independently represent a hydrogen atom or a substituent. $L^{D31}$ and $L^{D32}$ each independently represent a connecting group.

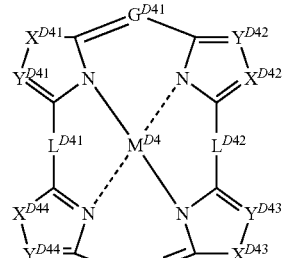

Formula (D-4)

In Formula (D-4), $M^{D4}$ represents a metal ion.

$G^{D41}$ and $G^{D42}$ each independently represent a nitrogen atom or a substituted or unsubstituted carbon atom.

$Y^{D41}$, $Y^{D42}$, $Y^{D43}$ and $Y^{D44}$ each independently represent a nitrogen atom or a substituted or unsubstituted carbon atom.

$X^{D41}$, $X^{D42}$, $X^{D43}$ and $X^{D44}$ each independently represent an oxygen atom, a sulfur atom, —$NR^{D41}$— or —$C(R^{D42})R^{D43}$—. $R^{D41}$, $R^{D42}$ and $R^{D43}$ each independently represent a hydrogen atom or a substituent. $L^{D41}$ and $L^{D42}$ each independently represent a connecting group.

Formula (D-2) will be described in detail.

In Formula (D-2), $M^{D2}$, $L^{D21}$, $L^{D22}$, and $G^{D22}$ have the same definitions as corresponding $M^{D1}$, $L^{D11}$, $L^{D12}$, $G^{D11}$ and $G^{D12}$, respectively, in Formula (D-1), and their preferable examples are also respectively the same.

$Y^{D21}$, $Y^{D22}$, $Y^{D23}$ and $Y^{D24}$ each independently represent a nitrogen atom or a substituted or unsubstituted carbon atom, preferably a substituted or unsubstituted carbon atom, and more preferably an unsubstituted carbon atom.

$X^{D21}$, $X^{D22}$, $X^{D23}$ and $X^{D24}$ each independently represent an oxygen atom, a sulfur atom, —$NR^{D21}$— or —$C(R^{D22})R^{D23}$—, preferably a sulfur atom, —$NR^{D21}$— or —$C(R^{D22})R^{D23}$—, more preferably —$NR^{D21}$— or —$C(R^{D22})R^{D23}$—, and further more preferably —$NR^{D21}$—.

$R^{D21}$, $R^{D22}$ and $R^{D23}$ each independently represent a hydrogen atom or a substituent. The substituent represented by $R^{D21}$, $R^{D22}$ or $R^{D23}$ may be, for example, an alkyl group (preferably having 1 to 20 carbon atoms, more preferably having 1 to 12 carbon atoms, particularly preferably having 1 to 8 carbon atoms, and examples thereof include a methyl group, an ethyl group, an iso-propyl group, a tert-butyl group, a n-octyl group, a n-decyl group, a n-hexadecyl group, a cyclopropyl group, a cyclopentyl group, and a cyclohexyl group), an alkenyl group (preferably having 2 to 20 carbon atoms, more preferably having 2 to 12 carbon atoms, particularly preferably having 2 to 8 carbon atoms, and examples thereof include a vinyl group, an allyl group, a 2-butenyl group, and a 3-pentenyl group), an alkynyl group (preferably having 2 to 20 carbon atoms, more preferably having 2 to 12 carbon atoms, particularly preferably having 2 to 8 carbon atoms, and examples thereof include a propargyl group and a 3-pentynyl group), an aryl group (preferably having 6 to 30 carbon atoms, more preferably having 6 to 20 carbon atoms, particularly preferably having 6 to 12 carbon atoms group, and examples thereof include a phenyl group, a p-methylphenyl group, and a naphthyl group), a substituted carbonyl group (preferably having 1 to 20 carbon atoms, more preferably having 1 to 16 carbon atoms, particularly preferably having 1 to 12 carbon atoms group, and examples thereof include an acetyl group, a benzoyl group, a methoxycarbonyl group, a phenyloxycarbonyl group, a dimethylaminocarbonyl group, and a phenylaminocarbonyl group), a substituted sulfonyl group (preferably having 1 to 20 carbon atoms, more preferably having 1 to 16 carbon atoms, particularly preferably having 1 to 12 carbon atoms group, and examples thereof include a mesyl group and a tosyl group), or a heterocyclic group (such as an aliphatic heterocyclic group or an aromatic heterocyclic group, the heterocyclic group preferably having 1 to 50 carbon atoms, more preferably having 1 to 30 carbon atoms, more preferably having 2 to 12 carbon atoms, and preferably containing an oxygen atom, a sulfur atom or a nitrogen atom, and examples thereof include an imidazolyl group, a pyridyl group, a furyl group, a piperidyl group, a morpholino group, a benzoxazolyl group, and a triazolyl group). Each of $R^{D21}$, $R^{D22}$ and $R^{D23}$ is preferably an alkyl group, aryl group or aromatic heterocyclic group, more preferably an alkyl or aryl group, and still more preferably an aryl group.

Formula (D-3) will be described in detail.

In Formula (D-3), $M^{D3}$, $L^{D31}$, $L^{D32}$, $G^{D31}$ and $G^{D32}$ have the same definitions and preferable ranges as corresponding $M^{D1}$, $L^{D11}$, $L^{D12}$, $G^{D11}$ and $G^{D12}$, respectively, in Formula (D-1).

$X^{D31}$, $X^{D32}$, $X^{D33}$ and $X^{D34}$ have the same definitions and preferable ranges as corresponding $X^{D21}$, $X^{D22}$, $X^{D23}$ and $X^{D24}$, respectively, in Formula (D-2).

$Y^{D31}$, $Y^{D32}$, $Y^{D33}$ and $Y^{D34}$ have the same definitions as corresponding $Y^{D21}$, $Y^{D22}$, $Y^{D23}$ and $Y^{D24}$, respectively, in Formula (D-2), and their preferable examples are also respectively the same.

Formula (D-4) will be described in detail.

In Formula (D-4), $M^{D4}$, $L^{D41}$, $L^{D42}$, $G^{D41}$ and $G^{42}$ have the same definitions as corresponding $M^{D1}$, $L^{D11}$, $L^{D12}$, $G^{D11}$ and $G^{D12}$, respectively, in Formula (D-1), and their preferable examples are also respectively the same.

$X^{D41}$, $X^{D42}$, $X^{D43}$ and $X^{D44}$ have the same definitions as corresponding $X^{D21}$, $X^{D22}$, $X^{D23}$ and $X^{D24}$, respectively, in Formula (D-2), and their preferable examples are also respectively the same. $Y^{D41}$, $Y^{D42}$, $Y^{D43}$ and $Y^{D44}$ have the same definitions as corresponding $Y^{D21}$, $Y^{D22}$, $Y^{D23}$ and $Y^{D24}$, respectively, in Formula (D-2), and their preferable examples are also respectively the same.

Specific examples of the compounds represented by Formula (D-1) include, but are not limited to, Compounds (D-1) to (D-24) described in JP-A No. 2007-103493.

An example of preferable metal complexes usable in the invention is a compound represented by the following Formula (E-1).

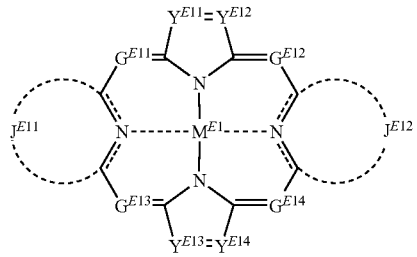

Formula (E-1)

In Formula (E-1), $M^{E1}$ represents a metal ion. $J^{E11}$ and $J^{E12}$ each independently represent an atomic group necessary for forming a 5-membered ring. $G^{E11}$, $G^{E12}$, $G^{E13}$ and $G^{E14}$ each independently represent a nitrogen atom or a substituted or unsubstituted carbon atom. $Y^{E11}$, $Y^{E12}$, $Y^{E13}$ and $Y^{E14}$ each independently represent a nitrogen atom or a substituted or unsubstituted carbon atom.

Formula (E-1) will be described in detail.

In Formula (E-1), $M^{E1}$ has the same definition as $M^{A1}$ in Formula (A-1), and its preferable examples are also the same. $G^{E11}$, $G^{E12}$, $G^{E13}$ and $G^{E14}$ have the same definition as $G^{C11}$ and $G^{C12}$ in Formula (C-1), and their preferable examples are also the same.

$J^{E11}$ and $J^{E12}$ have the same definition as $J^{D11}$ to $J^{D14}$ in Formula (D-1), and their preferable examples are also the same. $Y^{E11}$, $Y^{E12}$, $Y^{E13}$ and $Y^{E14}$ have the same definitions as corresponding $Y^{C21}$ to $Y^{C24}$, respectively, in Formula (C-2), and their preferable examples are also respectively the same.

The compound represented by Formula (E-1) is more preferably a compound represented by the following Formula (E-2) or (E-3).

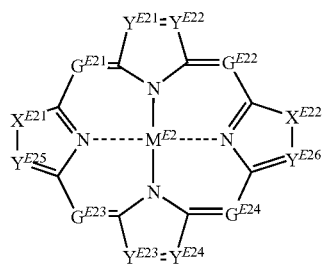

Formula (E-2)

In Formula (F-2), $M^{E2}$ represents a metal ion. $G^{E21}$, $G^{E22}$, $G^{E23}$ and $G^{E24}$ each independently represent a nitrogen atom or a substituted or unsubstituted carbon atom. $Y^{E21}$, $Y^{E22}$, $Y^{E23}$, $Y^{E24}$, $Y^{E25}$ and $Y^{E26}$ each independently represent a nitrogen atom or a substituted or unsubstituted carbon atom. $X^{E21}$ and $X^{E22}$ each independently represent an oxygen atom, a sulfur atom, $-NR^{E21}-$ or $-C(R^{E22})R^{E23}-$. $R^{E21}$, $R^{E22}$ and $R^{E23}$ each independently represent a hydrogen atom or a substituent.

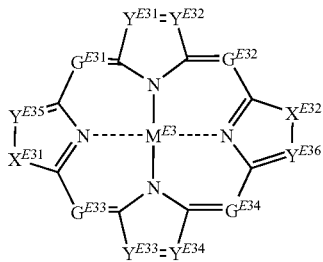

Formula (E-3)

In Formula (E-3), $M^{E3}$ represents a metal ion. $G^{E31}$, $G^{E32}$, $G^{E33}$ and $G^{E34}$ each independently represent a nitrogen atom or a substituted or unsubstituted carbon atom. $Y^{E31}$, $Y^{E32}$, $Y^{E33}$, $Y^{E34}$, $Y^{E35}$ and $Y^{E36}$ each independently represent a nitrogen atom or a substituted or unsubstituted carbon atom. $X^{E31}$ and $X^{E32}$ each independently represent an oxygen atom, a sulfur atom, $-NR^{E31}-$ or $-C(R^{E32})R^{E33}-$. $R^{E31}$, $R^{E32}$ and $R^{E33}$ each independently represent a hydrogen atom or a substituent.

Formula (E-2) will be described in detail.

In Formula (E-2), $M^{E2}$, $G^{E21}$, $G^{E22}$, $G^{E23}$, $G^{E24}$, $Y^{E21}$, $Y^{E22}$, $Y^{E23}$ and $Y^{E24}$ have the same definitions as corresponding $M^{E1}$, $G^{E11}$, $G^{E12}$, $G^{E13}$, $G^{E14}$, $Y^{E11}$, $Y^{E12}$, $Y^{E13}$ and $Y^{E14}$, respectively, in Formula (E-1), and their preferable examples are also respectively the same. $X^{E21}$ and $X^{E22}$ have the same definitions as corresponding $X^{D21}$ and $X^{D22}$, respectively, in Formula (D-2), and their preferable examples are also respectively the same.

Formula (E-3) will be described in detail.

In Formula (E-3), $M^{E3}$, $G^{E31}$, $G^{E32}$, $G^{E33}$, $G^{E34}$, $Y^{E31}$, $Y^{E32}$, $Y^{E33}$ and $Y^{E34}$ have the same definitions as corresponding $M^{E1}$, $G^{E11}$, $G^{E12}$, $G^{E13}$, $G^{E14}$, $Y^{E11}$, $Y^{E12}$, $Y^{E13}$ and $Y^{E14}$, respectively, in Formula (E-1), and their preferable examples are also respectively the same. $X^{E31}$ and $X^{E32}$ have the same definitions as corresponding $X^{E21}$ and $X^{E22}$, respectively, in Formula (E-2), and their preferable examples are also respectively the same.

Specific examples of the compounds represented by Formula (E-1) include, but are not limited to, Compounds (E-1) to (E-15) described in JP-A No. 2007-103493.

An example of metal complexes usable in the invention is a compound represented by the following Formula (F-1).

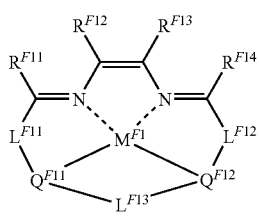

Formula (F-1)

In Formula (F-1), $M^{F1}$ represents a metal ion. $L^{F11}$, $L^{F12}$ and $L^{F13}$ each independently represent a connecting group. $R^{F11}$, $R^{F12}$, $R^{F13}$ and $R^{F14}$ each independently represent a hydrogen atom or a substituent. $R^{F11}$ and $R^{F12}$ may, if possible, be bonded to each other to form a 5-membered ring. $R^{F12}$ and $R^{F13}$ may, if possible, be bonded to each other to form a ring. $R^{F13}$ and $R^{F14}$ may, if possible, be bonded to each other to form a 5-membered ring. $Q^{F11}$ and $Q^{F12}$ each independently represent a partial structure containing an atom bonded to $M^{F1}$ by a coordination bond, an ionic bond, or a covalent bond.

The compound represented by Formula (F-1) will be described in detail.

In Formula (F-1), $M^{F1}$, $L^{F11}$, $L^{F12}$, $L^{F13}$, $Q^{F11}$ and $Q^{F12}$ have the same definitions as corresponding $M^{A1}$, $L^{A11}$, $L^{A12}$, $L^{A13}$, $Q^{A11}$ and $Q^{A12}$, respectively, in Formula (A-1), and their preferable examples are also respectively the same. $R^{F11}$, $R^{F12}$, $R^{F13}$ and $R^{F14}$ each independently represent a hydrogen atom or a substituent. $R^{F11}$ and $R^{F12}$ may, if possible, be bonded to each other to form a 5-membered ring. $R^{F12}$ and $R^{F13}$ may, if possible, be bonded to each other to form a ring. $R^{F13}$ and $R^{F14}$ may, if possible, be bonded to each other to form a 5-membered ring. The substituents represented by $R^{F11}$, $R^{F12}$, $R^{F13}$ and $R^{F14}$ may be selected from the above-mentioned examples of the substituents represented by corresponding $R^{C11}$ to $R^{C14}$ in Formula (C-1). In a preferable embodiment, $R^{F11}$ and $R^{F12}$ are bonded to each other to form a 5-membered ring, and $R^{F13}$ and $R^{F14}$ are bonded to each other to form a 5-membered ring. In another preferable embodiment, $R^{F12}$ and $R^{F13}$ are bonded to each other to form an aromatic ring.

The compound represented by Formula (F-1) is more preferably a compound represented by Formula (F-2), (F-3) or (F-4).

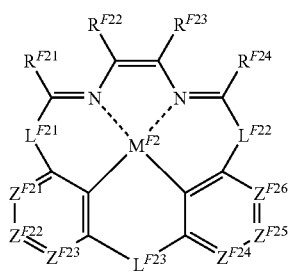

Formula (F-2)

In Formula (F-2), $M^{F2}$ represents a metal ion. $L^{F21}$, $L^{F22}$ and $L^{F23}$ each independently represent a connecting group. $R^{F21}$, $R^{F22}$, $R^{F23}$ and $R^{F24}$ each independently represent a substituent. $R^{F21}$ and $R^{F22}$ may, if possible, be bonded to each other to form a 5-membered ring. $R^{F22}$ and $R^{F23}$ may, if possible, be bonded to each other to form a ring. $R^{F23}$ and $R^{F24}$ may, if possible, be bonded to each other to form a 5-membered ring. $Z^{F21}$, $Z^{F22}$, $Z^{F23}$, $Z^{F24}$, $Z^{F25}$ and $Z^{F26}$ each independently represent a nitrogen atom or a substituted or unsubstituted carbon atom.

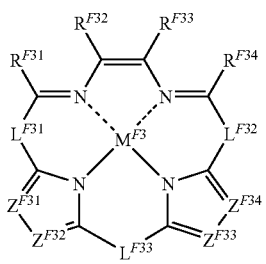

Formula (F-3)

In Formula (F-3), $M^{F3}$ represents a metal ion. $L^{F31}$, $L^{F32}$ and $L^{F33}$ each independently represent a connecting group. $R^{F31}$, $R^{F32}$, $R^{F33}$ and $R^{F34}$ each independently represent a substituent. $R^{F31}$ and $R^{F32}$ may, if possible, be bonded to each other to form a 5-membered ring. $R^{F32}$ and $R^{F33}$ may, if possible, be bonded to each other to form a ring. $R^{F33}$ and $R^{F34}$ may, if possible, be bonded to each other to form a 5-membered ring. $Z^{F31}$, $Z^{F32}$, $Z^{F33}$ and $Z^{F34}$ each independently represent a nitrogen atom or a substituted or unsubstituted carbon atom.

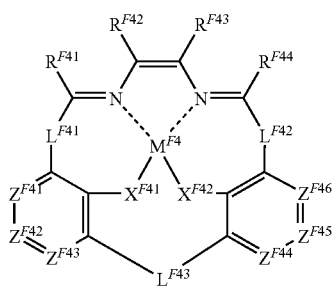

Formula (F-4)

In Formula (F-4), $M^{F4}$ represents a metal ion. $L^{F41}$, $L^{F42}$ and $L^{F43}$ each independently represent a connecting group. $R^{F41}$, $R^{F42}$, $R^{F43}$ and $R^{F44}$ each independently represent a substituent. $R^{F41}$ and $R^{F42}$ may, if possible, be bonded to each other to form a 5-membered ring. $R^{F42}$ and $R^{F43}$ may, if possible, be bonded to each other to form a ring. $R^{F43}$ and $R^{F44}$ may, if possible, be bonded to each other to form a 5-membered ring. $Z^{F41}$, $Z^{F42}$, $Z^{F43}$, $Z^{F44}$, $Z^{F45}$ and $Z^{F46}$ each independently represent a nitrogen atom or a substituted or unsubstituted carbon atom. $X^{F41}$ and $X^{F42}$ each independently represent an oxygen atom, a sulfur atom or a substituted or unsubstituted nitrogen atom.

The compound represented by Formula (F-2) will be described in detail.

$M^{F2}$, $L^{F21}$, $L^{F22}$, $L^{F23}$, $R^{F21}$, $R^{F22}$, $R^{F23}$ and $R^{F24}$ have the same definitions as corresponding $M^{F1}$, $L^{F11}$, $L^{F12}$, $L^{F13}$, $R^{F11}$, $R^{F12}$, $R^{F13}$ and $R^{F14}$, respectively, in Formula (F-1), and their preferable examples are also respectively the same.

$Z^{F21}$, $Z^{F22}$, $Z^{F23}$, $Z^{F24}$, $Z^{F25}$ and $Z^{F26}$ each independently represent a nitrogen atom or a substituted or unsubstituted carbon atom. Each of $Z^{F21}$, $Z^{F22}$, $Z^{F23}$, $Z^{F24}$, $Z^{F25}$ and $Z^{F26}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

The compound represented by Formula (F-3) will be described in detail.

In Formula (F-3), $M^{F3}$, $L^{F31}$, $L^{F32}$, $L^{F33}$, $R^{F31}$, $R^{F32}$, $R^{F33}$ and $R^{F34}$ have the same definitions as corresponding $M^{F1}$, $L^{F11}$, $L^{F12}$, $L^{F13}$, $R^{F11}$, $R^{F12}$, $R^{F13}$ and $R^{14}$, respectively, in Formula (F-1), and their preferable examples are also respectively the same. $Z^{F31}$, $Z^{F32}$, $Z^{F33}$ and $Z^{F34}$ each independently represent a nitrogen atom or a substituted or unsubstituted carbon atom. Each of $Z^{F31}$, $Z^{F32}$, $Z^{F33}$ and $Z^{F34}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

The compound represented by Formula (F-4) will be described in detail.

In Formula (F-4), $M^{F4}$, $L^{F41}$, $L^{F42}$, $L^{F43}$, $R^{F41}$, $R^{F42}$, $R^{F43}$ and $R^{F44}$ have the same definitions as corresponding $M^{F1}$, $L^{F11}$, $L^{F12}$, $L^{F13}$, $R^{F11}$, $R^{F12}$, $R^{F13}$ and $R^{F14}$, respectively, in Formula (F-1), and their preferable examples are also respectively the same.

$Z^{F41}$, $Z^{F42}$, $Z^{F43}$, $Z^{F44}$, $Z^{F45}$ and $Z^{F46}$ each independently represent a nitrogen atom or a substituted or unsubstituted carbon atom. Each of $Z^{F41}$, $Z^{F42}$, $Z^{F43}$, $Z^{F44}$, $Z^{F45}$ and $Z^{F46}$ is preferably a substituted or unsubstituted carbon atom, and more preferably an unsubstituted carbon atom. When the carbon atom is substituted, the substituent may be selected from the above-mentioned examples of the substituent on the divalent connecting group represented by $L^{A11}$, $L^{A12}$, $L^{A13}$ or $L^{A14}$ in Formula (A-1).

$X^{F41}$ and $X^{F42}$ each independently represent an oxygen atom, a sulfur atom or a substituted or unsubstituted nitrogen atom. Each of $X^{F41}$ and $X^{F42}$ is preferably an oxygen atom or a sulfur atom, and more preferably an oxygen atom.

Specific examples of the compounds represented by Formula (F-1) include, but are not limited to, Compounds (F-1) to (F-52) described in JP-A No. 2007-103493.

Compounds represented by any one of Formulae (A-1) to (F-1) can be synthesized by known methods.

<Hole Transporting Host Material>

The hole transporting host material used in the light-emitting layer of the present invention preferably has an ionization potential Ip of from 5.1 eV to 6.4 eV, more preferably has an ionization potential of from 5.4 eV to 6.2 eV, and further preferably has an ionization potential of from 5.6 eV to 6.0 eV from the viewpoints of improvements in durability and reduction in driving voltage. Furthermore, the hole transporting host material preferably has an electron affinity Ea of from 1.2 eV to 3.1 eV, more preferably of from 1.4 eV to 3.0 eV, and further preferably of from 1.8 eV to 2.8 eV from the viewpoints of improvements in durability and reduction in driving voltage.

Specific examples of such a hole transporting host material include: pyrrole, carbazole, indole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinyl carbazole), aniline copolymers, electrically conductive high-molecular oligomers such as thiophene oligomers or polythiophenes; organosilanes, carbon films, and derivatives thereof.

Among these, carbazole derivatives, indole derivatives, aromatic tertiary amine compounds, and thiophene derivatives are preferable. In particular, compounds having, in a molecule thereof, plural skeletons selected from carbazole skeletons, indole skeletons, and aromatic tertiary amine skeletons are preferable. Further, compounds having carbazole skeletons and/or indole skeletons are preferable.

Specific examples of the hole transporting host material include, but are not limited to, the following compounds.

H-1
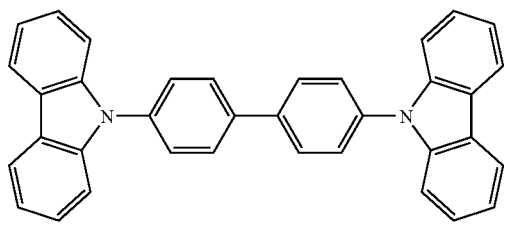

H-2
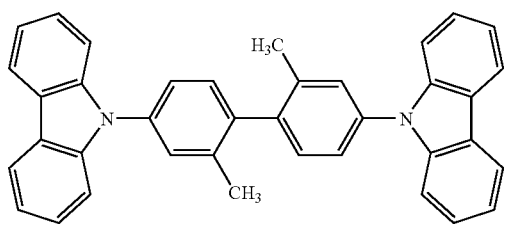

H-3
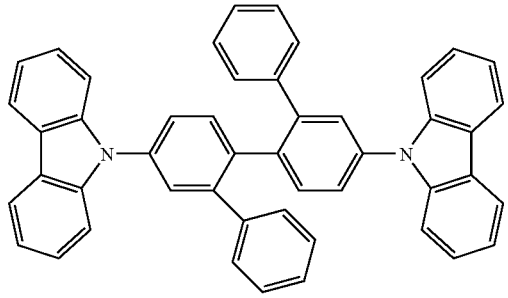

H-4
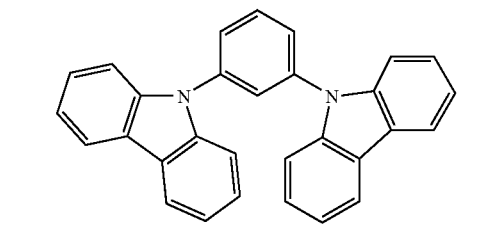

H-5
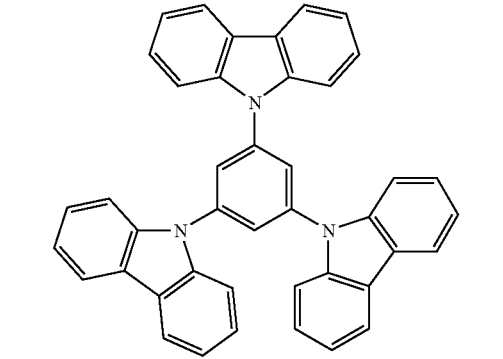

-continued

H-6
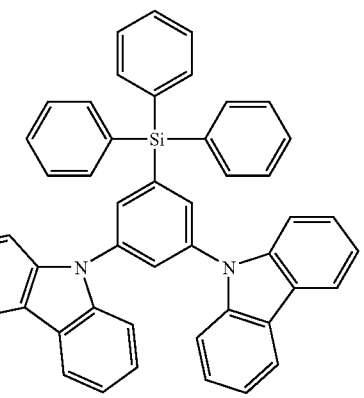

H-7
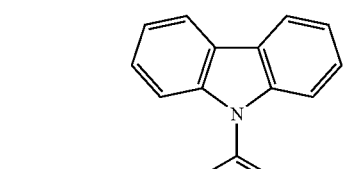

H-8
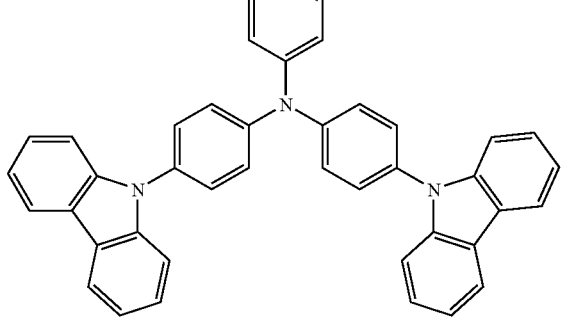

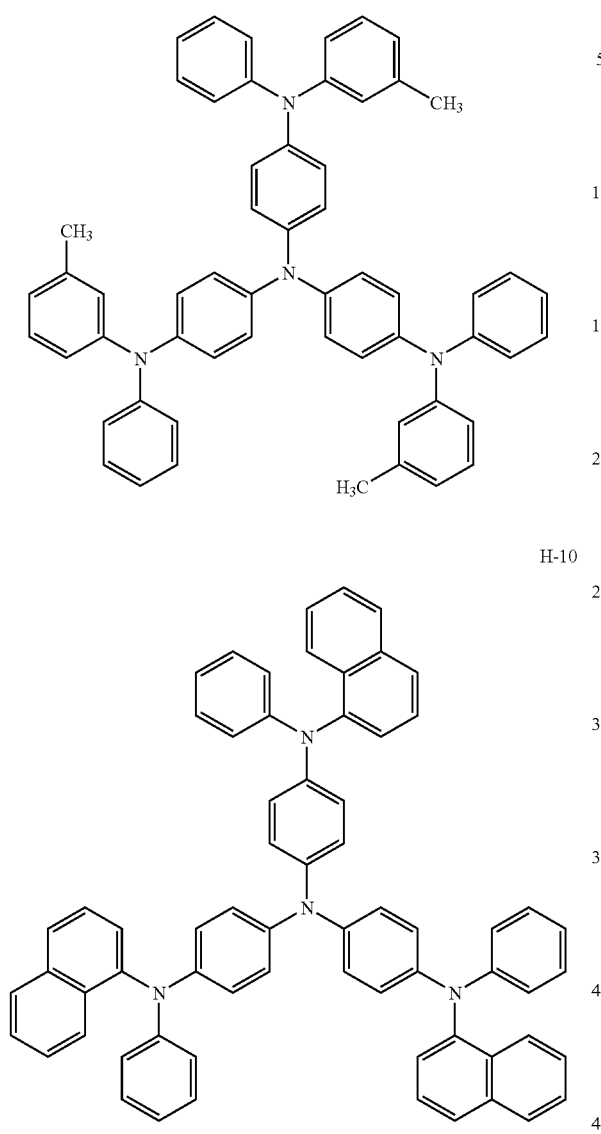
H-9
H-10
H-11
H-12
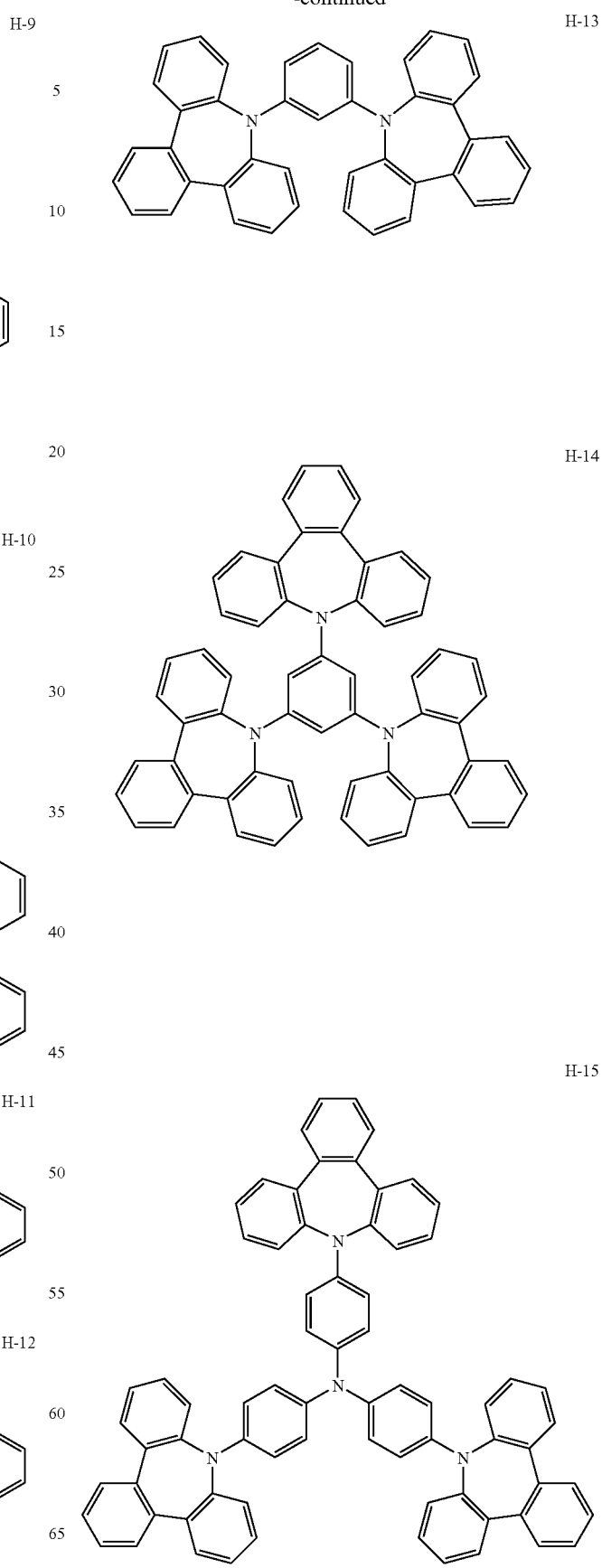
H-13
H-14
H-15

H-16
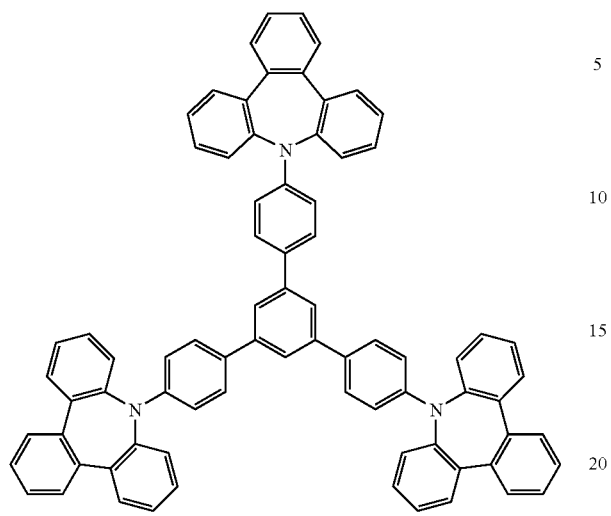
H-17
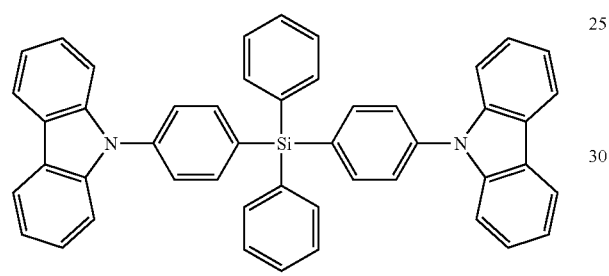
H-18
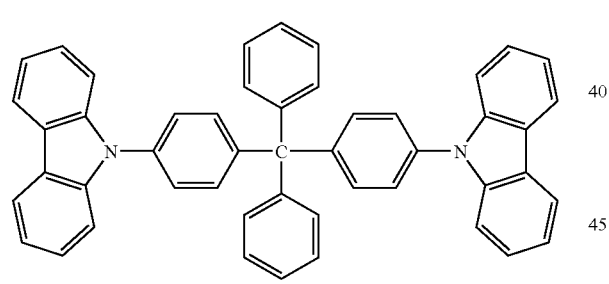
H-19
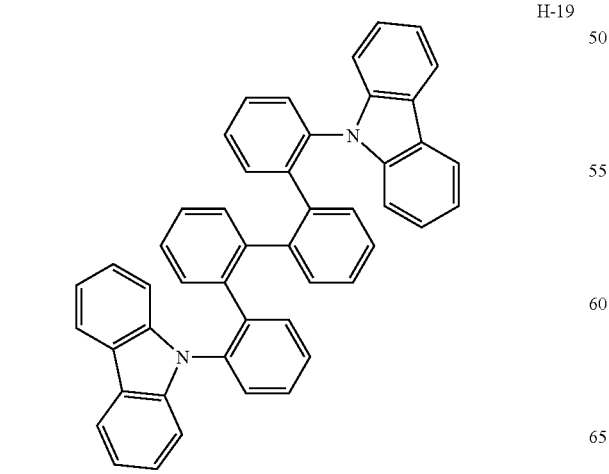
H-20
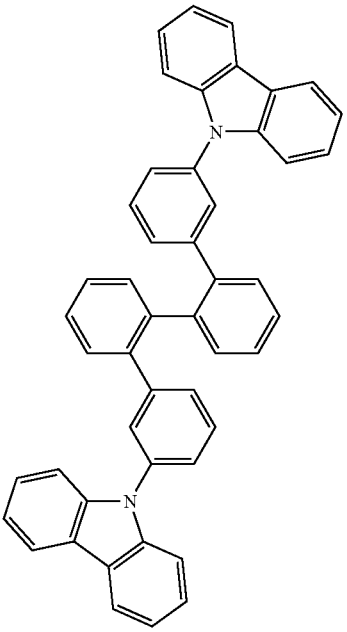
H-21
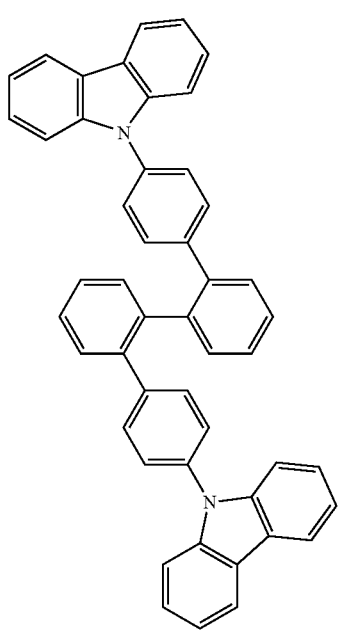

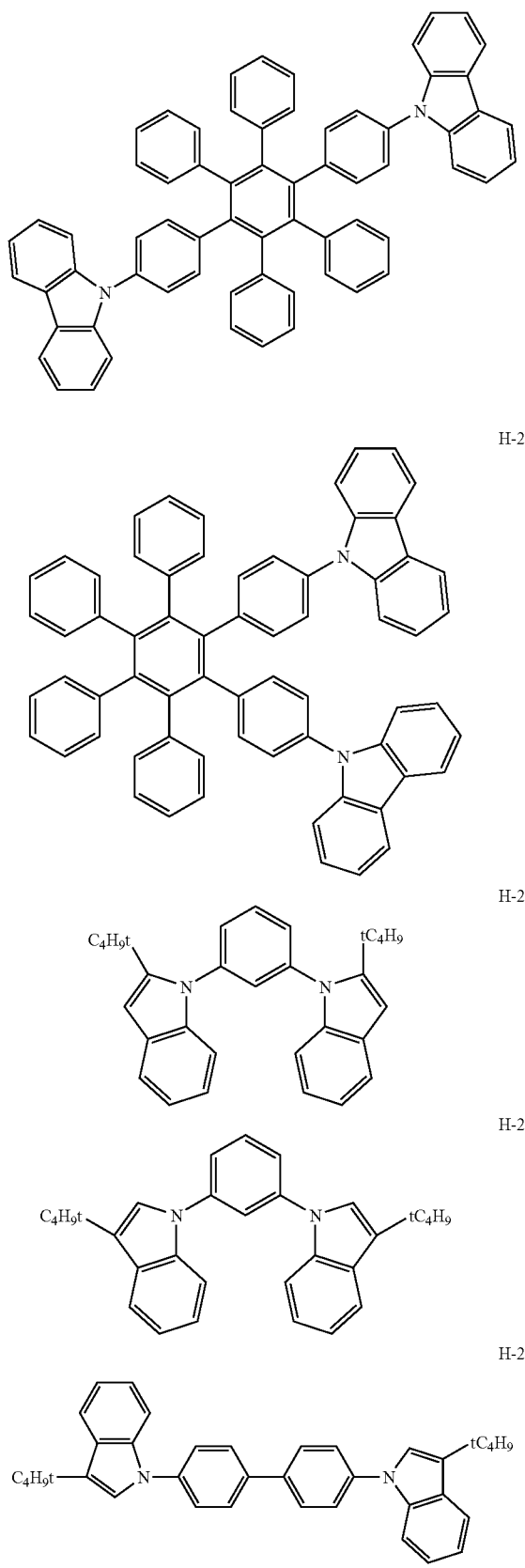

<Mixing Ratio of the Electron Transporting Phosphorescent Material to the Hole Transporting Host Material>

The mixing ratio by mass of the electron transporting phosphorescent material to the hole transporting host material in the light-emitting layer of the present invention is, from the viewpoints of suppressing association light emission and concentration quenching while obtaining sufficient light emission intensity, preferably from 5/95 to 50/50 and more preferably from 10/90 to 30/70 in terms of the grand total in the light-emitting layer.

<Film Thickness>

A film thickness of the light-emitting layer is, from the viewpoints of efficiency of light emission, driving voltage and brightness, preferably from 10 nm to 600 nm, and more preferably from 20 nm to 300 nm. When the thickness of the light-emitting layer is small, although it is operable in high brightness at low driving voltage, the escape of the electric charges from the light-emitting layer is significant, causing reduction in the efficiency of light emission. When the film thickness of the light-emitting layer is large, the driving voltage is higher, so that the applications thereof may be limited.

<Layer Constitution>

The light-emitting layer may be composed of a single layer, two layers or more layers. In an embodiment, plural light-emitting layers emit lights having respectively different luminescent colors. Further, when the light-emitting layer has a laminated structure, although the thickness of each of the layers contained in the laminated structure is not particularly limited, the total film thickness of the respective light-emitting layers preferably falls within the above-mentioned range.

3. Hole-Injection Layer and Hole-Transport Layer

The hole-injection layer and the hole-transport layer are layers functioning to receive holes from the anode or from the anode side and to transport the holes to the cathode side. Specifically, the hole-injection layer and hole-transport layer preferably include substances selected from, for example, pyrrole derivatives, carbazole derivatives, indole derivatives, imidazole derivatives, polyarylalkane derivatives, pyrazoline derivatives, pyrazolone derivatives, phenylenediamine derivatives, arylamine derivatives, amino substituted chalcone derivatives, styrylanthracene derivatives, fluorenone derivatives, hydrazone derivatives, stilbene derivatives, silazane derivatives, aromatic tertiary amine compounds, styrylamine compounds, an aromatic dimethylidine compounds, porphyrin compounds, organosilane derivatives, and carbon.

At least one of the hole-injection layer and hole-transport layer in the organic EL device of the present invention may preferably contain an electron-accepting dopant from the viewpoints of reduction in driving voltage and improvements in driving durability.

The electron-accepting dopant to be introduced into the hole-injection layer or hole-transport layer may be either of an inorganic compound or an organic compound as long as the compound has an electron accepting property and a function to oxidize an organic compound. Specifically, preferable inorganic compounds include halide compounds, such as ferric chloride, aluminum chloride, gallium chloride, indium chloride or antimony pentachloride, and metal oxides such as vanadium pentoxide or molybdenum trioxide.

When the electron-accepting dopant is an organic compound, the compound is preferably a compound having a substituent such as a nitro group, a halogen group, a cyano group, a trifluoromethyl group, a quinone compound, an acid anhydride compound or a fullerene.

Specific examples thereof include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, fullerene C60 and fullerene C70.

Other specific examples include compounds described in patent documents such as JP-A Nos. 6-212153, 11-111463, 11-251067, 2000-196140, 2000-286054, 2000-315580, 2001-102175, 2001-160493, 2002-252085, 2002-56985, 2003-157981, 2003-217862, 2003-229278, 2004-342614, 2005-72012, 2005-166637, and 2005-209643.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6-dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, and C60 are preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone and 2,3,5,6-tetracyano pyridine are more preferable, and tetrafluorotetracyanoquinodimethane is particularly preferable.

Only a single electron-accepting dopant may be used, or, alternatively, two or more electron-accepting dopants may be used in combination. Although the amount of the electron-accepting dopant to be used varies depending on the kind of the material, the amount is preferably from 0.01% by mass to 50% by mass with respect to the hole-transport layer material, more preferably from 0.05% by mass to 20% by mass, and still more preferably from 0.1% by mass to 10% by mass. When the amount of the electron-accepting dopant is less than 0.01% by mass with respect to the hole-transport material, effects of the present invention may not be obtained sufficiently. When the amount exceeds 50% by mass, hole transporting ability may be deteriorated.

The thicknesses of the hole-injection layer and the hole-transport layer are respectively preferably 500 nm or less from the viewpoints of reduction in driving voltage.

The thickness of the hole-transport layer is preferably from 1 to 500 nm, more preferably from 5 to 100 nm. Further the thickness of the hole-injection layer is preferably from 0.1 to 500 nm, more preferably from 1 to 300 nm.

The hole-injection layer and the hole-transport layer each may have a monolayer structure containing one of, or two or more of, the above-mentioned materials. Alternatively, the hole-injection layer and the hole-transport layer each may have a multilayer structure having plural layers whose compositions may be the same or different.

4. Electron-Injection Layer and Electron-Transport Layer

The electron-injection layer and the electron-transport layer are layers functioning to receive electrons from the cathode side and to transport the electrons to the anode side. Specifically, the electron-injection layer and the electron-transport layer preferably include substances selected from, for example, triazole derivatives, oxazole derivatives, oxadiazole derivatives, imidazole derivatives, fluorenone derivatives, anthraquinodimethane derivatives, anthrone derivatives, diphenylquinone derivatives, thiopyrandioxide derivatives, carbodiimide derivatives, fluorenylidenemethane derivatives, distyrylpyrazine derivatives, tetracarboxylic acid anhydrides having an aromatic ring such as naphthalene ring or perylene ring, phthalocyanine derivatives, various metal complexes such as metal complexes of 8-quinolinol derivatives and metal complexes having phthalocyanine, benzoxazole or benzothiazole as a ligand, and organosilane derivatives.

At least one of the electron-injection layer and electron-transport layer in the organic EL device of the present invention may preferably contain an electron-donating dopant from the viewpoints of reduction in driving voltage and improvements in driving durability.

The electron-donating dopant to be introduced into the electron-injection layer or electron-transport layer has electron donating property and can reduce an organic compound. Examples of the electron-donating dopant include alkaline metals such as Li, alkaline-earth metals such as Mg, transition metals including rare earth metals and reductive organic compounds.

The metals are preferable metals having a work function of 4.2 eV or less, and specific examples include Li, Na, K, Be, Mg, Ca, Sr, Ba, Y, Cs, La, Sm, Gd and Yb.

Examples of the reductive organic compounds include nitrogen-containing compounds, sulfur-containing compounds, and phosphorus-containing compound. In addition, materials described, for example, in JP-A Nos. 6-212153, 2000-196140, 2003-68468, 2003-229278, and 2004-342614 can be preferably used as the electron-donating dopant.

Only a single electron-donating dopant may be used, or, alternatively, two or more electron-donating dopants may be used in combination. Although the amount of the electron-donating dopant to be used varies depending on the kind of the material, the amount is preferably from 0.1% by mass to 99% by mass with respect to the material constituting the electron-transport layer, more preferably from 1.0% by mass to 80% by mass, and still more preferably from 2.0% by mass to 70% by mass. When the amount of the electron-donating dopant is less than 0.1% by mass with respect to the electron-transport layer material, effects of the present invention may not be obtained sufficiently. When the amount exceeds 99% by mass, electron transporting ability may be deteriorated.

The thicknesses of the electron-injection layer and the electron-transport layer are respectively preferably 500 nm or less from the viewpoints of reduction in driving voltage.

The thickness of the electron-transport layer is preferably from 1 to 500 nm, more preferably from 10 to 100 nm. Further the thickness of the electron-injection layer is preferably from 0.1 to 200 nm, more preferably from 0.5 to 50 nm.

The electron-injection layer and the electron-transport layer each may have a monolayer structure containing one of, or two or more of, the above-mentioned materials. Alternatively, the electron-injection layer and the electron transport layer each may have a multilayer structure having plural layers whose compositions may be the same or different.

When the electron-transport layer is a layer adjoining the light-emitting layer, the material constituting the electron-transport layer may be a material having an ionization potential of 6.0 eV or less from the viewpoint of improving durability.

5. Substrate

It is preferable that the substrate used in the present invention does not scatter or attenuate the light emitted from the organic compound layer. Specific examples of materials for the substrate include: zirconia-stabilized yttrium (YSZ); inorganic materials such as glass; polyesters such as polyethylene telephthalate, polybutylene phthalate, and polyethylenenaphthalate; and organic materials such as polystyrene, polycarbonate, polyethersulfon, polyarylate, polyimide, polycycloolefin, norbornene resin, and poly(chlorotrifluoroethylene).

For instance, when glass is used as the substrate, the glass is preferably non-alkali glass in order to decrease ions eluted from the glass. Further, when using soda-lime glass, the soda-lime glass preferably has a barrier coat such as silica that has been provided thereon. On the other hand, when using an organic material, the organic material preferably has excellent heat resistance, dimensional stability, solvent resistance, electrical insulation and processability.

There is no particular limitation on the shape, structure, size, and the like of the substrate, and they may be suitably selected according to the application, purposes and the like of the luminescent device. In general, the shape of the substrate is preferably a plate-shape. The structure of the substrate may be a monolayer structure or a laminated structure. Furthermore, the substrate may be configured by a single member or by two or more members.

Although the substrate may be colorless transparent, or colored transparent, the substrate is preferably colorless transparent from the viewpoint that the substrate does not scatter or attenuate the light emitted from the organic light-emitting layer.

A moisture permeation preventive layer (gas barrier layer) may be provided on the front surface or back surface of the substrate.

As the material for the moisture permeation preventive layer (gas barrier layer), inorganic substances such as silicon nitride and silicon oxide may be preferably used. The moisture permeation preventive layer (gas barrier layer) may be formed by, for example, a high-frequency sputtering method. When using a thermoplastic substrate, one or more of a hard-coat layer or an under-coat layer may be further provided as needed.

6. Electrodes (Anode)

The anode usually has a function as an electrode for supplying holes to an organic compound layer, and there is no particular limitation as to the shape, structure, size and the like of the anode. Further, the anode material may be suitably selected from among well-known electrode materials according to the application and purpose of the luminescent device. As mentioned above, the anode is usually provided as a transparent anode.

The anode material is preferably, for example, a metal, an alloy, a metal oxide, an electrically conductive compound, or a mixture of one or more of these substances, and preferably has a work function of 4.0 eV or more. Specific examples of the anode material include: electrically conductive metal oxides such as tin oxides doped with antimony or fluorine (ATO or FTO); tin oxide, zinc oxide, indium oxide, indium tin oxide (ITO), or indium zinc oxide (IZO); metals such as gold, silver, chromium, or nickel; mixtures or laminates of these metals and electrically conductive metal oxides; inorganic electrically conductive materials such as copper, iodide or copper sulfide; organic electrically conductive materials such as polyaniline, polythiophene, or polypyrrole; and laminates having those inorganic or organic electrically conductive materials and ITO disposed in layers. Among those, the electrically conductive metal oxides are preferable and particularly, ITO is preferable from the viewpoints of productivity, high electric conductivity, transparency and the like.

The anode may be formed on the substrate in accordance with a method selected from wet processes such as a printing method and a coating method; physical processes such as a vacuum deposition method, a sputtering method, and an ion plating method; and chemical processes such as a CVD method and a plasma-CVD method, in consideration of the suitability to the material constituting the anode. For instance, when ITO is selected as a material for the anode, the anode may be formed in accordance with a DC or high-frequency sputtering method, a vacuum deposition method, an ion plating method or the like.

The position at which the anode is formed is not particularly limited in the organic electroluminescent device of the present invention and may be suitably selected according to the application and purpose of the luminescent device. The anode is preferably formed on the substrate, wherein the anode may be formed on the entire surface at one side of the substrate, or on a part of the surface at one side of the substrate.

With regard to the patterning for forming the anode, a chemical etching process such as photolithography, a physical etching process such as etching by laser, a method of vacuum deposition or sputtering through superposed masks, a lift-off method or a printing method may be used.

The thickness of the anode may be appropriately selected according to the material constituting the anode, and therefore cannot be stipulated definitely. The thickness is usually from about 10 nm to about 50 μm and is preferably from 50 nm to 20 μm.

The value of the resistance of the anode is preferably $10^3$ Ω/sq or less, and more preferably $10^2$ Ω/sq or less. When the anode is transparent, it may be either colorless transparent or colored transparent. For extracting luminescence from the transparent anode side, the light transmittance of the anode is preferably 60% or more, and is more preferably 70% or more.

Concerning the transparent anodes, there is a detailed description in "TOUMEI DENKYOKU-MAKU NO SHIN-TENKAI" (Novel Developments in Transparent Electrode Films) edited by Yutaka Sawada, published by C.M.C. in 1999, the contents of which are applicable to the invention. When a plastic substrate having a low heat resistance is used, it is preferable to form a transparent electrode layer at 150° C. or less, using ITO or IZO.

(Cathode)

The cathode usually has a function as an electrode for injecting electrons to an organic compound layer, and there is no particular limitation as to the shape, structure, size and the like of the cathode. Further, the cathode material may be suitably selected from among well-known electrode materials according to the application and purpose of the luminescent device.

Examples of the cathode material include metals, alloys, metal oxides, electrically conductive compounds, and mixtures thereof, and materials having a work function of 4.5 eV or less are preferred. Specific examples thereof include alkali metals (for example, Li, Na, K, and Cs), alkaline earth metals (for example, Mg and Ca), gold, silver, lead, aluminum, sodium-potassium alloys, lithium-aluminum alloys, magnesium-silver alloys, rare earth metals such as indium or ytterbium. Only one of such materials may be used singly, or, alternatively, two or more of such materials may be used in combination from the viewpoints of achieving both stability and electron injection property.

Among those materials, the material for constituting the cathode is preferably an alkaline metal or alkaline earth metal from the viewpoints of electron injection property, and is preferably a material containing aluminum as a main component from the viewpoints of excellent preservation stability.

The phrase "material containing aluminum as a main component" refers to a material constituted by aluminum alone, as well as alloys or mixtures of aluminum and 0.01% by mass to 10% by mass of an alkaline metal or alkaline earth metal (for example, a lithium-aluminum alloy or a magnesium-aluminum alloy).

Materials for the cathode are described in detail in JP-A Nos. 2-15595 and 5-121172, and the materials described in those documents are applicable to the present invention.

The process for forming the cathode is not particularly limited. The cathode may be formed in accordance with a well-known method. For instance, the cathode may be formed in accordance with a method which is appropriately selected from among wet processes such as a printing method and a coating method; physical processes such as a vacuum deposition method, a sputtering method, and an ion plating method, and chemical processes such as a CVD method and a plasma-CVD method, in consideration of the suitability to the material constituting the cathode. For example, when the cathode material is a metal or the like, the cathode may be formed by, for example, sputtering one metal or sputtering two or more metals simultaneously or sequentially.

With regard to the patterning for forming the cathode, a chemical etching process such as photolithography, a physical etching process such as etching by laser, a method of vacuum vapor deposition or sputtering through superposed masks, a lift-off method or a printing method may be used.

In the present invention, the position at which the cathode is formed is not particularly limited. The cathode may be formed on the whole of a surface of an organic compound layer or on a part of a surface of an organic compound layer.

Furthermore, a dielectric material layer having a thickness of 0.1 to 5 nm and containing a fluoride, oxide or the like of an alkaline metal or alkaline earth metal may be interposed between the cathode and the organic compound layer. The dielectric material layer may be considered to be a kind of electron-injection layer. The dielectric material layer may be formed in accordance with, for example, a vacuum deposition method, a sputtering method, an ion-plating method or the like.

The thickness of the cathode may be appropriately selected according to the material constituting the cathode and therefore cannot be stipulated definitely. The thickness of the cathode is usually from about 10 nm to about 5 μm and preferably from 50 nm to 1 μm.

Moreover, the cathode may be transparent or opaque. The transparent cathode may be formed by preparing a layer of a cathode material in a small thickness of 1 to 10 nm, and further providing a transparent electrically conductive material such as ITO or IZO thereon to form a laminated body.

7. Protective Layer

In the present invention, the whole organic EL device may be protected by a protective layer.

The material included in the protective layer may have a function to prevent a substance that accelerates the deterioration of the device, such as moisture or oxygen, from entering into the device.

Specific examples of the material for the protective layer include: metals such as In, Sn, Pb, Au, Cu, Ag, Al, Ti, or Ni; metal oxides such as MgO, SiO, $SiO_2$, $Al_2O_3$, GeO, NiO, CaO, BaO, $Fe_2O_3$, $Y_2O_3$, or $TiO_2$; metal nitrides such as $SiN_x$, or $SiN_xO_y$; metal fluorides such as $MgF_2$, LiF, $AlF_3$, or $CaF_2$; polyethylene, polypropylene, polymethylmethacrylate, polyimide, polyurea, polytetrafluoroethylene, polychlorotrifluoroethylene, polydichlorodifluoroethylene, a copolymer of chlorotrifluoroethylene and dichlorodifluoroethylene, a copolymer obtained by copolymerizing a mixture of monomers including tetrafluoroethylene and at least one comonomer, fluorine-containing copolymers having ring structures in the main chain of the copolymers, water-absorbent substances having water-absorption of 1% or more, and damp-proof materials having a water absorption of 0.1% or less.

The process for forming the protective layer is not particularly limited. For example, a vacuum deposition method, a sputtering method, a reactive sputtering method, a MBE (Molecular Beam Epitaxy) method, a cluster ion beam method, an ion plating method, a plasma polymerization method (a high-frequency excitation ion plating method), a plasma-CVD method, a laser CVD method, a thermal CVD method, a gas source CVD method, a coating method, a printing method, and a transfer method may be used.

8. Sealing

In the organic electroluminescent device of the present invention, the entire device may be sealed by using a sealing container.

Further, a moisture absorbent or an inert liquid may be used to fill the space between the sealing container and the luminescent device. The moisture absorbent is not particularly limited, and specific examples thereof include barium oxide, sodium oxide, potassium oxide, calcium oxide, sodium sulfate, calcium sulfate, magnesium sulfate, phosphorus pentaoxide, calcium chloride, magnesium chloride, copper chloride, cesium fluoride, niobium fluoride, calcium bromide, vanadium bromide, molecular sieve, zeolite, and magnesium oxide. The inert liquid is not particularly limited, and specific examples thereof include paraffins, liquid paraffins, fluorine-based solvents such as perfluoroalkanes, perfluoroamines, and perfluoroethers, chlorine-based solvents and silicone oils.

9. Driving

In the organic electroluminescent device of the present invention, luminescence can be obtained by applying a DC (AC component may be contained as needed) voltage (usually 2 volts to 15 volts) or a DC current between the anode and the cathode.

Regarding the driving method of the organic electroluminescent device in the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308, for example, may be used.

10. Application

The application of the organic EL device of the present invention is not particularly limited. The device may be suitably applied to a wide variety of fields including displays in portable telephones, personal digital assistants (PDA), computer displays, information displays to be mounted on automobiles, TV monitors and general-purpose lightings.

The disclosure of Japanese Patent Application No. 2007-196674 is incorporated herein by reference.

EXAMPLES

In the following, examples of the organic EL device in the present invention will be described. However, the examples should not be construed as limiting the invention.

Example 1

1. Preparation of the Organic EL Device
(Preparation of Comparative Organic EL Device 1)

A 2.5 cm square glass substrate with a thickness of 0.5 mm on which indium tin oxide (abbreviated as ITO) had been vapor-deposited (manufactured by Geomatec Co., Ltd.; surface resistance: 10 Ω/sq) was placed in a washing container, and was subjected to ultrasonic cleaning in 2-propanol, and then, UV-ozone treatment was carried out for 30 minutes. On the transparent anode, the following layers were deposited by a vacuum vapor deposition method. In the examples of the present invention, the vapor deposition rate was 0.2 nm/second, unless otherwise specified, wherein the vapor deposition rate was measured with a quartz oscillator. The thicknesses of layers described below were also measured with the quartz oscillator.

Hole-Injection Layer:
4,4',4"-tris(2-naphthylphenylamino)triphenylamine (2-TNATA) and tetrafluorotetracyanoquinodimethane (F4-TCNQ) were co-deposited so that the amount of F4-TCNQ became 1.0% by mass with respect to 2-TNATA. The film thickness was 160 nm.

Hole-Transport Layer:
N,N'-dinaphthyl-N,N'-diphenyl-[1,1'-biphenyl]-4,4'-diamine (abbreviated as α-NPD) in a thickness of 10 nm;

Light-Emitting Layer:
1,3-bis(carbazole-9-yl)benzene (abbreviated as mCP) and a light-emitting material Pt-1 were co-deposited so that the amount of Pt-1 became 13% by mass with respect to mCP. The film thickness of the light-emitting layer was 60 nm.

Subsequently, the following electron-transport layer was provided on the light-emitting layer.

Electron-Transport Layer:
bis-(2-methyl-8-quinolinolate)-4(phenylphenolate)aluminium (abbreviated as BAlq) in a thickness of 40 nm Further, after vapor depositing LiF to a thickness of 1 nm, patterning was carried out by the use of a shadow mask to provide Al in a thickness of 100 nm as a cathode.

The respective layers were provided by resistance heating vacuum vapor deposition.

The prepared lamination body was placed in a globe box whose internal air had been replaced by nitrogen gas, and sealed by using a sealing can made of stainless steal and an ultraviolet-ray curable adhesive (Trade name: XNR5516HV, manufactured by Nagase-Ciba Co., Ltd.).

(Preparation of Comparative Organic EL Device 2)

Comparative Organic EL Device 2 was prepared in the same manner as the preparation of Comparative Organic EL Device 1, except that the amount of the co-deposited light-emitting material Pt-1 was changed to 26% by mass with respect to mCP. The film thickness of the light-emitting layer was 60 nm.

(Preparation of Comparative Organic EL Device 3)

Comparative Organic EL Device 3 was prepared in the same manner as the preparation of the Comparative Organic EL Device 1, except that the light-emitting layer was replaced by the following.

Light-Emitting Layer:

The amount of co-deposited hole transporting light-emitting material Tris(2-phenylpyridine)Iridium(Ir(ppy)$_3$) relative to the amount of mCP was increased continuously along with the progress of the vapor deposition. The doping ratio of Ir(ppy)$_3$ at the anode side interface at the initiation of the vapor deposition was 0% by mass relative to mCP, and the doping ratio of Ir(ppy)$_3$ at the cathode side interface at the completion of the vapor deposition was 26% by mass relative to mCP. The doping ratio of light-emitting material Ir(ppy)$_3$ was varied continuously between these interfaces. The concentrations of the respective material at the region adjacent to the anode side interface were 1% by mass (for Ir(ppy)$_3$) and 99% by mass (for mCP), and the concentrations of the respective materials at the region adjacent to the cathode side interface were 19.6% by mass (for Ir(ppy)$_3$) and 80.4% by mass (for mCP).

(Preparation of Organic EL Device 1 of the Present Invention)

Organic EL Device 1 of the present invention was prepared in the same manner as the preparation of Comparative Organic EL Device 1, except that the light-emitting layer was replaced by the following.

Light-Emitting Layer:

The amount of co-deposited light-emitting material Pt-1 relative to mCP was increased along with the progress of the vapor deposition. The doping ratio of the light-emitting material Pt-1 at the anode side interface at the initiation of the vapor deposition was 5% by mass relative to mCP, and the doping ratio of the light-emitting material Pt-1 at the cathode side interface at the completion of the vapor deposition was 26% by mass relative to mCP. The doping ratio of light-emitting material Pt-1 was varied continuously between these interfaces. The concentrations of the respective materials at the region adjacent to the anode side interface were 5.6% by mass (for Pt-1) and 94.4% by mass (for mCP), and the concentrations of the respective materials at the region adjacent to the cathode side interface were 19.8% by mass (for Pt-1) and 80.2% by mass (for mCP).

(Preparation of Organic EL Device 2 of the Present Invention)

Organic EL Device 2 of the present invention was prepared in the same manner as the preparation of Organic EL Device 1, except for the following:

The vapor deposition rate was controlled so that the amount of co-deposited light-emitting material Pt-1 as the doping ratio of the light-emitting material Pt-1 at the anode side interface at the initiation of the vapor deposition was 0% by mass relative to mCP, and the doping ratio of the light-emitting material Pt-1 at the cathode side interface at the completion of the vapor deposition was 26% by mass relative to mCP. The doping ratio of light-emitting material Pt-1 was varied continuously between these interfaces. The concentrations of the respective materials at the region adjacent to the anode side interface were 1% by mass (for Pt-1) and 99% by mass (for mCP), and the concentrations of the respective materials at the region adjacent to the cathode side interface were 19.6% by mass (for Pt-1) and 80.4% by mass (for mCP).

(Preparation of the Organic EL Device 3 of the Present Invention)

Organic EL Device 3 of the present invention was prepared in the same manner as the preparation of Organic EL Device 1, except for the following:

The vapor deposition rate was controlled so that the amount of co-deposited light-emitting material Pt-1 as the doping ratio of the light-emitting material Pt-1 at the anode side interface at the initiation of the vapor deposition was 0% by mass relative to mCP, and the doping ratio of the light-emitting material Pt-1 at the cathode side interface at the completion of the vapor deposition was 40% by mass relative to mCP. The doping ratio of light-emitting material Pt-1 was varied continuously between these interfaces. The concentrations of the respective materials at the region adjacent to the anode side interface were 1.4% by mass (for Pt-1) and 98.6% by mass (for mCP), and the concentrations of the respective materials at the region adjacent to the cathode side interface were 27.2% by mass (for Pt-1) and 72.8% by mass (for mCP).

The structures of the compounds used in Examples are shown below:

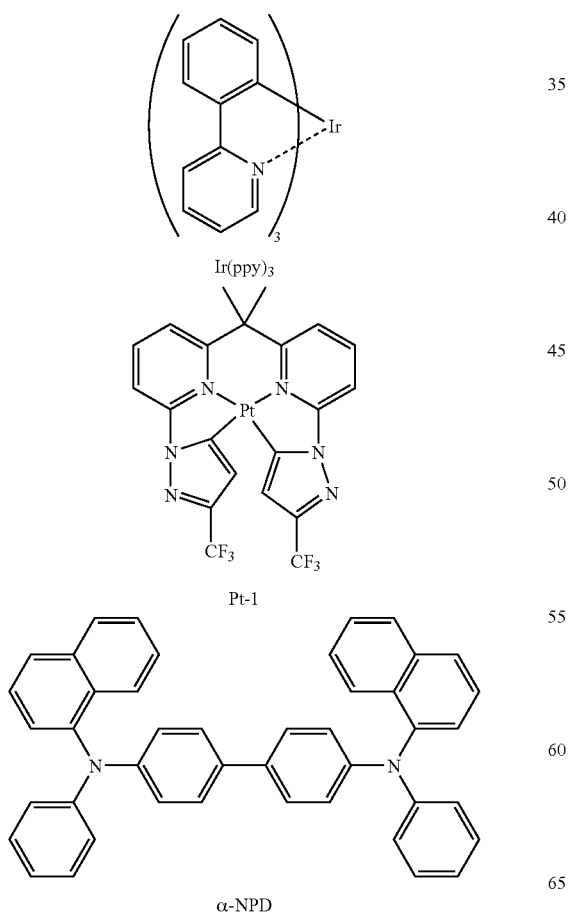

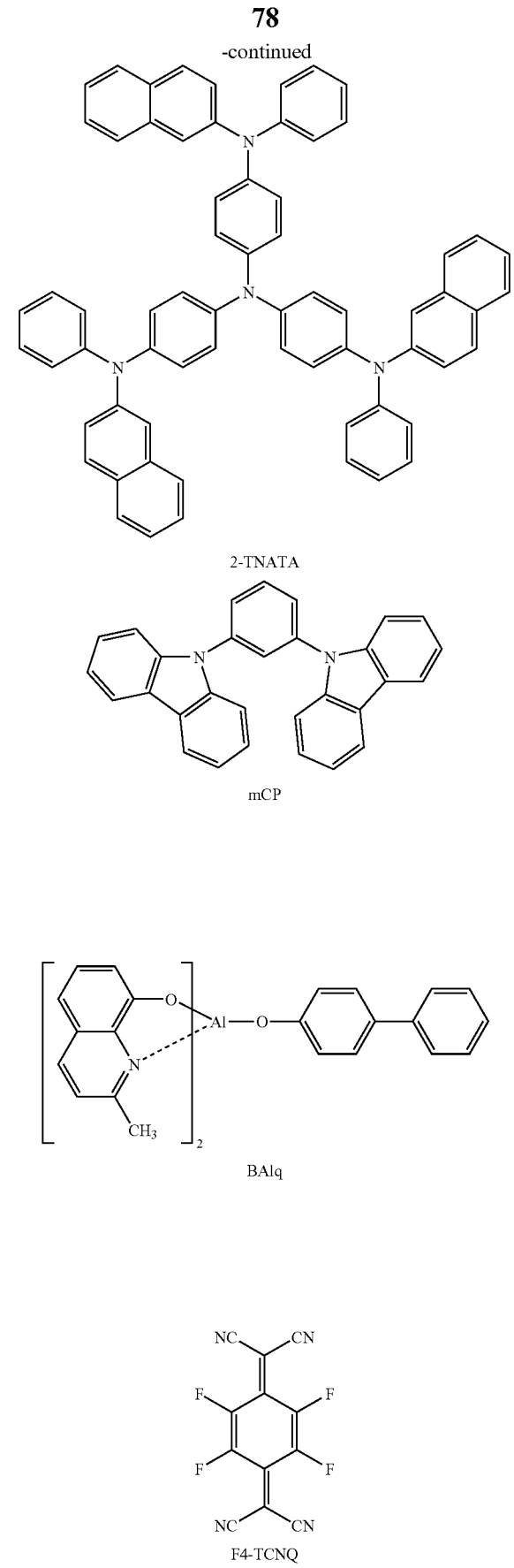

2. Evaluation of Performance

The resultant Comparative Organic EL Devices and Organic EL Devices of the present invention were tested for external quantum efficiency and driving durability under the same condition described below.

<Driving Voltage>

A DC driving voltage achieving a luminance of 360 cd/m$^2$ was evaluated as the driving voltage.

<External Quantum Efficiency Test>

A DC voltage was applied to each of the prepared luminescent devices by using a source measure unit MODEL 2400 (Trade name, manufactured by KEITHLEY) to cause light emission having a luminance of 360 cd/m$^2$ or 10000 cd/m$^2$ (high luminance condition). The light emission spectrum and luminance were measured using a luminance meter SR-3 (Trade name, manufactured by Topcon Corporation), and the external quantum efficiency was calculated from the light emission spectrum, the luminance and the electric current at the time of the measurement.

<Driving Durability Test>

A DC voltage was applied to each device to obtain a luminance of 360 cd/m$^2$, and the device was continuously driven at the initial electric current. The time it takes until the luminance becomes half the initial luminance (i.e., until the luminance becomes 180 cd/m$^2$) is measured as a luminance half-life. The luminance half-life was evaluated as an index of the driving durability.

The results are shown in Table 1. Each of the Organic EL Devices 1 to 3 in the present invention had an enhanced external quantum efficiency and was superior in driving durability as compared to the Comparative organic EL devices 1 to 3. In particular, the external quantum efficiency of Comparative Device 1 at high luminance light emission (10,000 cd/m$^2$) was 4.6%, which was about 73% of the efficiency at low luminance light emission (360 cd/m$^2$). In contrast, the external quantum efficiency of Device 2 of the present invention at high luminance light emission was 8.5%, which was 93% of the efficiency at low luminance light emission and indicates only a slight decrease.

From the results of the Comparative Device 3, it was clarified that effects of the present invention were not achieved even though the concentration of hole transporting Ir(ppy)$_3$ as the light-emitting material has a gradient in the light-emitting layer, whereas unexpectedly enhanced external quantum efficiency and particularly superior driving durability were achieved by providing a gradient of the concentration of Pt-1, which is an electron transporting light-emitting material.

Example 2

1. Preparation of Organic EL Device (Preparation of Comparative Organic EL Device 4)

Comparative Organic EL Device 4 was prepared in the same manner as the preparation of Comparative Organic EL Device 1, except that mCP in the light-emitting layer was replaced by mCP derivative A.

(Preparation of Organic EL Device 4 of the Present Invention)

Organic EL Device 4 of the present invention was prepared in the same manner as the preparation of Organic EL Device 2 of the present invention, except that mCP in the light-emitting layer was replaced by mCP derivative A.

The structure of the compound used in Example is shown below:

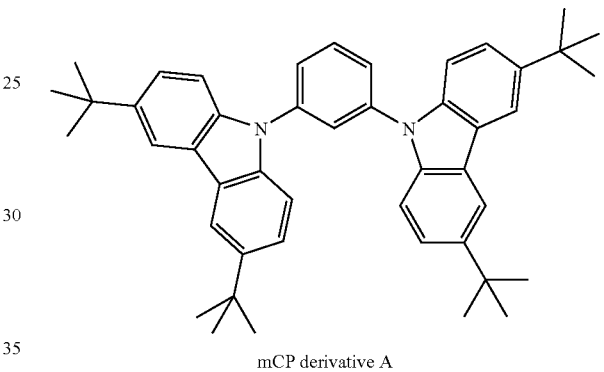

mCP derivative A

2. Evaluation of Performance

The driving voltage, external quantum efficiency and driving durability of the obtained Comparative organic EL device and the organic EL device of the present invention were measured in the same manner as in Example 1.

The results are shown in Table 2. The Organic EL Device 4 of the present invention had an enhanced external quantum efficiency and was superior in driving durability as compared to the Comparative Organic EL Device 4. Also, the device according to the present invention exhibited only a slight decrease in external quantum efficiency at high luminance.

TABLE 1

| Device Nos. | Driving Voltage (V) | External Quantum Efficiency (%) (Luminance: 360 cd/m$^2$) | External Quantum Efficiency (%) (Luminance: 10,000 cd/m$^2$) | Luminance Half-lifetime (h) (Initial Luminance: 360 cd/m$^2$) |
|---|---|---|---|---|
| Comparative Device 1 | 11.8 | 6.3 | 4.6 | 500 |
| Comparative Device 2 | 10.5 | 5.3 | 4.1 | 520 |
| Comparative Device 3 | 12.5 | 4.0 | 2.9 | 250 |
| Invention Device 1 | 10.2 | 7.3 | 6.9 | 900 |
| Invention Device 2 | 9.8 | 9.1 | 8.5 | 1200 |
| Invention Device 3 | 8.7 | 8.8 | 8.3 | 1300 |

TABLE 2

| Device Nos. | Driving Voltage (V) | External Quantum Efficiency (%) (Luminance: 360 cd/m$^2$) | External Quantum Efficiency (%) (Luminance: 10,000 cd/m$^2$) | Luminance Half-lifetime (h) (Initial Luminance: 360 cd/m$^2$) |
|---|---|---|---|---|
| Comparative Device 4 | 14.5 | 7.6 | 5.4 | 400 |
| Invention Device 4 | 12.8 | 10.3 | 9.2 | 1100 |

Example 3

1. Preparation of Organic EL Device (Preparation of Comparative Organic EL Device 5)

Comparative Organic EL Device 5 was prepared in the same manner as the preparation of Comparative Organic EL Device 1, except that mCP in the light-emitting layer was replaced by Host material 1.

(Preparation of Organic EL Device 5 of the Present Invention)

Organic EL Device 5 of the present invention was prepared in the same manner as the preparation of Organic EL Device 2 of the present invention except that mCP in the light-emitting layer was replaced by Host material 1.

The structure of the compound used in Example is shown below:

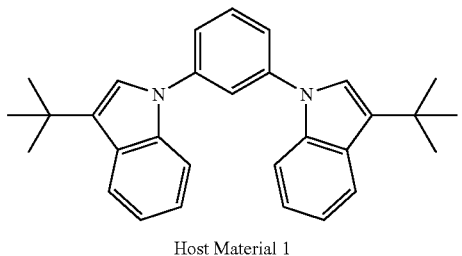 [SMILES: CC(C)(C)c1cn(-c2cccc(-n3cc(C(C)(C)C)c4ccccc43)c2)c2ccccc12]

Host Material 1

2. Evaluation of Performance

The driving voltage, external quantum efficiency and driving durability of the Comparative organic EL device and the organic EL device of the present invention were measured in the same manner as in Example 1.

The results are shown in Table 3. The Organic EL Device 5 of the present invention had an enhanced external quantum efficiency and was superior in driving durability as compared to the Comparative Organic EL Device 5. Also, the device according to the present invention exhibited only a slight decrease in external quantum efficiency at high luminance.

TABLE 3

| Device Nos. | Driving Voltage (V) | External Quantum Efficiency (%) (Luminance: 360 cd/m$^2$) | External Quantum Efficiency (%) (Luminance: 10,000 cd/m$^2$) | Luminance Half-lifetime) (h) (Initial Luminance: 360 cd/m$^2$) |
|---|---|---|---|---|
| Comparative Device 5 | 12.6 | 8.4 | 6.5 | 900 |
| Invention Device 5 | 10.8 | 12.0 | 10.8 | 2100 |

Example 4

1. Preparation of Organic EL Device (Preparation of Organic EL Device 6 of the Present Invention)

Organic EL Device 6 of the present invention was prepared in the same manner as the preparation of Comparative Organic EL Device 1, except that the light-emitting layer was replaced by the following light-emitting layer.

Light-Emitting Layer:

The light-emitting layer was formed by stepwise increasing the amount of co-deposited light-emitting material Pt-1 relative to mCP along with the progress of the vapor deposition, wherein the thickness per one step was 6 nm and ten steps were conducted (total thickness: 60 nm). The doping ratio of the light-emitting material Pt-1 at the respective steps were, in the order from the hole-transport layer side (the anode side) toward the electron-transport layer side (cathode side), 1% by mass, 4% by mass, 7% by mass, 9% by mass, 12% by mass, 14% by mass, 17% by mass, 20% by mass, 22% by mass, and 25% by mass, respectively.

2. Evaluation of Performance

The driving voltage, external quantum efficiency and driving durability of the Comparative Organic EL Device and the Organic EL Device of the present invention were measured in the same manner as in Example 1.

The results are shown in Table 4. The organic EL device 6 of the present invention had an enhanced external quantum efficiency and was superior in driving durability as compared to the Comparative Organic EL Device 1 in Example 1. Also, the device according to the present invention exhibited only a slight decrease in external quantum efficiency at high luminance.

TABLE 4

| Device Nos. | Driving Voltage (V) | External Quantum Efficiency (%) (Luminance: 360 cd/m²) | External Quantum Efficiency (%) (Luminance: 10,000 cd/m²) | Luminance Half-lifetime (h) (Initial Luminance: 360 cd/m²) |
|---|---|---|---|---|
| Comparative Device 1 | 11.8 | 6.3 | 4.6 | 500 |
| Invention Device 6 | 10.1 | 8.9 | 8.2 | 1100 |

All publications, patent applications, and technical standards mentioned in this specification are herein incorporated by reference to the same extent as if each individual publication, patent application, or technical standard was specifically and individually indicated to be incorporated by reference.

The invention claimed is:

1. An organic electroluminescent device comprising at least a light-emitting layer between a pair of electrodes, wherein the light-emitting layer includes at least a hole transporting host material and an electron transporting phosphorescent material, and the concentration of the electron transporting phosphorescent material in the light-emitting layer decreases from a cathode side toward an anode side, wherein the electron transporting phosphorescent material is a platinum complex according to formula Pt-1:

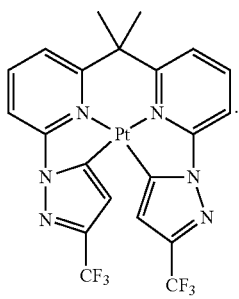

2. The organic electroluminescent device according to claim 1, wherein the concentration of the electron transporting phosphorescent material at a region adjacent to an anode side interface of the light-emitting layer is from 0% by mass to 50% by mass with respect to the concentration of the electron transporting phosphorescent material at a region adjacent to a cathode side interface of the light-emitting layer.

3. The organic electroluminescent device according to claim 2, wherein the concentration of the electron transporting phosphorescent material in the light-emitting layer is 10% by mass or less at the region adjacent to the anode side interface.

4. The organic electroluminescent device according to claim 2, wherein the concentration of the electron transporting phosphorescent material in the light-emitting layer is 12% by mass or more at the region adjacent to the cathode side interface.

5. The organic electroluminescent device according to claim 1, wherein the hole transporting host material is a carbazole derivative or an indole derivative.

6. The organic electroluminescent device according to claim 5, wherein the hole transporting host material is 1,3-bis(carbazole-9-yl)benzene or a derivative thereof.

7. The organic electroluminescent device according to claim 1, wherein a peak wavelength of a light emission spectrum is 430 nm or more but less than 480 nm.

* * * * *